(12) United States Patent
Judge et al.

(10) Patent No.: US 9,038,404 B2
(45) Date of Patent: May 26, 2015

(54) HIGH EFFICIENCY COOLING SYSTEM

(75) Inventors: John F. Judge, Galena, OH (US);
Timothy J. Schrader, Irwin, OH (US);
Stephen Sillato, Westerville, OH (US);
Roger Noll, Gahanna, MI (US); Gary A. Helmink, Galloway, OH (US);
Pierpaolo Barbato, Noventa Padovana (IT); Giuseppe Dalla Mana, Vigonza (IT); Lou Monnier, Westerville, OH (US); Zhiyong Lin, Columbus, OH (US); Benedict J. Dolcich, Westerville, OH (US); Daniel J. Schutte, Lewis Center, OH (US); Greg Haggy, Pickerington, OH (US); Thomas Harvey, Columbus, OH (US); Zongtao Lu, Pittsburgh, PA (US)

(73) Assignee: Liebert Corporation, Columbus, OH (US)

( * ) Notice: Subject to any disclaimer, the term of this patent is extended or adjusted under 35 U.S.C. 154(b) by 454 days.

(21) Appl. No.: 13/446,374

(22) Filed: Apr. 13, 2012

(65) Prior Publication Data

US 2013/0098085 A1 Apr. 25, 2013

Related U.S. Application Data

(60) Provisional application No. 61/476,783, filed on Apr. 19, 2011, provisional application No. 61/527,695, filed on Aug. 26, 2011.

(51) Int. Cl.
*F25B 41/04* (2006.01)
*F25B 49/02* (2006.01)
(Continued)

(52) U.S. Cl.
CPC .......... *F25B 49/022* (2013.01); *H05K 7/20827* (2013.01); *H05K 7/20836* (2013.01); *F25B 41/043* (2013.01); *F25D 17/06* (2013.01)

(58) Field of Classification Search
USPC ........ 62/175, 180, 222, 228.1, 190, 186, 225, 62/228.5, 510
See application file for complete search history.

(56) References Cited

U.S. PATENT DOCUMENTS 2,146,796 A 2/1939 Dasher
2,244,312 A 6/1941 Newton
(Continued)

FOREIGN PATENT DOCUMENTS

EP 2389056 A1 11/2011
JP 2001263835 A * 9/2001
(Continued)

OTHER PUBLICATIONS

European Search Report for EP11166482.7 mailed Oct. 5, 2011.
(Continued)

*Primary Examiner* — Cassey D Bauer
*Assistant Examiner* — Kun Kai Ma
(74) *Attorney, Agent, or Firm* — Harness, Dickey & Pierce, P.L.C.

(57) ABSTRACT

A cooling system has a cabinet and a plurality of separate cooling stages including an upstream cooling stage and a downstream cooling stage. At least the upstream cooling state is a variable capacity cooling stage. Each cooling stage has a cooling circuit. Evaporators of the cooling circuits are arranged in the cabinet so that air passes over them in serial fashion. A controller when a Call for Cooling first reaches a point where cooling is needed, operating the upstream cooling circuit to provide cooling and not the downstream cooling circuit. When the Call for Cooling has increased to a second point, the controller additionally operates the downstream cooling circuit to provide cooling. The cooling capacity at which the upstream cooling circuit is being operated is less than its full capacity when the Call for Cooling reaches the second point.

14 Claims, 24 Drawing Sheets

(51) Int. Cl.
*H05K 7/20* (2006.01)
*F25D 17/06* (2006.01)

(56) References Cited

U.S. PATENT DOCUMENTS

| | | | |
|---|---|---|---|
| 2,796,743 A | 6/1957 | Mefarlan | |
| 2,892,321 A | 6/1959 | Kritzer | |
| 2,949,750 A | 8/1960 | Kramer | |
| 3,133,424 A | 5/1964 | Palmer | |
| 3,525,385 A | 8/1970 | Liebert | |
| 4,040,268 A * | 8/1977 | Howard | 62/335 |
| 4,142,381 A * | 3/1979 | Lavigne, Jr. | 62/510 |
| 4,270,362 A | 6/1981 | Lancia et al. | |
| 4,271,678 A | 6/1981 | Liebert | |
| 4,483,151 A | 11/1984 | Fujioka et al. | |
| 4,606,198 A | 8/1986 | Latshaw et al. | |
| 4,732,008 A | 3/1988 | DeVault | |
| 4,796,437 A | 1/1989 | James | |
| 4,873,649 A | 10/1989 | Grald et al. | |
| 5,177,972 A | 1/1993 | Sillato et al. | |
| 5,245,837 A | 9/1993 | Kitamoto | |
| 5,709,100 A | 1/1998 | Baer et al. | |
| 5,953,926 A | 9/1999 | Dressler et al. | |
| 6,023,935 A | 2/2000 | Okazaki et al. | |
| 6,185,944 B1 | 2/2001 | Gaul | |
| 6,293,119 B1 | 9/2001 | Wenzel | |
| 6,324,856 B1 | 12/2001 | Weng | |
| 6,543,240 B2 | 4/2003 | Grafton | |
| 6,553,778 B2 * | 4/2003 | Tipton et al. | 62/196.1 |
| 6,735,965 B2 | 5/2004 | Moon et al. | |
| 6,817,209 B1 | 11/2004 | Tiner | |
| 6,871,509 B2 | 3/2005 | Grabon et al. | |
| 6,978,630 B2 | 12/2005 | Wensink et al. | |
| 7,032,411 B2 * | 4/2006 | Hebert | 62/525 |
| 7,293,425 B2 | 11/2007 | Tamura et al. | |
| 7,406,839 B2 | 8/2008 | Bean et al. | |
| 7,658,079 B2 | 2/2010 | Bailey et al. | |
| 7,775,055 B2 | 8/2010 | Bean et al. | |
| 7,900,468 B2 | 3/2011 | Spearing | |
| 2004/0045304 A1 | 3/2004 | Park | |
| 2006/0090507 A1 * | 5/2006 | Taras et al. | 62/513 |
| 2006/0225445 A1 * | 10/2006 | Lifson et al. | 62/175 |
| 2006/0272342 A1 | 12/2006 | Bash et al. | |
| 2008/0041079 A1 | 2/2008 | Nishijima et al. | |
| 2009/0080173 A1 | 3/2009 | Porter et al. | |
| 2009/0205345 A1 * | 8/2009 | Narayanamurthy et al. | 62/113 |
| 2009/0210095 A1 | 8/2009 | Bush et al. | |
| 2009/0249807 A1 | 10/2009 | Nemesh et al. | |
| 2009/0288432 A1 * | 11/2009 | Lifson et al. | 62/115 |
| 2010/0023166 A1 | 1/2010 | Chessel et al. | |
| 2010/0036530 A1 | 2/2010 | Chessel et al. | |
| 2010/0036531 A1 | 2/2010 | Chessel et al. | |
| 2010/0050669 A1 | 3/2010 | Poux et al. | |
| 2010/0070082 A1 | 3/2010 | Chessel et al. | |
| 2010/0094434 A1 * | 4/2010 | Ballet et al. | 700/28 |
| 2010/0107658 A1 | 5/2010 | Cockrell | |
| 2010/0107659 A1 * | 5/2010 | Hildreth, Jr. | 62/77 |
| 2010/0229587 A1 | 9/2010 | Liu et al. | |
| 2010/0236263 A1 | 9/2010 | Park | |
| 2010/0242534 A1 | 9/2010 | Stockton, Jr. | |
| 2011/0023508 A1 | 2/2011 | Bean et al. | |
| 2012/0111027 A1 * | 5/2012 | Campbell et al. | 62/3.3 |
| 2012/0167602 A1 * | 7/2012 | Taras et al. | 62/115 |

FOREIGN PATENT DOCUMENTS

| | | |
|---|---|---|
| WO | WO-03083631 A1 | 10/2003 |
| WO | WO-2007044235 A2 | 4/2007 |
| WO | WO-2008026792 A1 | 3/2008 |
| WO | WO-2008076120 A1 | 6/2008 |
| WO | WO-2008079116 A1 | 7/2008 |
| WO | WO-2008079118 A1 | 7/2008 |
| WO | WO-2008079119 A1 | 7/2008 |
| WO | WO-2008079138 A1 | 7/2008 |
| WO | WO-2008082378 A1 | 7/2008 |
| WO | WO-2008082379 A1 | 7/2008 |
| WO | WO-2009102975 A2 | 8/2009 |

OTHER PUBLICATIONS

Precision Versus Comfort Cooling Choosing a Cooling System to Support Business-Critical IT Environments—Emerson Network Power © 2010, Liebert Corporation.
Notification of Transmittal of the International Search Report and the Written Opinion of the International Searching Authority for PCT/US2013/063531, mailed Jan. 14, 2014.
Notification of Transmittal of the International Search Report and the Written Opinion of the International Searching Authority for PCT/US2012/033740, mailed Oct. 4, 2012.

* cited by examiner

| Sensible Cooling Control | | |
|---|---|---|
| Call for Cooling Ramping Up | | |
| | SRU1 (25%) < Call for Cooling < SRU2 (45%) | Only 710(V) On and Ramp Based on Call for Cooling |
| | SRU2 (45%) < Call for Cooling < SRU3 (65%) | 710(V) and 718(V) on and Parallel Ramp; 710(F) and 718(F) off. |
| | SRU3 (65%) < Call for Cooling < SRU4 (90%) | 710(F) on; 710(V) on and Ramp Based on Call for Cooling; 718(V) 100% on; 718(F) off. |
| | SRU4 (90%) < Call for Cooling < = SRU5 (100%) | 710(F) on; 710(V) 100% on; 718(F) on; 718(V) Ramp Based on Call for Cooling |
| Call for Cooling Ramping Down | | |
| | SRD1 (0%) < Call for Cooling < SRD2 (15%) | Only 710(V) on and Ramp Based on Call for Cooling |
| | SRD2(15%) < Call for Cooling < SRD3 (40%) | 710(V) and 718(V) on and Parallel Ramp Based on Call for Cooling; 710(F) and 718(F) off. |
| | SRD3 (40%) < Call for Cooling < SRD4 (65%) | 710(F) on, 710(V) on and Ramp Based on Call for Cooling; 718(V) 100% on; 718(F) off. |
| | SRD4 (65%) < Call for Cooling < = SRD5 (100%) | 710(F) on; 710(V) 100% on; 718(F) on; 718(V) Ramp Based on Call for Cooling |

*Fig-11A*

| Dehumidification Control | |
|---|---|
| L1 (0%) < Call for Cooling < L2 (45%) | 710(F) off; 718(F) off; 710(V) and 718(V) Ramp Based on Call for Dehumidification |
| L2 (45%) < Call for Cooling < L3 (65%) | 710(F) off; 710(V) 100% on; 718(F) on; 718(V) Ramp Based on Call for Dehumidification |
| L3 (65%) < Call for Cooling < = L4 (100%) | 710(F) on, 710(V) on and Ramp Based on Call for Dehumidification; 718(V) full on; 718(F) on. |

*Fig-11B*

HIGH EFFICIENCY COOLING SYSTEM

CROSS-REFERENCE TO RELATED APPLICATIONS

This application claims the benefit of U.S. Provisional Application Nos. 61/476,783, filed on Apr. 19, 2011 and 61/527,695, filed on Aug. 26, 2011. The entire disclosures of each of the above applications are incorporated herein by reference.

FIELD

The present disclosure relates to cooling systems, and more particularly, to high efficiency cooling systems.

BACKGROUND

This section provides background information related to the present disclosure which is not necessarily prior art.

Cooling systems have applicability in a number of different applications where fluid is to be cooled. They are used in cooling gas, such as air, and liquids, such as water. Two common examples are building HVAC (heating, ventilation, air conditioning) systems that are used for "comfort cooling," that is, to cool spaces where people are present such as offices, and data center climate control systems.

A data center is a room containing a collection of electronic equipment, such as computer servers. Data centers and the equipment contained therein typically have optimal environmental operating conditions, temperature and humidity in particular. Cooling systems used for data centers typically include climate control systems, usually implemented as part the control for the cooling system, to maintain the proper temperature and humidity in the data center.

FIG. 1 shows an example of a typical data center 100 having a climate control system 102 (also known as a cooling system). Data center 100 illustratively utilizes the "hot" and "cold" aisle approach where equipment racks 104 are arranged to create hot aisles 106 and cold aisles 108. Data center 100 is also illustratively a raised floor data center having a raised floor 110 above a sub-floor 112. The space between raised floor 110 and sub-floor 112 provides a supply air plenum 114 for conditioned supply air (sometimes referred to as "cold" air) flowing from computer room air conditioners ("CRACs") 116 of climate control system 102 up through raised floor 110 into data center 100. The conditioned supply air then flows into the fronts of equipment racks 104, through the equipment (not shown) mounted in the equipment racks where it cools the equipment, and the hot air is then exhausted out through the backs of equipment racks 104, or the tops of racks 104. In variations, the conditioned supply air flows into bottoms of the racks and is exhausted out of the backs of the racks 104 or the tops of the racks 104.

It should be understood that data center 100 may not have a raised floor 110 nor plenum 114. In this case, the CRAC's 116 would draw in through an air inlet (not shown) heated air from the data center, cool it, and exhaust it from an air outlet 117 shown in phantom in FIG. 1 back into the data center. The CRACS 116 may, for example, be arranged in the rows of the electronic equipment, may be disposed with their cool air supply facing respective cold aisles, or be disposed along walls of the data center.

In the example data center 100 shown in FIG. 1, data center 100 has a dropped ceiling 118 where the space between dropped ceiling 118 and ceiling 120 provides a hot air plenum 122 into which the hot air exhausted from equipment racks 104 is drawn and through which the hot air flows back to CRACs 116. A return air plenum (not shown) for each CRAC 116 couples that CRAC 116 to plenum 122.

CRACs 116 may be chilled water CRACs or direct expansion (DX) CRACs. CRACs 116 are coupled to a heat rejection device 124 that provides cooled liquid to CRACs 116. Heat rejection device 124 is a device that transfers heat from the return fluid from CRACs 116 to a cooler medium, such as outside ambient air. Heat rejection device 124 may include air or liquid cooled heat exchangers. Heat rejection device 124 may also be a refrigeration condenser system, in which case a refrigerant is provided to CRACs 116 and CRACs 116 may be phase change refrigerant air conditioning systems having refrigerant compressors, such as a DX system. Each CRAC 116 may include a control module 125 that controls the CRAC 116.

In an aspect, CRAC 116 includes a variable capacity compressor and may for example include a variable capacity compressor for each DX cooling circuit of CRAC 116. It should be understood that CRAC 116 may, as is often the case, have multiple DX cooling circuits. In an aspect, CRAC 116 includes a capacity modulated type of compressor or a 4-step semi-hermetic compressor, such as those available from Emerson Climate Technologies, Liebert Corporation or the Carlyle division of United Technologies. CRAC 116 may also include one or more air moving units 119, such as fans or blowers. The air moving units 119 may be provided in CRACs 116 or may additionally or alternatively be provided in supply air plenum 114 as shown in phantom at 121. Air moving units 119, 121 may illustratively have variable speed drives.

A typical CRAC 200 having a typical DX cooling circuit is shown in FIG. 2. CRAC 200 has a cabinet 202 in which an evaporator 204 is disposed. Evaporator 204 may be a V-coil assembly. An air moving unit 206, such as a fan or squirrel cage blower, is also disposed in cabinet 202 and situated to draw air through evaporator 204 from an inlet (not shown) of cabinet 202, where it is cooled by evaporator 204, and direct the cooled air out of plenum 208. Evaporator 204, a compressor 210, a condenser 212 and an expansion valve 214 are coupled together in known fashion in a DX refrigeration circuit. A phase change refrigerant is circulated by compressor 210 through condenser 212, expansion valve 214, evaporator 204 and back to compressor 210. Condenser 212 may be any of a variety of types of condensers conventionally used in cooling systems, such as an air cooled condenser, a water cooled condenser, or glycol cooled condenser. It should be understood that condenser 210 is often not part of the CRAC but is located elsewhere, such as outside the building in which the CRAC is located. Compressor 210 may be any of a variety of types of compressors conventionally used in DX refrigeration systems, such as a scroll compressor. When evaporator 204 is a V-coil or A-coil assembly, it typically has a cooling slab (or slabs) on each leg of the V or A, as applicable. Each cooling slab may, for example, be in a separate cooling circuit with each cooling circuit having a separate compressor. Alternatively, the fluid circuits in each slab such as where there are two slabs and two compressor circuits, can be intermingled among the two compressor circuits.

Evaporator 204 is typically a fin-and-tube assembly and is used to both cool and dehumidify the air passing through them. Typically, CRAC's such as CRAC 200 are designed so that the sensible heat ratio ("SHR") is typically between 0.85 and 0.95.

A system known as the GLYCOOL free-cooling system is available from Liebert Corporation of Columbus, Ohio. In this system, a second cooling coil assembly, known as a "free cooling coil," is added to a CRAC having a normal glycol system. This second coil assembly is added in the air stream ahead of the first cooling coil assembly. During colder months, the glycol solution returning from the outdoor dry-cooler is routed to the second cooling coil assembly and becomes the primary source of cooling to the data center. At ambient temperatures below 35 deg. F., the cooling capacity of the second cooling coil assembly is sufficient to handle the total cooling needs of the data center and substantially reduces energy costs since the compressor of the CRAC need not be run. The second or free cooling coil assembly does not provide 100% sensible cooling and has an airside pressure drop similar to the evaporator (which is the first cooling coil assembly).

Efficiency of cooling systems has taken on increased importance. According to the U.S. Department of Energy, cooling and power conversion systems for data centers consume at least half the power used in a typical data center. In other words, less than half the power is consumed by the servers in the data center. This has led to increased focus on energy efficiency in data center cooling systems.

SUMMARY

In accordance with an aspect of the present disclosure, a cooling system includes a cabinet having an air inlet and an air outlet and a cooling circuit that includes an evaporator disposed in the cabinet, a condenser, a compressor, an expansion device and a liquid pump. The cooling system has a direct expansion mode wherein the compressor is on and compresses a refrigerant in a vapor phase to raise its pressure and thus its condensing temperature and refrigerant is circulated around the cooling circuit by the compressor. The cooling system also has a pumped refrigerant economizer mode wherein the compressor is off and the liquid pump is on and pumps the refrigerant in a liquid phase and refrigerant is circulated around the cooling circuit by the liquid pump and without compressing the refrigerant in its vapor phase. In an aspect, the cooling system has a controller coupled to the liquid pump and the compressor that turns the compressor off and the liquid pump on to operate the cooling circuit in the economizer mode and turns the compressor on to operate the cooling circuit in the direct expansion mode. In an aspect, the controller turns the liquid pump off when the cooling circuit is in the direct expansion mode. In an aspect, the expansion device is an electronic expansion valve.

In an aspect, the cooling circuit includes a receiver/surge tank coupled between the condenser and the liquid pump.

In an aspect, the cooling system includes a plurality of cooling circuits with each cooling circuit included in one of a plurality of cooling stages including an upstream cooling stage and a downstream cooling stage wherein the evaporator of the cooling circuit of the upstream cooling stage (upstream evaporator) and the evaporator of the cooling circuit of the downstream cooling stage (downstream evaporator) are arranged in the cabinet so that air to be cooled passes over them in serial fashion, first over the upstream evaporator and then over the downstream evaporators. The cooling circuit of each cooling stage has the direct expansion mode wherein the compressor of that cooling circuit is on and the refrigerant is circulated around the cooling circuit by the compressor of that cooling circuit and a pumped refrigerant economizer mode wherein the compressor of that cooling circuit is off and the liquid pump of that cooling circuit is on and the refrigerant is circulated around the cooling circuit by the liquid pump of that cooling circuit. In an aspect, when one of the upstream and downstream cooling stages can be in the economizer mode and the other must be in direct expansion mode, the controller operates the cooling circuit of the upstream cooling stage in the economizer mode turning liquid pump of that cooling circuit on and the compressor of that circuit off and operates the downstream cooling stage in the direct expansion mode turning the compressor of the downstream cooling circuit on.

In an aspect, a cooling system includes a cabinet having an air inlet and an air outlet and a cooling circuit that includes a direct expansion refrigeration cooling circuit including an evaporator disposed in the cabinet, a condenser, a compressor and an expansion device wherein the condenser is at an elevation higher than the evaporator. The cooling circuit has a direct expansion mode wherein the compressor is on and compresses a refrigerant in a vapor phase to raise its pressure and thus its condensing temperature and refrigerant is circulated around the cooling circuit by the compressor and an economizer mode wherein the compressor is off and a liquid column of refrigerant at an inlet of the evaporator induces a thermo-siphon effect causing refrigerant to circulate around the cooling circuit and without compressing the refrigerant in its vapor phase. In an aspect, a controller is coupled to the compressor that turns the compressor off to operate the cooling circuit in the economizer mode and turns the compressor on to operate the cooling circuit in the direct expansion mode.

In an aspect, a cooling system has a cabinet having an air inlet and an air outlet and a cooling circuit that includes an evaporator disposed in the cabinet, a condenser, a compressor, a liquid/vapor separator tank and a liquid pump. The cooling circuit has a mode wherein the compressor and liquid pump are both on with the liquid pump pumping refrigerant through the evaporator with the refrigerant leaving the evaporator circulated to an inlet of the liquid/vapor separator tank and not to an inlet of the condenser, and the compressor compressing refrigerant circulating to an inlet of the compressor from an outlet of the liquid/vapor separator tank to raise its pressure and thus its condensing temperature with refrigerant leaving the compressor circulated to the inlet of the condenser. The cooling circuit also has a pumped refrigerant economizer mode wherein the liquid pump is on and the compressor is off and bypassed, the liquid pump pumping refrigerant in a liquid phase through the evaporator with the refrigerant leaving the evaporator circulated to the inlet of the condenser and not to the inlet of the liquid/vapor separator tank and wherein refrigerant circulates without compression of the refrigerant in its vapor phase.

In an aspect, a cooling system has a cabinet having an air inlet and an air outlet. The cooling system includes a direct expansion cooling circuit and a pumped cooling fluid cooling circuit. The direct expansion cooling circuit includes an evaporator disposed in the cabinet, a condenser, a compressor and an expansion device. The pumped cooling fluid cooling circuit includes an evaporator disposed in the cabinet, a condenser, a liquid pump and an expansion device. The evaporators are arranged in the cabinet so that air flows over them in serial fashion with the cooling circuit having the most upstream evaporator being a variable capacity cooling circuit and an upstream cooling circuit. The cooling system has a direct expansion mode wherein the direct expansion cooling circuit is operating to provide cooling and a pumped cooling fluid economizer mode wherein the direct expansion cooling circuit is not operating to provide cooling and the pumped cooling fluid cooling circuit is operating to provide cooling. In an aspect, when the cooling system is in the direct expansion mode, the pumped cooling fluid cooling circuit is also operated to provide cooling. A controller controls the operation of the cooling circuits. The controller when a Call for Cooling first reaches a point where cooling is needed, operating the upstream cooling circuit to provide cooling and not operating the downstream cooling circuit to provide cooling and when the Call for Cooling has increased to a second point, additionally operating the downstream cooling circuit to provide cooling, wherein the cooling capacity at which the upstream cooling circuit is being operated to provide is less than the full cooling capacity of the upstream cooling circuit when the Call for Cooling reaches the second point. In an aspect, the pumped cooling fluid cooling circuit is the upstream cooling circuit.

In an aspect, the expansion device of each cooling circuit having a pumped refrigerant economizer mode is an electronic expansion valve and when any cooling circuit having the pumped refrigerant economizer mode is in the pumped refrigerant economizer mode, the controller of the cooling system controls a temperature of the refrigerant to a refrigerant temperature set point by regulating a speed of a fan of the condenser of the cooling circuit, controls a temperature of air in a room in which the cabinet is disposed to a room air temperature setpoint by regulating a speed of the liquid pump of the cooling circuit, and maintains a pressure differential across the liquid pump of the cooling circuit within a given range by regulating an open position of the electronic expansion valve of the cooling circuit.

In an aspect, the controller for the control of the pumped refrigerant economizer mode of a cooling circuit has a refrigerant temperature feedback control loop for controlling the temperature of the refrigerant of that cooling circuit by regulating the speed of the condenser fan of that cooling circuit, a room air temperature feedback control loop for controlling the temperature of the air in the room in which the cabinet is disposed by regulating the speed of the liquid pump of that cooling circuit, and a liquid pump pressure differential control feedback loop for controlling a pressure differential across the liquid pump of that cooling circuit by regulating a position of the electronic expansion valve of that cooling circuit. In an aspect, the controller has a separate controller for each of the feedback control loops. In an aspect, the refrigerant temperature set point is a fixed set point, the room air temperature set point is a user input setpoint that the user inputs into the controller, and the given range is a fixed range. In an aspect, the refrigerant temperature control loop also includes as an input an output of a feed forward controller and the feed forward controller has as inputs a liquid pump speed control signal from the room air temperature feedback control loop and an electronic expansion valve position signal from an output of the liquid pump pressure differential control feedback loop.

In accordance with an aspect, a cooling system has a cabinet having an air inlet and an air outlet, an air moving unit disposed in the cabinet, and a plurality of separate cooling stages including an upstream cooling stage and a downstream cooling stage. Each cooling stage includes a cooling circuit having an evaporator, a condenser, a tandem digital scroll compressor and an expansion device. Each tandem compressor includes a fixed capacity compressor and variable capacity digital scroll compressor. At least the cooling circuit of the upstream cooling stage has a pumped refrigerant economizer mode and a direct expansion mode. Each cooling circuit that has both the pumped refrigerant economizer mode and the direct expansion mode also has a liquid pump wherein when that cooling circuit is operated in the direct expansion mode the compressor of that cooling circuit is on and compresses a refrigerant in a vapor phase to raise its pressure and thus its condensing temperature and refrigerant is circulated around the cooling circuit by the compressor and wherein when that cooling circuit is operated in the pumped refrigerant economizer mode the compressor of that cooling circuit is off and the liquid pump of that cooling circuit is on and pumps the refrigerant in a liquid phase and refrigerant is circulated around that cooling circuit by the liquid pump of that cooling circuit and without compressing the refrigerant in its vapor phase. The evaporator of the cooling circuit of the upstream cooling stage (upstream evaporator) and the evaporator of the cooling circuit of the downstream cooling stage (downstream evaporator) are arranged in the cabinet so that air to be cooled passes over them in serial fashion, first over the upstream evaporator and then over the downstream evaporator. The cooling system includes a controller that determines which of the cooling circuits to operate to provide cooling and for each of the cooling circuits to be operated to provide cooling that has both the pumped refrigerant economizer mode and direct expansion mode, determines whether to operate each such cooling circuit in the pumped refrigerant economizer mode or the direct expansion mode. The controller operating each cooling circuit having both the pumped refrigerant economizer mode and the direct expansion mode in the pumped refrigerant economizer mode when an outside air temperature is low enough to provide sufficient heat rejection from the refrigerant flowing through the condenser to the outside air without compressing the refrigerant and when the outside air temperature is not low enough to provide such sufficient heat rejection operating that cooling circuit in the direct expansion mode. The controller when any of the cooling circuits are being operated in the direct expansion mode controlling the electronic expansion valve of that cooling circuit to control a suction superheat of the evaporator of that cooling circuit. The controller when any of the cooling circuits having both the pumped refrigerant economizer mode and the direct expansion mode is being operated in the pumped refrigerant economizer mode controlling the expansion device of that cooling circuit to maintain a minimum differential pressure across the liquid pump of that cooling circuit. In an aspect, each cooling circuit has both the pumped refrigerant economizer mode and the direct expansion mode.

In an aspect, a cooling system has a cabinet having an air inlet and an air outlet. An air moving unit is disposed in the cabinet. an air moving unit disposed in the cabinet. The cooling system has a plurality of separate cooling stages including an upstream cooling stage and a downstream cooling stage with at least the upstream cooling stage a variable capacity cooling circuit, Each cooling stage including a cooling circuit having an evaporator, a condenser, a compressor and an expansion device. At least the cooling circuit of the upstream cooling stage having a pumped refrigerant economizer mode and a direct expansion mode wherein each cooling circuit that has both the pumped refrigerant economizer mode and the direct expansion mode also has a liquid pump wherein when that cooling circuit is operated in the direct expansion mode a compressor of that cooling circuit is on and compresses a refrigerant in a vapor phase to raise its pressure and thus its condensing temperature and refrigerant is circulated around the cooling circuit by the compressor of that cooling circuit and wherein when that cooling circuit is operated in the pumped refrigerant economizer mode the compressor of that cooling circuit is off and the liquid pump of that cooling circuit is on and pumps the refrigerant in a liquid phase and refrigerant is circulated around that cooling circuit by the liquid pump of that cooling circuit and without compressing the refrigerant in its vapor phase. The evaporator of the cooling circuit of the upstream cooling stage (upstream evaporator) and the evaporator of the cooling circuit of the downstream cooling stage (downstream evaporator) arranged in the cabinet so that air to be cooled passes over them in serial fashion, first over the upstream evaporator and then over the downstream evaporator. A controller that determines which of the cooling circuits to operate to provide cooling and for each of the cooling circuits to be operated to provide cooling that has both the pumped refrigerant economizer mode and direct expansion mode, determining whether to operate each such cooling circuit in the pumped refrigerant economizer mode or the direct expansion mode. The controller operating each cooling circuit having both the pumped refrigerant economizer mode and the direct expansion mode in the pumped refrigerant economizer mode when an outside air temperature is low enough to provide sufficient heat rejection from the refrigerant flowing through the condenser to the outside air without compressing the refrigerant and when the outside air temperature is not low enough to provide such sufficient heat rejection operating that cooling circuit in the direct expansion mode. The controller when a Call for Cooling first reaches a point where cooling is needed, operating the upstream cooling circuit to provide cooling and not operating the downstream cooling circuit to provide cooling and when the Call for Cooling has increased to a second point, additionally operating the downstream cooling circuit to provide cooling, wherein the cooling capacity at which the upstream cooling circuit is being operated to provide is less than the full cooling capacity of the upstream cooling circuit when the Call for Cooling reaches the second point.

In an aspect, the condensers of each cooling circuit include an electronically commutated fan. The controller of the cooling system varies the speed of the electronically commutated fan to maintain a temperature of the refrigerant leaving the condenser at a setpoint.

In an aspect, the air moving unit includes at least one electronically commutated fan. The controller of the cooling system increases the speed of the electronically commutated fan as a cooling load on the cooling system increases and decreases the speed of the electronically commutated fan as the cooling load decreases.

In an aspect, the controller of the cooling system operates the fixed capacity compressor and variable capacity digital scroll compressor of each tandem compressor to maximize operation of the variable capacity digital scroll compressor in an upper loading range of the variable capacity digital scroll compressor.

In an aspect, the controller of the cooling system determines which of the cooling circuits to operate in a direct expansion mode to provide cooling based on a Call for Cooling. When the cooling circuits are being operated in the direct expansion mode, the controller controls the fixed compressor and variable capacity digital scroll compressor of the tandem digital scroll compressor of that cooling circuit based on the Call for Cooling, which of a plurality of ranges that the Call for Cooling falls within and whether the Call for Cooling is ramping up or ramping down. In an aspect, the controller first begins ramping the variable capacity digital scroll compressor of the cooling circuit of the upstream cooling stage to operate the upstream cooling stage to provide cooling and then as the Call for Cooling increases above a threshold, also begins ramping the variable capacity digital scroll compressor of the cooling circuit of the downstream cooling stage in parallel with ramping the variable capacity digital scroll compressor of the upstream cooling circuit to operate both the upstream cooling stage and the downstream cooling stage to provide cooling.

In an aspect, the controller controls the fixed compressor and variable capacity digital scroll compressor of each tandem digital scroll compressor based on a Call for Cooling Call and a Call for Dehumidification which takes precedence over control based on only the Call for Cooling when there is an unmet Call for Dehumidification.

In an aspect, the controller when a cooling circuit is operated in the direct expansion mode controls the electronic expansion valve of that cooling circuit to control a suction superheat of the evaporator of that cooling circuit and the controller when a cooling circuit having both the pumped refrigerant economizer mode and the direct expansion mode is being operated in the pumped refrigerant economizer mode controlling the expansion valve of that cooling circuit to maintain a minimum differential pressure across the liquid pump of that cooling circuit.

DRAWINGS

The drawings described herein are for illustrative purposes only of selected embodiments and not all possible implementations, and are not intended to limit the scope of the present disclosure.

FIGS. 11A and 11B are tables showing control settings for tandem digital scroll compressors used in a CRAC having the staged cooling circuits for sensible cooling control and for dehumidification control in accordance with an aspect of the present disclosure and FIG. 11C is a flow chart showing this control;

Corresponding reference numerals indicate corresponding parts throughout the several views of the drawings.

DETAILED DESCRIPTION

Example embodiments will now be described more fully with reference to the accompanying drawings.

In accordance with an aspect of the present disclosure, a high efficiency cooling system includes staged cooling provided by two or more cooling circuits arranged so that air to be cooled flows through them serially. In an aspect, each cooling circuit includes a tandem digital scroll compressor made up of a fixed capacity scroll compressor and digital scroll compressor. It should be understood that instead of tandem digital compressors, a plurality of compressors can be plumbed in parallel and these compressors may have differing capacities. In an aspect, each cooling circuit includes a DX cooling circuit and a pumped refrigerant economization circuit that bypasses the compressor when the outdoor temperature is sufficiently low to provide the requisite cooling to the refrigerant being circulating in the cooling circuit. In an aspect, the high efficiency cooling system also includes one or more fans, blowers or similar air moving units that move air to be cooled through the evaporators of each cooling circuit. The motors of the air moving unit may illustratively be variable speed motors, and may illustratively be electronically controlled motors. The same may be the case for the fan motors for the condenser. In an aspect, the cooling circuits of the high efficiency cooling system include an electronic expansion valve.

It should be understood that a cooling system can have less than all these elements, and can have various combinations of them. For example, the cooling system may not have staged cooling but have a cooling circuit that includes a DX cooling circuit and the pumped refrigerant economization circuit. In this aspect, the tandem digital scroll may or may not be utilized.

Figure 3:
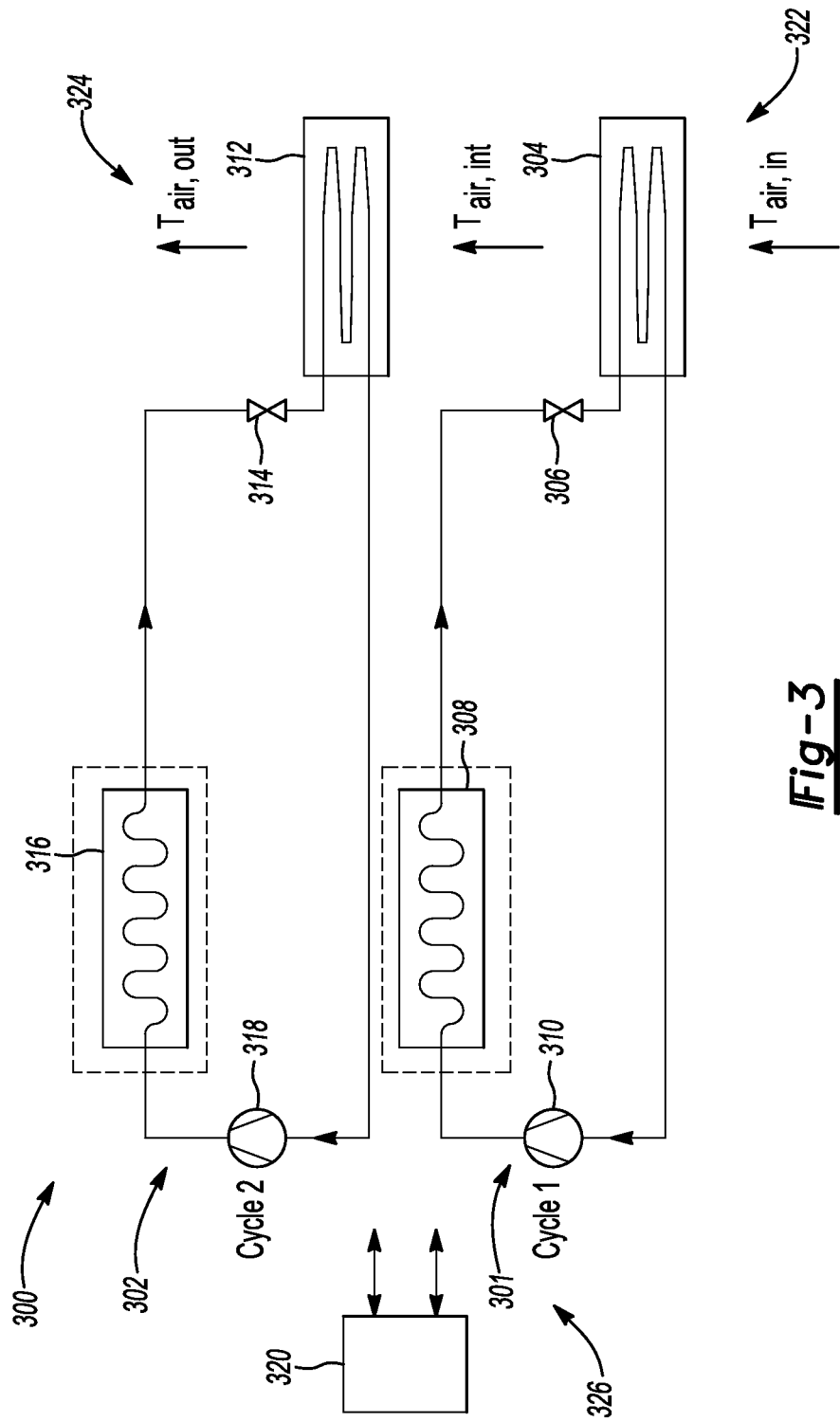
FIG. 3 is a schematic showing a CRAC having staged cooling provided by two cooling circuits in accordance with an aspect of the present disclosure.

FIG. 3 is a simplified schematic of a cooling system 300 having a plurality of cooling stages including an upstream cooling stage 322 with an upstream cooling circuit 301 and a downstream cooling stage 324 with a downstream cooling circuit 302 in accordance with an aspect of the present disclosure. In the embodiment of FIG. 3, cooling circuits 301, 302 are both DX refrigeration circuits. Upstream cooling circuit 301 includes an evaporator referred to as upstream evaporator 304, expansion valve 306, condenser 308 and compressor 310 arranged in a conventional DX refrigeration circuit. Downstream cooling circuit 302 includes an evaporator referred to as downstream evaporator 312, expansion valve 314, condenser 316 and compressor 318 arranged in a conventional DX refrigeration circuit. In this regard, evaporator 304, expansion valve 306 and compressor 310 of upstream cooling circuit 301 and evaporator 312, expansion valve 314 and compressor 318 of downstream cooling circuit 302 may all be included in a CRAC 326 located in a data center along with controller 320. Condensers 308, 316 are shown in dashed boxes as they are typically not included in CRAC 326 but located elsewhere, such as outside the building in which CRAC 326 is located. Expansion valves 306, 314 may preferably be electronic expansion valves, but may also be thermostatic expansion valves such as those disclosed in U.S. Pat. No. 4,606,198. In each DX refrigeration circuit 301, 302, a refrigerant is circulated by the compressor and it flows from the compressor, through the condenser, expansion valve, evaporator and back to the compressor. The evaporators 304, 312 of upstream and downstream cooling circuits 301, 302 are arranged in stages so that air drawn in through an inlet of the CRAC flows in serial fashion through evaporators 304, 312, that is, the air flows first through the upstream evaporator 304 in upstream cooling circuit 301 and then through downstream evaporator 312 in the downstream cooling circuit 302. By having a plurality of cooling stages arranged for serial air flow therethrough, the temperature differential across the evaporators of each DX refrigeration circuit is reduced. This in turn allows the evaporators in each DX refrigeration circuit to operate at different pressure levels and allows the pressure differences between the respective evaporators and condensers to be reduced. Since compressor power is a function of the pressure difference between the evaporator and condenser, a lower pressure difference is more energy efficient. It should be understood that each compressor 310, 318 may include tandem compressors with one compressor a fixed capacity compressor and the other compressor a variable capacity compressor, such as a digital scroll compressor. Each compressor 310, 318 may be a tandem digital scroll compressor that includes a fixed capacity scroll compressor and a digital scroll compressor, as discussed in more detail below.

Figure 1:
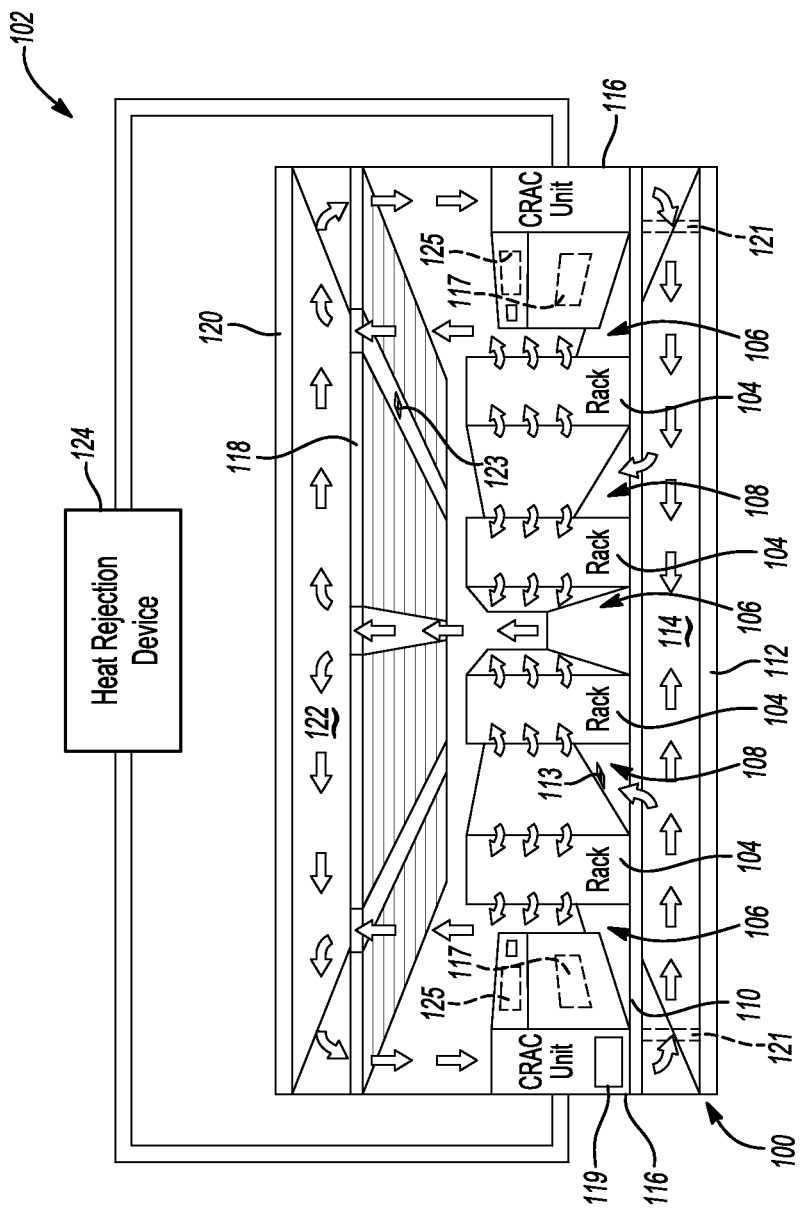
FIG. 1 is a schematic illustrating a prior art data center.

It should be understood that condensers 308, 316 can be any of the heat rejection devices described above with regard to heat rejection device 124 of FIG. 1.

The cooling circuit of each stage provides a portion of the overall cooling provided by CRAC 326 of cooling system 300. The portions can be equal, with each stage providing equal cooling, or they can be different. More specifically, each cooling stage has a maximum temperature difference that is a portion of the maximum temperature difference across CRAC 326. For example, if CRAC 326 has a maximum temperature difference of 20 deg. F., the cooling circuit of each stage has a maximum temperature difference that is some percentage of 20 deg. F. This may be an equal percentage, in which case cooling circuit 301, 302 each have a maximum 10 deg. F temperature difference where the maximum temperature difference across CRAC 326 is 20 deg. F., or the percentages may be different.

Cooling system includes controller 320 that controls cooling circuits 301, 302.

Upstream evaporator 304 of upstream cooling circuit 301 sees higher inlet air temperatures and compressor 310 of upstream cooling circuit 301 supplies refrigerant to upstream evaporator 304 at a higher evaporating temperature than that supplied by compressor 318 to downstream evaporator 312 in downstream cooling circuit 302. Downstream evaporator 312 in downstream cooling circuit 302 sees the lower air temperature exiting evaporator 304 of upstream cooling circuit 301. Compared to current technology, there is an optimal point, along a continuum of cooling from cooling only by downstream cooling circuit 302 to cooling only by upstream cooling circuit 301 at which the same net total cooling capacity is achieved with smaller compressors in the upstream and downstream cooling circuits 301, 302, with upstream and downstream cooling circuits 301, 302 and evaporators 304, 312 of upstream and downstream cooling circuits 301, 302 configured to provide approximately equal cooling capacity. For example, if CRAC 326 is a 30 ton unit, cooling circuits 301, 302 would each be configured to provide approximately 15 tons of cooling capacity as would evaporators 304, 312. Evaporators 304, 312 are configured to have approximately equal surface cooling area (the cooling surface area being the area contacted by the air flowing through the evaporator). In this regard, when evaporators 304, 312 have a plurality of cooling slabs, such as in a V-coil assembly, instead of having each cooling slab of downstream evaporator 312 be fed by separate compressors, both cooling slabs of downstream evaporator 312 would be fed by a compressor and both cooling slabs of upstream evaporator 304 would be fed by another compressor. These two compressors would preferably have equal capacity and the staged cooling allows the two compressors to be smaller (lesser capacity) than the two compressors used to feed the two cooling slabs of an evaporator in a typical prior art CRAC having DX refrigeration circuits for the two cooling slabs that provide comparable cooling capacity.

In an alternate embodiment, compressor 318 in downstream cooling circuit 302 is larger (that is, has a higher capacity) than compressor 310 in upstream cooling circuit 301 in order to decrease the evaporating temperature of the refrigerant provided to downstream evaporator 312. This in turn decreases the sensible heat ratio and increases the dehumidification capabilities of downstream cooling circuit 302. In this embodiment, downstream evaporator 312 may have the same cooling surface area as that of upstream evaporator 304 in upstream cooling circuit 301, or may have a cooling surface area that is different (larger or smaller) than the surface cooling area of upstream evaporator 304.

In an aspect, upstream evaporator 304 in upstream cooling circuit 301 is a microchannel cooling coil assembly. Upstream evaporator 304 may illustratively be a microchannel heat exchanger of the type described in U.S. Ser. No. 12/388,102 filed Feb. 18, 2009 for "Laminated Manifold for Microchannel Heat Exchanger" the entire disclosure of which is incorporated herein by reference. Upstream evaporator 304 may illustratively be a MCHX microchannel heat exchanger available from Liebert Corporation of Columbus, Ohio. When upstream evaporator 304 is a micro-channel heat exchanger, upstream cooling circuit 301 is illustratively configured to provide sensible only cooling, such as providing a temperature delta across upstream evaporator 304 that does not drop the temperature of the air exiting upstream evaporator 304 below its dewpoint, or below a temperature a certain number of degrees above the dewpoint, such as about 4 deg. F. While one advantage of using a microchannel cooling coil assembly for upstream evaporator 304 of upstream cooling circuit 301 is that microchannel cooling coil assemblies have air side pressure drops across them that are significantly less than fin-and-tube cooling coil assemblies having comparable cooling capacity, it should be understood that upstream evaporator 304 can be other than a microchannel cooling coil, and may for example be a fin-and-tube cooling coil assembly.

In an aspect, downstream evaporator 312 of downstream cooling circuit 302 is a fin-and-tube cooling coil assembly. In an aspect, downstream evaporator 312 is a microchannel cooling coil assembly.

Figure 4:
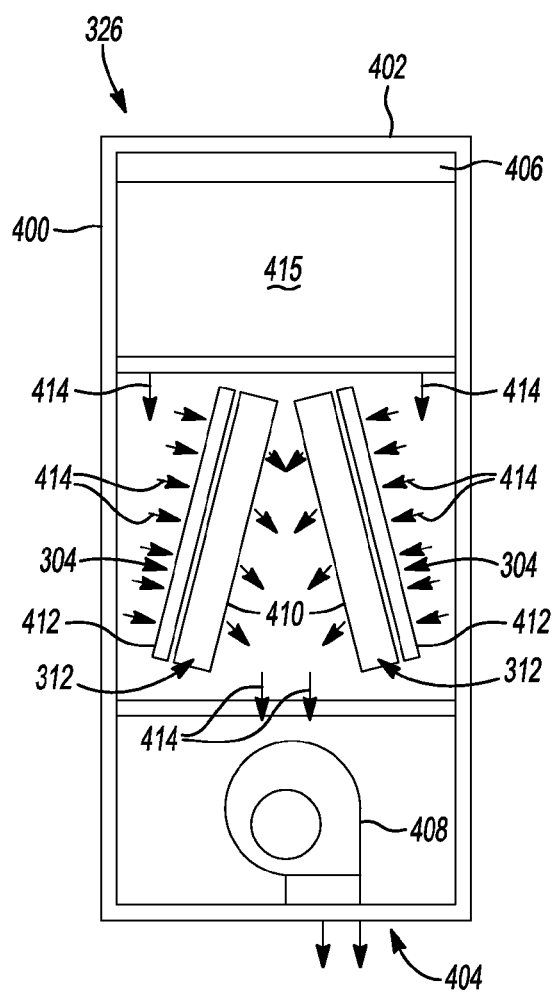
FIG. 4 is a simplified perspective view of a CRAC having the cooling circuits of the CRAC of FIG. 3.

FIG. 4 shows an illustrative embodiment of CRAC 326. CRAC 326 includes a cabinet 400 having a return air inlet 402 and an air outlet 404, such as a plenum. An air filter 406 is disposed at return air inlet 402 so that air flowing into CRAC 326 through return air inlet 402 flows through air filter 406 before flowing through the rest of CRAC 326. Arrows 414 show the direction of air flow through CRAC 326.

In the embodiment shown in FIG. 4, downstream evaporator 312 of downstream cooling circuit 302 is an A-coil assembly disposed in cabinet 400 between return air inlet 402 and air outlet 404. Downstream evaporator 312 thus has a cooling slab 410 for each leg of the A. Upstream evaporator 304 is also an A-coil assembly having a cooling slab 412 for each leg of the A. An air moving unit 408, such as a fan or squirrel cage blower, is disposed in cabinet 400 between a downstream side of downstream evaporator 312 and air outlet 404. One of the cooling slabs 412 of upstream evaporator 304 is disposed on the air inlet side of one of the cooling slabs 410 of downstream evaporator 312 and the other of the cooling slabs 412 of upstream evaporator 304 is disposed on the air inlet side of the other of the cooling slabs 410 of downstream evaporator 312. The cooling slabs 410 of downstream evaporator 312 and the cooling slabs 412 of upstream evaporator 304 are thus arranged in pairs, with respective ones of the cooling slabs 412 of upstream evaporator paired with respective ones of the cooling slabs 410 of downstream evaporator 312. In should be understood that air moving unit 408 may alternatively be disposed upstream of upstream evaporator 304.

Figure 5:
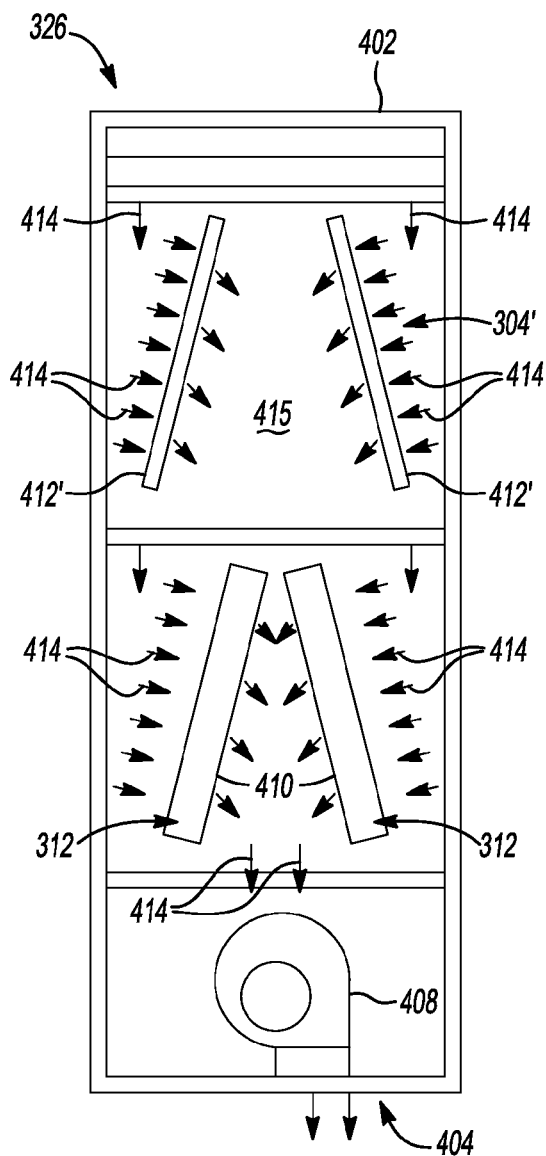
FIG. 5 is a simplified perspective view of another CRAC having the cooling circuits of the CRAC of FIG. 3.

Alternatively, as shown in FIG. 5, upstream evaporator 304' in upstream cooling circuit 301 may be disposed in a plenum 415 of cabinet 400 between air filter 406 and downstream evaporator 312.

In a variation, the cooling slabs 412 of upstream evaporator 304 could be segmented into multiple cooling slabs, as could cooling slabs 410 of downstream evaporator 312.

Staging the cooling in the CRAC with upstream and downstream separate DX refrigeration circuits allows the pressure difference across the compressor of the upstream DX refrigeration circuit to be reduced, thereby reducing its power consumption. The additional surface area provided by the upstream evaporator in the upstream DX refrigeration circuit allows the temperature delta across the downstream evaporator in the downstream DX refrigeration circuit to be reduced. This allows the pressure difference across the compressor in the downstream DX refrigeration circuit to be reduced, thereby reducing its power consumption. The staging also elevates the temperature of the evaporators so that they do less dehumidification. In a data center, dehumidification is typically a waste of energy. Staging the cooling has the further benefit of enabling the CRAC to accommodate large air side temperature differences from inlet to outlet. The combination of these effects greatly increases the SHR.

The compressor of a DX cooling circuit runs more efficiently and with greater capacity when the difference between evaporating and condensing pressures is reduced. In addition, if increased energy efficiency as opposed to greater capacity is the objective, then the compressors can be smaller and still meet the desired mass flow rate for the refrigerant flowing through the cooling circuit since the evaporating temperature has been raised. That is, the compressors in each circuit can be smaller than the compressors used to feed the cooling slabs of a cooling coil in a typical prior art CRAC having DX refrigeration circuits for each cooling slab and still achieve the same net total cooling capacity.

Figure 6:
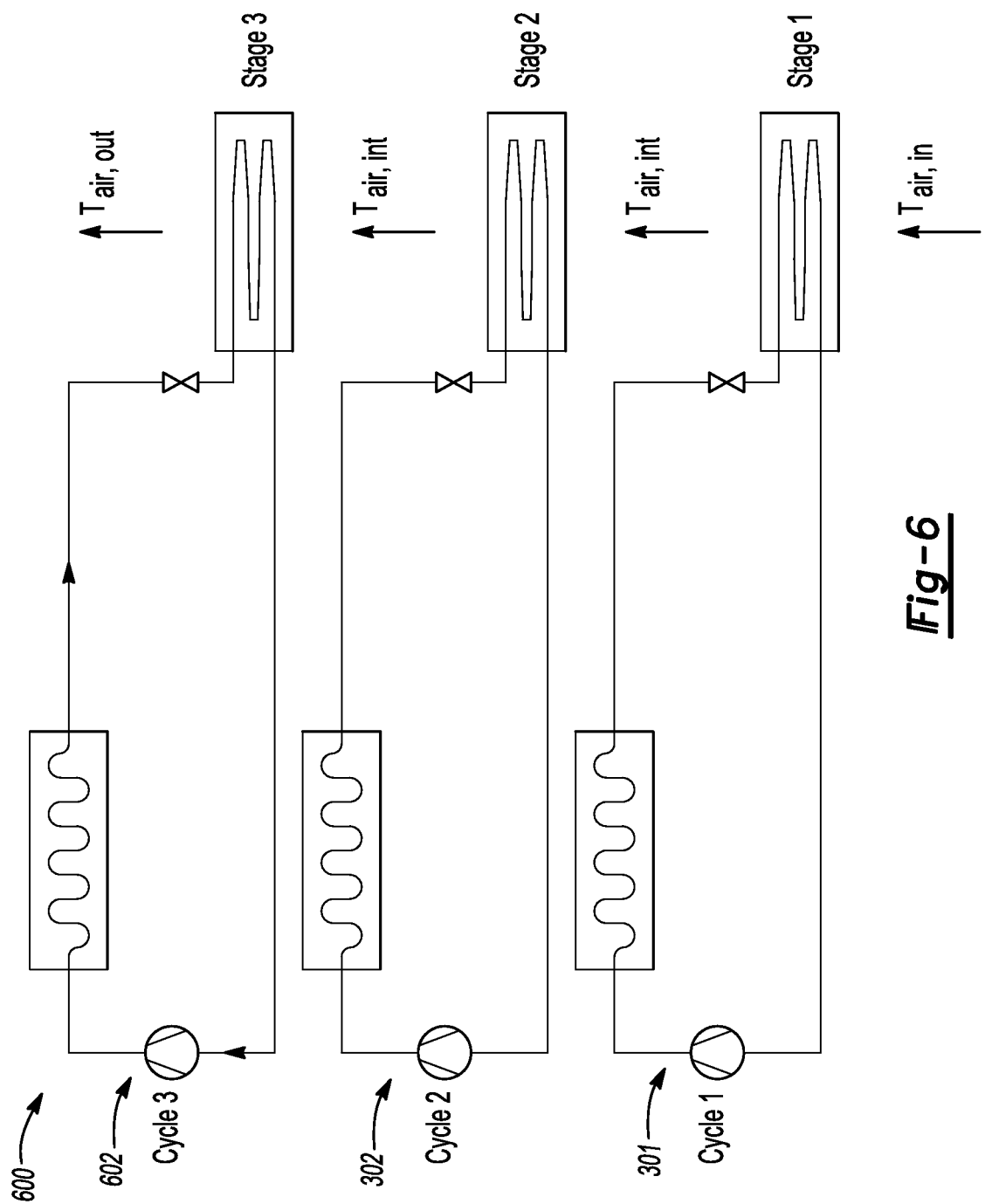
FIG. 6 is a schematic showing a CRAC having staged cooling provided by three cooling circuits in accordance with an aspect of the present disclosure.

It should be understood that cooling system 300 could have more than two staged cooling circuits, with each staged cooling circuit illustratively being a DX cooling circuit such as cooling circuit 301, 302. For example, a cooling system such as cooling system 600 in FIG. 6 has three staged cooling circuits, with the third cooling circuit 602 arranged downstream of cooling circuit 302. Each stage may then provide an equal (i.e., ⅓) portion of the cooling provided by cooling system 600, or each stage may provide different portions.

Figure 7:
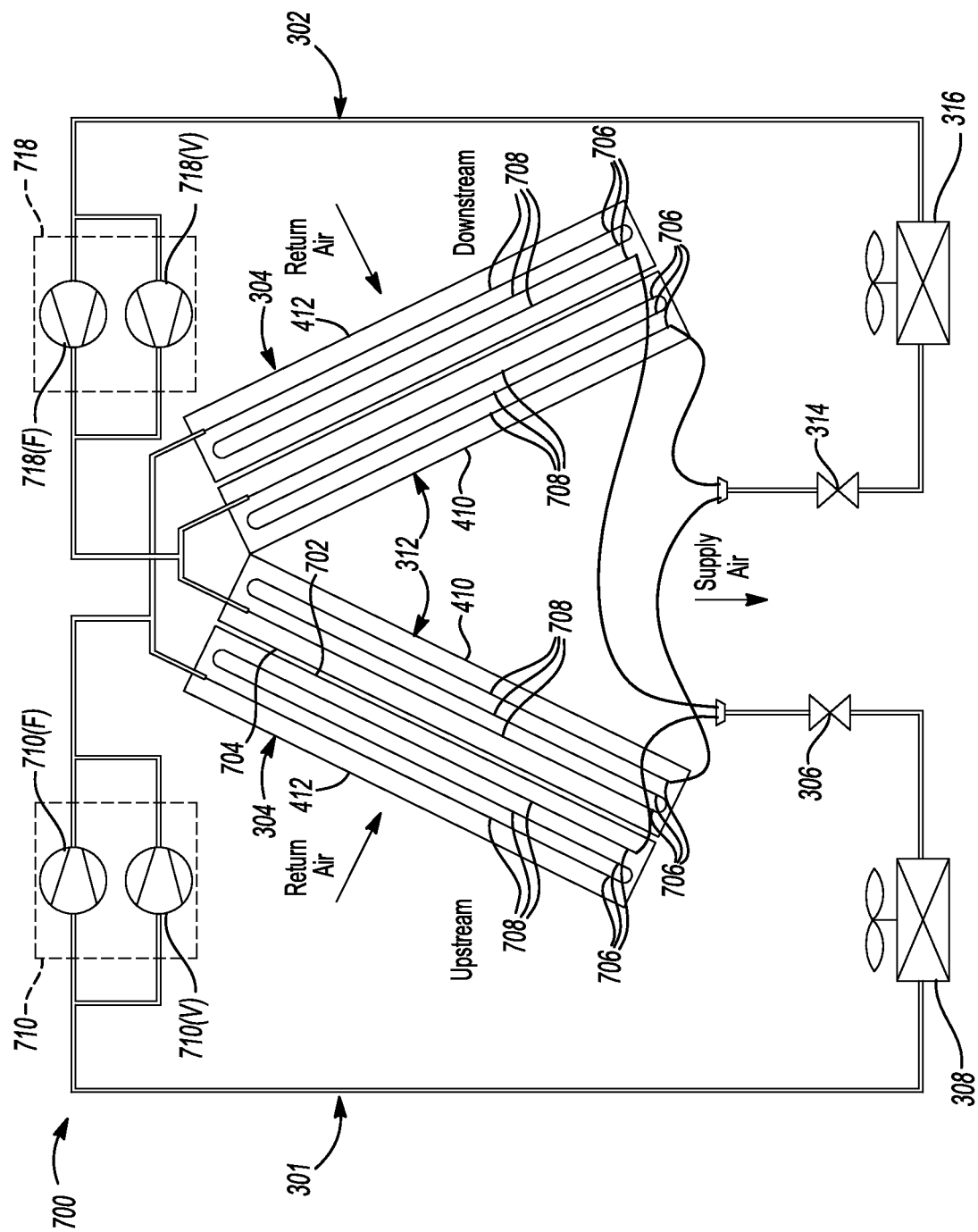
FIG. 7 is a simplified perspective view showing a CRAC having staged cooling provided by two cooling circuits with each cooling circuit having a tandem digital scroll compressor in accordance with an aspect of the present disclosure.

As mentioned above, each compressor 310, 318 may be a tandem compressor such as a tandem compressor known as a tandem digital scroll compressor that includes both a fixed capacity scroll compressor and a variable capacity digital scroll compressor. As used herein, "tandem digital scroll compressor" means a compressor that has both a fixed capacity scroll compressor and a variable capacity digital scroll compressor. FIG. 7 shows a CRAC 700 that is a variation of CRAC 326 (FIG. 3) with tandem digital scroll compressors 710 and 718 with tandem digital scroll compressor 710 including a fixed capacity compressor 710(F) and a variable capacity digital scroll compressor 710(V), and tandem digital scroll compressor 718 including a fixed capacity compressor 718(F) and a variable capacity digital scroll compressor 718(V). Fixed capacity compressors 710(F) and 718(F) may preferably be fixed capacity scroll compressors, but it should be understood that they can be other types of fixed capacity compressors. A digital scroll compressor has the ability to vary or modulate its capacity between about 10% and 100% by separation of scroll sets. The digital scroll compressor has lower efficiency when operating at a part load condition and more efficient when operating at a higher load condition. More specifically, digital scroll compressors tend to be more efficient when operating between 50% and 100% of capacity (i.e., loaded between 50% and 100%) and less efficient when operating below 50% of capacity. Pairing a fixed capacity compressor with a digital scroll compressor in a tandem digital scroll provides a broader range of energy efficient operation from about 25% to 100% of capacity. Tandem digital scroll compressors may illustratively be tandem digital scroll compressors available from Emerson Climate Technology, Sydney Ohio, under the Copeland® brand. As used herein, upper loaded range means the loading range of a certain loading percentage and above where a digital scroll compressor operates more efficiently. While it is typically 50% or higher, it should be understood that the lower loading can differ from 50% and depend on the particular compressor.

Upstream and downstream evaporators 304, 312 may have various configurations. They may each have, for example, two cooling slabs having multiple rows of coils through which the coolant flows. They may also be separate from each other, as shown in FIGS. 4 and 7, or have an interleaved configuration where rows of coils of cooling slabs 412, 410 of upstream and downstream evaporators 304, 312 are interleaved with each other as shown in FIG. 8.

In the illustrative configuration of FIG. 7, upstream and downstream evaporators 304, 312 arranged as shown in FIG. 4 in a configuration referred to herein as a "separate configuration" where they are separate from each other and upstream evaporator 304 is wholly upstream of downstream evaporator 312. That is, cooling slabs 412 of upstream evaporator 304 are separate from cooling slabs 410 of downstream evaporator 312 and cooling slabs 412 are wholly upstream of cooling slabs 410. Cooling slabs 410, 412 are arranged in pairs as discussed above with an outlet side 702 of one of cooling slabs 412 of upstream evaporator 304 abutting an inlet side 704 of one of cooling slabs 410 of downstream evaporator 312. In the example configuration shown in FIGS. 4 and 7, cooling slabs 412 of upstream evaporator 304 are outboard of cooling slabs 410 of downstream evaporator 312.

Cooling slabs 410, 412 may, for example, each have three rows 706 of coils 708 through which the refrigerant flows. The rows 706 of coils 708 in cooling slabs 412 of upstream evaporator 304 are grouped separately from the rows 706 of coils 708 in cooling slabs 410 of downstream evaporator 312. Thus, the rows 706 of coils 708 in cooling slabs 412 of upstream evaporator 304 are all disposed upstream of the rows 706 of coils 708 in cooling slabs 410 of downstream evaporator 312. This configuration may be referred to herein as an "X row/X row—Z Stage Separate" configuration where X is the number of rows 706 of coils 708 in a cooling slab and Z is the number of cooling stages. The example embodiment shown in FIG. 7 is thus a 3 row/3 row—2 Stage separate configuration. It should be understood that each cooling slab can have more or less than 3 rows of coils.

Figure 8:
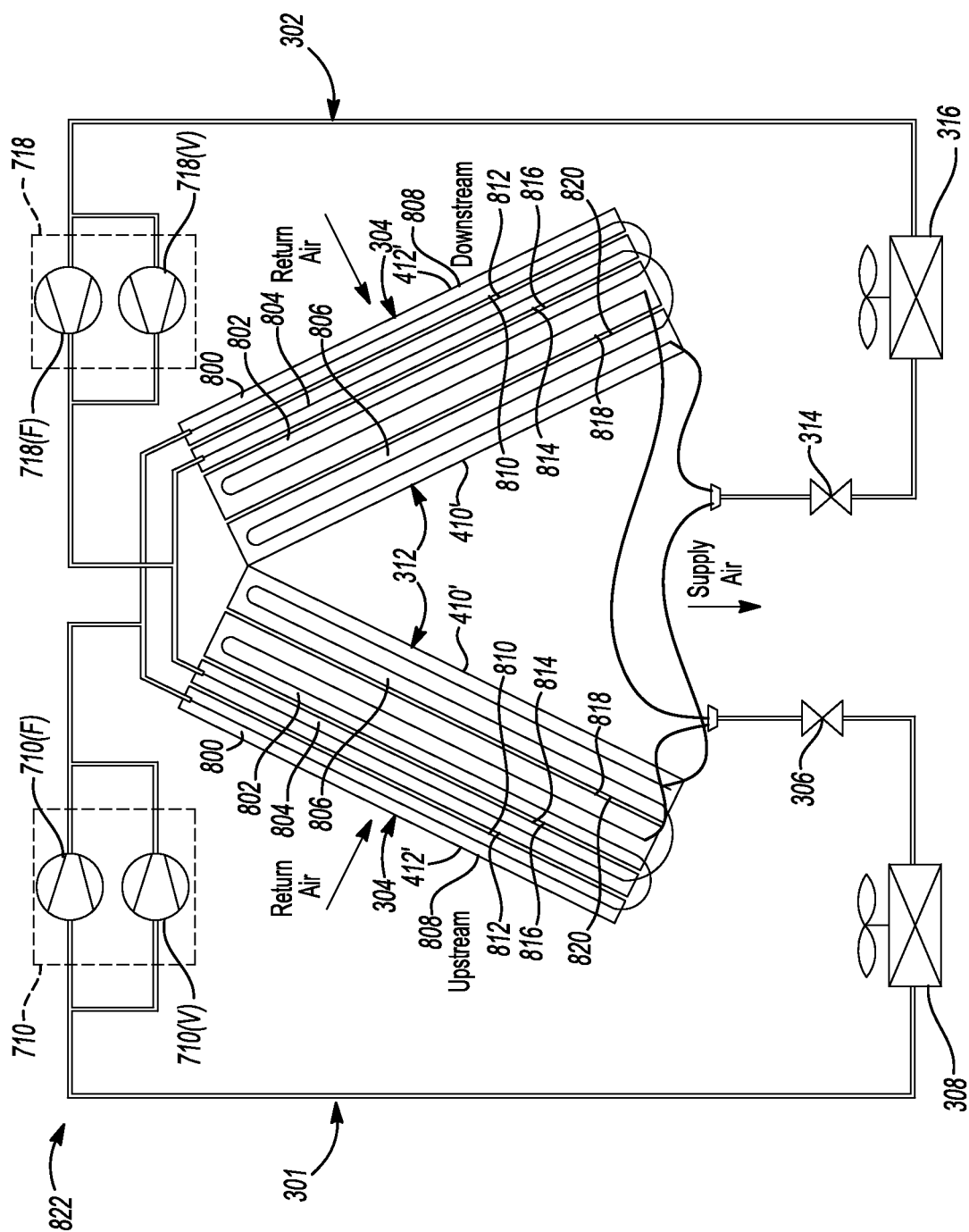
FIG. 8 is a simplified perspective view of evaporators having cooling slabs arranged in an interleaved configuration in accordance with an aspect of the present disclosure.

FIG. 8 shows a configuration referred to herein as an "interleaved configuration" where one or more rows of coils of the upstream evaporator 304 and downstream evaporator 312 are interleaved. In the example interleaved configuration shown in FIG. 8, cooling slabs 412', 410' of evaporators 304, 312, respectively, are arranged in pairs. Each cooling slab 410', 412' has two sections—a superheat section and a 2-phase section. For reference purposes, 412' of upstream evaporator 304 has superheat section 800 and 2-phase section 802 and each cooling slab 410' of downstream evaporator 312 has superheat section 804 and 2-phase section 806. Each pair of cooling slabs 410', 412' are arranged such that the superheat section 804 of cooling slab 410' of downstream evaporator 304 is disposed between superheat section 800 of cooling slab 412' of upstream evaporator 304 and 2-phase section 802 of cooling slab 412' of upstream evaporator 304. Superheat section 800 of cooling slab 412' of upstream evaporator 304 has an inlet side 808 facing outboardly as shown in FIG. 8 and an outlet side 810 facing an inlet side 812 of superheat section 804 of cooling slab 410' of downstream evaporator 312. An outlet side 814 of superheat section 804 of cooling slab 410' of downstream evaporator 312 faces an inlet side 816 of 2-phase section 802 of cooling slab 412' of upstream evaporator 304. An outlet side 818 of 2-phase section 802 faces an inlet side 820 of 2-phase section 806 of cooling slab 410' of downstream evaporator 312. In this configuration, air to be cooled enters superheat section 800 of cooling slab 412' of upstream cooling evaporator 304 and then passes through in sequence superheat section 804 of cooling slab 410' of downstream evaporator 312, 2-phase section 802 of cooling slab 412' of upstream evaporator 304, and 2-phase section 806 of cooling slab 410' of downstream evaporator 312. This configuration may be referred to herein as a "X row/X row, Y row/Y row—Z Stage interleaved" configuration where X is the number of rows in the superheat section of a cooling slab, Y is the number of rows in the 2-phase section of a cooling slab, and Z is the number of cooling stages. The example embodiment shown in FIG. 8 is thus a 1-row/1-row, 2-row/2-row—2 Stage interleaved configuration. It should be understood that the 2-phase section of each cooling slab can have more or less than 2 rows of coils and the superheat section of each cooling slab can have more than one row of coils.

In the interleaved configuration, refrigerant in each of the respective upstream and downstream cooling stages first flows through the 2-phase section of each cooling slab of the evaporator of that cooling stage and then through the superheat section of that cooling slab. The refrigerant will typically enter the 2-phase section in two phases (liquid and gas) and will typically exit the 2-phase section only as a gas. The refrigerant is then superheated in the superheat section, which sees hotter air than the 2-phase sections.

Evaporating temperature for a multi-stage cooling system of the types described above is constrained by the superheat temperature, especially for the downstream stage(s). By separating the superheat region in the interleaved configuration to the entering air side, the superheat limitation for the second stage is eliminated and the evaporating temperature of the second stage increases compared to a configuration where the coils of the evaporators are not interleaved—that is, the coils of the upstream evaporator are all upstream of the coils of the downstream evaporator.

Figure 9:
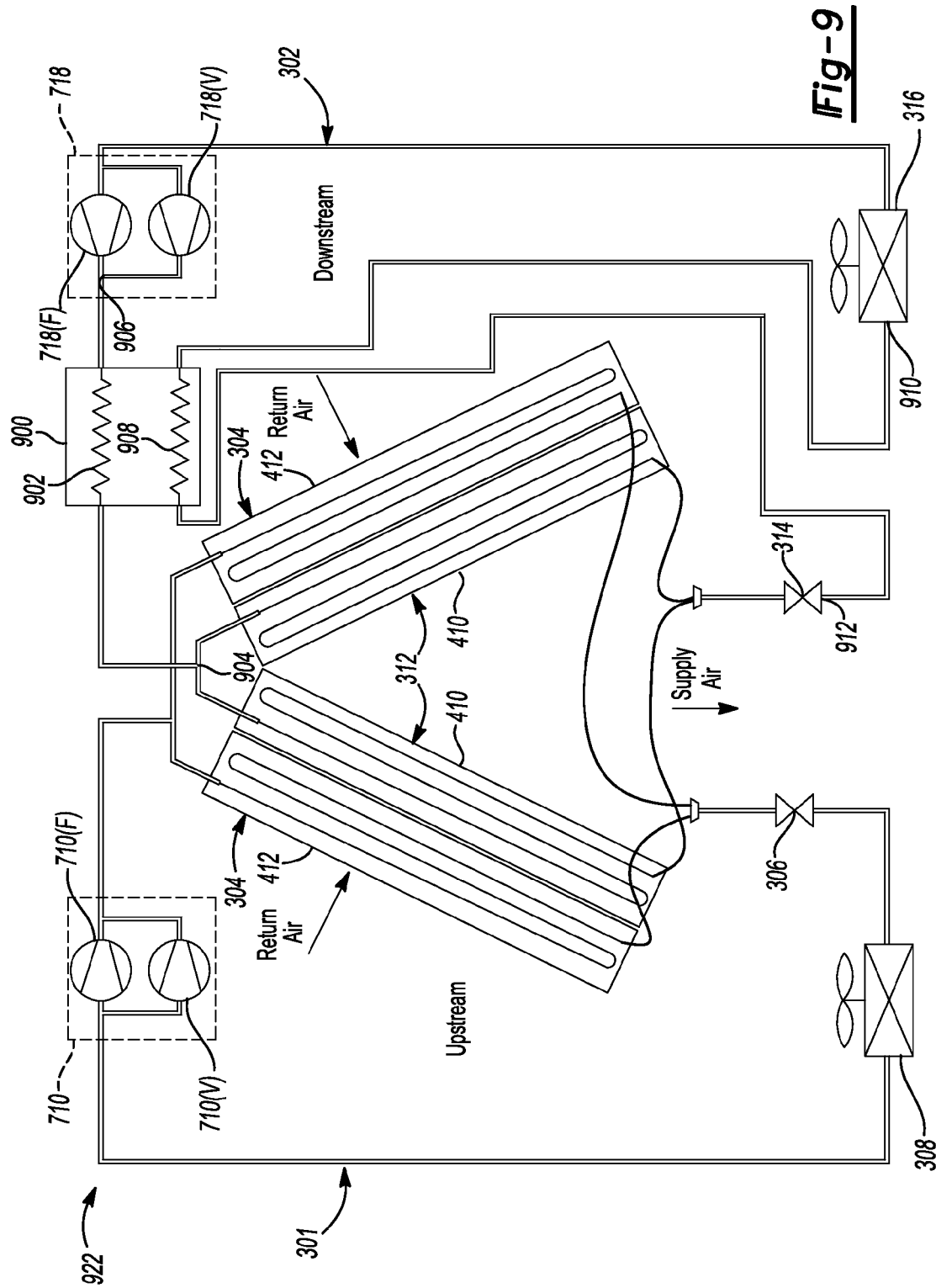
FIG. 9 is a simplified perspective view of a variation of the CRAC of FIG. 7 where one of the cooling circuits includes a suction line heat exchanger in accordance with an aspect of the present disclosure.

FIG. 9 shows a variation of the separate configuration of FIG. 7 where cooling circuit 302' includes a suction line heat exchanger 900 having a first heat exchange path 902 coupled between an outlet 904 of downstream evaporator 312 and an inlet 906 of tandem digital scroll compressor 718. A second heat exchange path 908 of suction line heat exchanger 900 is coupled between an outlet of 910 of condenser 316 and an inlet 912 of expansion valve 314.

In this variation, the suction line heat exchanger 900 subcools the high-pressure refrigerant flowing from condenser 316 through heat exchange path 908 resulting in superheating the gas phase refrigerant flowing through heat exchange path 902 from downstream evaporator 312 to tandem digital scroll compressor 718 so that the gas phase refrigerant is superheated when it enters tandem digital scroll compressor 718. This frees downstream evaporator 312 from doing any superheating and achieves a comparable increase in efficiency of tandem digital scroll compressor 718 (i.e., increase in evaporating temperature) as the interleaved configuration.

Figure 10:
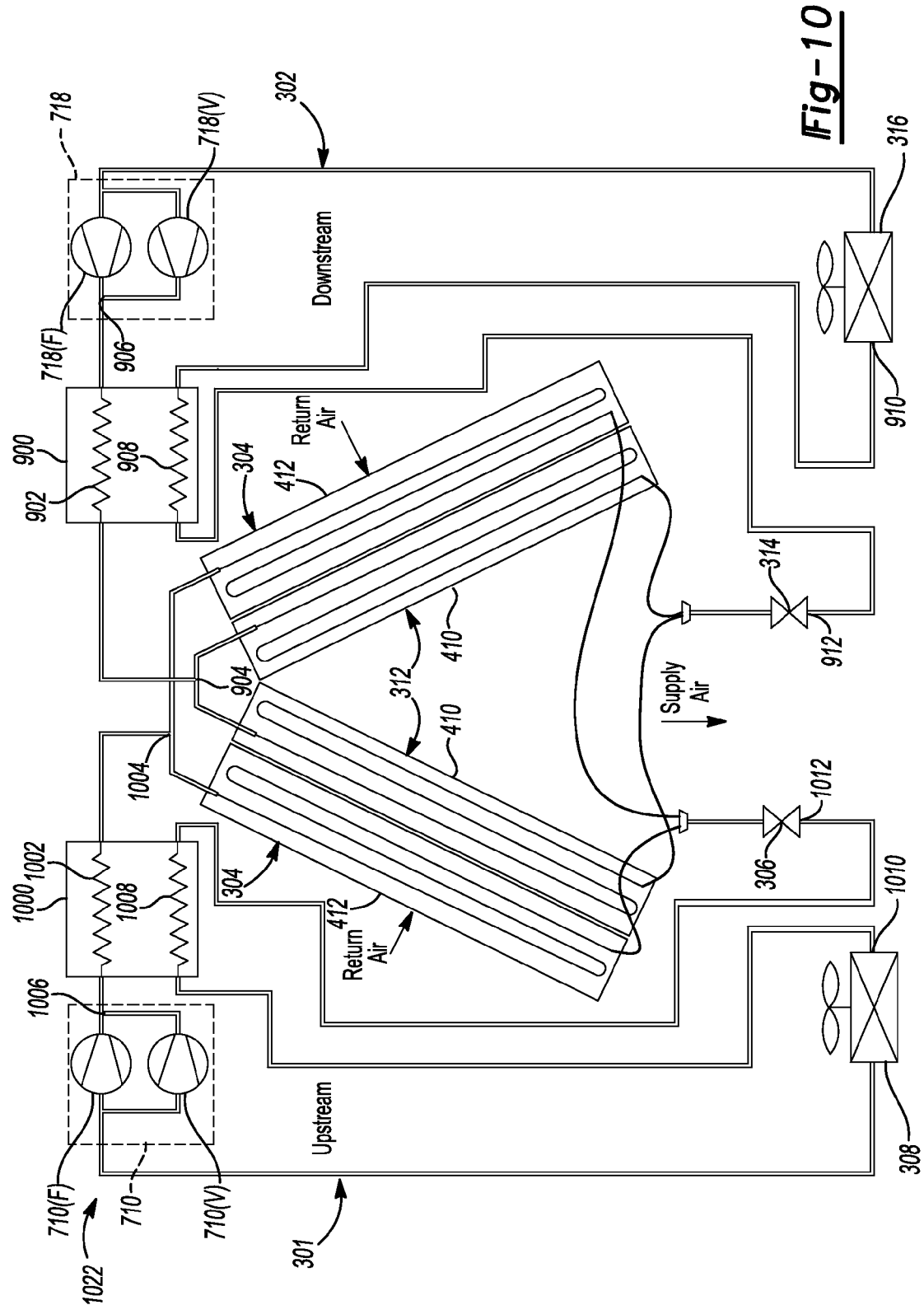
FIG. 10 is a simplified perspective view of the CRAC of FIG. 10 where both cooling circuits include a suction line heat exchanger in accordance with an aspect of the present disclosure.

In the embodiment of FIG. 9, only downstream cooling circuit 302' includes a suction line heat exchanger. FIG. 10 shows a variation of FIG. 9 in which cooling circuit 301' also includes a suction line heat exchanger 1000 having a first heat exchange path 1002 coupled between an outlet 1004 of upstream evaporator 304 and an inlet 1006 of compressor 310. A second heat exchange path 1008 of suction line heat exchanger 1000 is coupled between an outlet of 1010 of condenser 308 and an inlet 1012 of expansion valve 306.

In this variation, the suction line heat exchanger 1000 subcools the high-pressure refrigerant flowing from condenser 308 through heat exchange path 1008 resulting in superheating the gas phase refrigerant flowing through heat exchange path 1002 from upstream evaporator 304 to tandem digital scroll compressor 710 so that the gas phase refrigerant is superheated when it enters tandem digital scroll compressor 710. This frees upstream evaporator 304 from doing any superheating and increases the efficiency of tandem digital scroll compressor 710 (i.e., increase in evaporating temperature).

A cooling system that has staged cooling such as CRAC 700 (FIG. 7) that utilizes a plurality of cooling circuits such as cooling circuits 301, 302 as discussed above with tandem digital scroll compressors 710, 718 allows for better optimization of sensible cooling control and of dehumidification control.

In an aspect, controller 320 controls the tandem digital scroll compressors 710, 718. Controller 320 is illustratively programmed with appropriate software that implements the below described control of tandem digital scroll compressors 710, 718. Controller 320 may illustratively be an iCOM® control system available from Liebert Corporation of Columbus, Ohio programmed with software implementing the additional functions described below.

As used herein Call for Cooling means the cooling demand which is the actual cooling that the cooling system is being called on to provide. Typically, "Call for Cooling" is expressed as the percentage of the overall or nominal maximum cooling capacity of the cooling system. It should be understood that it can be expressed other than as a percentage. For example, it could be expressed in terms of power, such as kilowatts (Kw). By way of example only and not of limitation, the cooling system may have an overall capacity of 125 Kw and if it being called on to provide 62.5 Kw of cooling, the Call for Cooling could expressed at 62.5 Kw, as well as 50%.

Turning first to control of sensible cooling, controller 320 controls which fixed capacity compressor and digital scroll compressor of each tandem digital scroll compressor are on and in the case of each digital scroll compressor, its loading, based on the Call for Cooling and which of a plurality of ranges it falls within. In an aspect, the controller first begins ramping the variable capacity digital scroll compressor of the cooling circuit of the upstream cooling stage to operate the upstream cooling stage to provide cooling. When the Call for Cooling increases to a point where it will be more efficient to operate the downstream cooling stage to provide additional cooling rather than continuing to only increase the ramping of the variable capacity digital scroll compressor of the cooling circuit of the upstream cooling stage, the controller also begins ramping the variable capacity digital scroll compressor of the cooling circuit of the downstream cooling stage in parallel with ramping the variable capacity digital scroll compressor of the upstream cooling circuit. This operates both the upstream cooling stage and the downstream cooling stage to provide cooling. In so doing, controller 320 balances maximizing the operation of the variable capacity digital scroll compressor, particularly of the tandem digital scroll compressor of the cooling circuit of the upstream cooling stage, with the operation of the cooling circuit of the downstream cooling stage to better optimize efficiency.

In the following example, controller 320 has four control modes determined by the Call for Cooling (expressed as a percentage in the following example) that the cooling system (such as cooling system 300) is being called to provide, determined by controller 320 when cooling is ramping up and also when cooling is ramping down. FIG. 11A is a table that shows these control modes for the control of the fixed capacity scroll compressors 710(F) and 718(F) and the digital scroll compressors 710(V) and 718(V) of each of tandem digital scroll compressors 710, 718. The term "ramp" when used in the table of FIG. 11A with respect to a digital scroll compressor means the capacity of the digital scroll compressor is being modulated up (increasing the percentage of time that the digital scroll compressor is loaded) or down (decreasing the percentage of time that the digital scroll compressor is unloaded) as appropriate to provide fine adjustment of cooling to meet the cooling demand, referred to as Call for Cooling as discussed above. In table 11A, based on where the Call for Cooling compares to sensible cooling ramping up control thresholds SRU1-SRU5 (that is, what range the Call for Cooling falls within) determines when the fixed capacity scroll compressors 710(F) and 718(F) are on and when digital scroll compressors 710(V) and 718(V) are on and their percentage loading when the Call for Cooling is ramping up. The values in parentheses next to each control threshold SRU1-SRU5 are illustrative preferred values for each of these control thresholds. It should be understood, however, that control thresholds SRU1-SRU5 can have different values and these values may be determine heuristically and/or theoretically to optimize these values.

Similarly in table 11A, based on where the Call for Cooling percentage compares to sensible cooling ramping down control thresholds SRD1-SRD5 determines when the fixed capacity scroll compressors 710(F) and 718(F) are on and when digital scroll compressors 710(V) and 718(V) are on and their percentage loading when the Call for Cooling is ramping down. Again, the values in parentheses next to each control threshold SRD1-SRD5 are illustrative preferred values for each of these control thresholds. It should be understood, however, that control thresholds SRD1-SRD5 can have different values and these values may be determined heuristically and/theoretically to optimize these values.

It should be understood that the above discussed four control modes are illustrative and there can be other than four control modes, particularly, if there are more than two cooling stages and there thus being more than two tandem digital scroll compressors (e.g., a tandem digital scroll compressor for each cooling stage).

Turning to control of dehumidification, controller 320 controls which fixed capacity compressor and variable capacity digital scroll compressor of each tandem digital scroll compressor are on based on the Call for Cooling and which of a plurality of dehumidification control ranges it falls within and then controls ramping of the applicable variable capacity digital scroll compressor based on a Call for Dehumidification. In the following example, controller 320 has three control modes determined by the Call for Cooling. FIG. 11B is a table that shows these control modes for the control of the fixed capacity scroll compressors 710(F) and 718(F) and the digital scroll compressors 710(V) and 718(V) of each of tandem digital scroll compressors 710, 718. The same terms used in the table of FIG. 9A are also used in the table of FIG. 9B. In addition, "Call for Dehumidification" means the percentage of dehumidification for which cooling system 700 is being called to provide, determined by controller 320. In table 11B, based on where the Call for Cooling compares to latent cooling control thresholds L1-L4 determines when the fixed capacity scroll compressors 710(F) and 718(F) are on and when digital scroll compressors 710(V) and 718(V) are on and whether they are being ramped. The Call for Dehumidification determines the ramping of each of variable capacity digital scroll compressor 710(V) and 718(V) that is being ramped. Again, the values in parentheses next to each control threshold L1-L4 are illustrative preferred values for each of these control threshold that define dehumidification control ranges. It should be understood, however, that control thresholds L1-L4 can have different values and these values may be determine heuristically and/or theoretically to optimize these values. In an illustrative aspect, the control modes shown in the table of FIG. 11B take precedence over the control modes shown in the table of FIG. 11A when dehumidification is being called for—when there is an unmet Call for Dehumidification. When the Call for Dehumidification is met, control switches back to the control modes shown in the table of FIG. 11A. It should also be understood that the three control modes are illustrative and that three can be other than three control modes, particularly, if there are more than two cooling stages and there thus being more than two tandem digital scroll compressors (e.g., a tandem digital scroll compressor for each cooling stage).

Figure 11C:
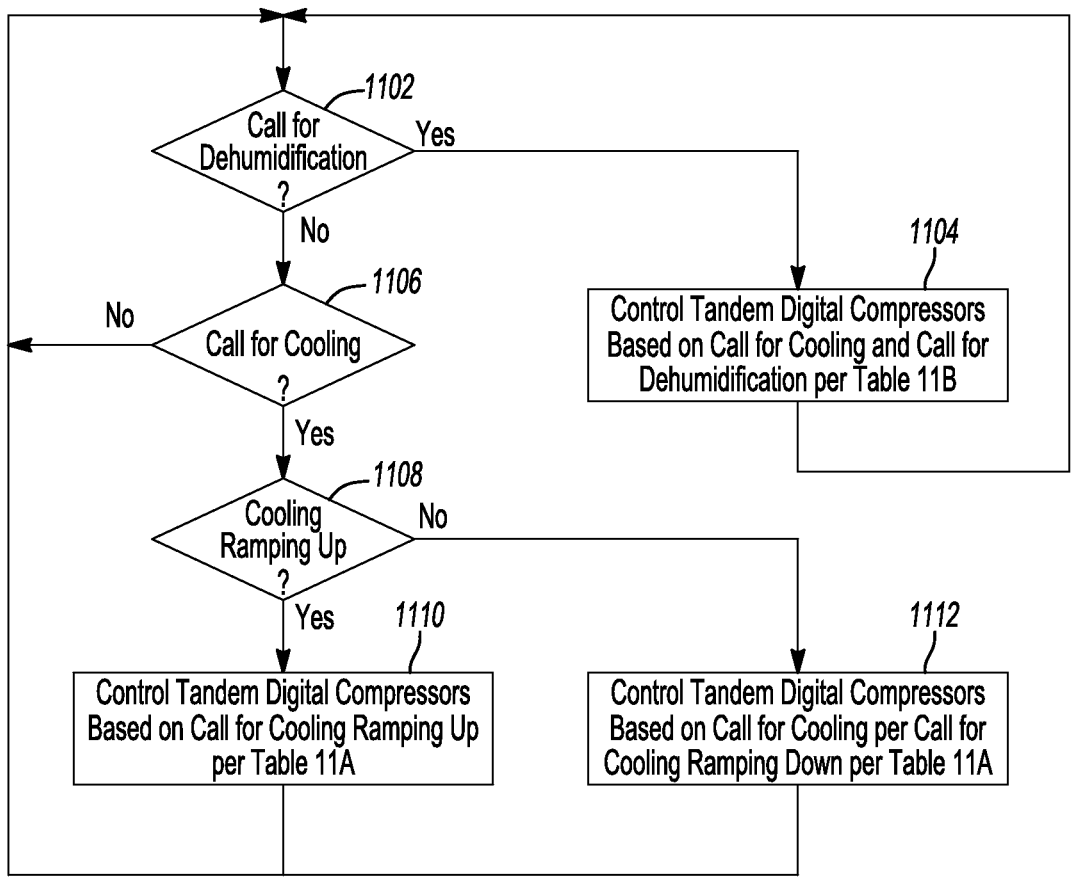

FIG. 11C is a basic flow chart of a software program for controller 320 to control tandem digital scroll compressors 710, 718 in accordance with the control set points set out in Tables 11A and 11B. At 1102, controller 320 determines whether there is a Call for Dehumidification and if so, the percentage of the Call for Dehumidification. If there was a Call for Dehumidification, at 1104 controller 320 controls tandem digital scroll compressors 710, 718 based on the Call for Cooling and control thresholds L1-L4 in table 11B. That is, based on where the Call for Cooling falls in the range of control thresholds L1-L4, controller 320 turns fixed capacity scroll compressors 710(F), 718(F) on and off and turns digital scroll compressors 710(V) and 718(V) on and off whether to ramp them if on. Based on the Call for Dehumidification, controller 320 controls the ramping of each variable capacity digital scroll compressor 710(V) and 718(V) that is being ramped. Controller 320 then returns to block 1102.

If at 1102 controller 320 determined that there was not a Call for Dehumidification, at 1106 it determines whether there was a Call for Cooling and the percentage of the Call for Cooling. If not, controller 320 returns to block 1102. If controller 320 determined that there was a Call for Cooling, at 1108 controller 320 determines if cooling is ramping up. If so, at 1110 controller 320 controls tandem digital scroll compressors 710, 718 based on the percentage of the Call for Cooling and control thresholds SRU1-SRU5 in the cooling ramping up portion of table 11A. That is, based on where the percentage of the Call for Cooling falls in the range of control thresholds SRU1-SRU5, controller 320 turns fixed capacity scroll compressors 710(F), 718(F) on and off and also turns on and off digital scroll compressors 710(V), 718(V) and sets their percentage of loading. Controller 320 then returns to block 1102. If at 1108 controller 320 determined that cooling was not ramping up, cooling is ramping down and at 1112 controller 320 controls tandem digital scroll compressors 710, 718 based on the percentage of the Call for Cooling and control thresholds SRD1-SRD5 in the cooling ramping down portion of table 11A. That is, based on where the percentage of the Call for Cooling falls in the range of control thresholds SRD1-SRD5, controller 320 turns fixed capacity scroll compressors 710(F), 718(F) on and off and also turns on and off digital scroll compressors 710(V), 718(V) and sets their percentage of loading. Controller 320 then returns to block 1102.

While the above description of staged cooling was in the context of data center cooling system having a CRAC, it should be understood that the staged cooling can be used in other types of cooling systems, such as building HVAC systems used for comfort cooling, such as cooling offices.

While the downstream evaporator discussed above was a A-coil assembly, and in an aspect the upstream evaporator discussed above was also a A-coil assembly, it should be understood that the staged cooling system could utilize a V-coil assembly as the downstream evaporator and in an aspect, utilize an V-coil assembly as the upstream evaporator It should also be understood that the upstream and downstream evaporators could each utilize a large, inclined cooling slab, or a flat cooling slab.

In accordance with another aspect of the present disclosure, a cooling system, which may include a CRAC, includes a DX cooling circuit with a pumped refrigerant economizer enabling the system to be run in a pumped refrigerant economizer mode when the temperature outside is cold enough to cool the cooling fluid circulating in the cooling circuit and bypass the compressor. The cooling fluid may illustratively be a phase change refrigerant having a vapor phase and a liquid phase. The pumped refrigerant economizer may illustratively include a pump that circulates the cooling fluid, illustratively the refrigerant in its liquid phase, with the compressor bypassed. This cooling system then uses the pump instead of the compressor to pump the refrigerant in its liquid phase and circulate the refrigerant when the outside air temperature is low enough to provide the heat exchange without compressing the refrigerant in its vapor phase to a higher pressure/condensing temperature. The economizer mode significantly increases the cooling system's sensible coefficient of performance (COP) when the cooling system switches to the economizer mode as described below. In terms of annual efficiency, the climate determines the benefit. For instance, modeling has shown that the annual energy efficiency increase in Washington D.C. is about 26%, while in Minneapolis, Minn., the annual energy efficiency increase is about 53%.

As discussed above, a conventional DX air conditioning system contains an evaporator, a compressor, a condenser and an expansion device. Often the air being cooled is at a lower temperature than the outside air. Because of this, a compressor is required to raise the pressure of the refrigerant in its vapor phase, and therefore its condensing temperature, to a higher temperature than the outside air so that the heat can be rejected. In any application in which heat is rejected to the outdoors even in the middle of the winter, the need to compress the cooling fluid consumes energy unnecessarily.

When the outdoor temperature becomes low enough to provide the overall required temperature difference between the inside air from which the heat is removed and the outside air to which the heat is rejected, there is no need to compress the refrigerant in its vapor phase to a higher pressure/temperature. When that is the case, the cooling system in accordance with this aspect of the present disclosure switches from DX (compressor) mode to pumped refrigerant economizer mode. In the pumped refrigerant economizer mode, the refrigerant is pumped in its liquid phase by a liquid pump to circulate the refrigerant in the cooling circuit without compressing the refrigerant in its vapor phase. The advantage is that the pump consumes roughly 1/10 of the power consumed by the compressor.

Figure 2:
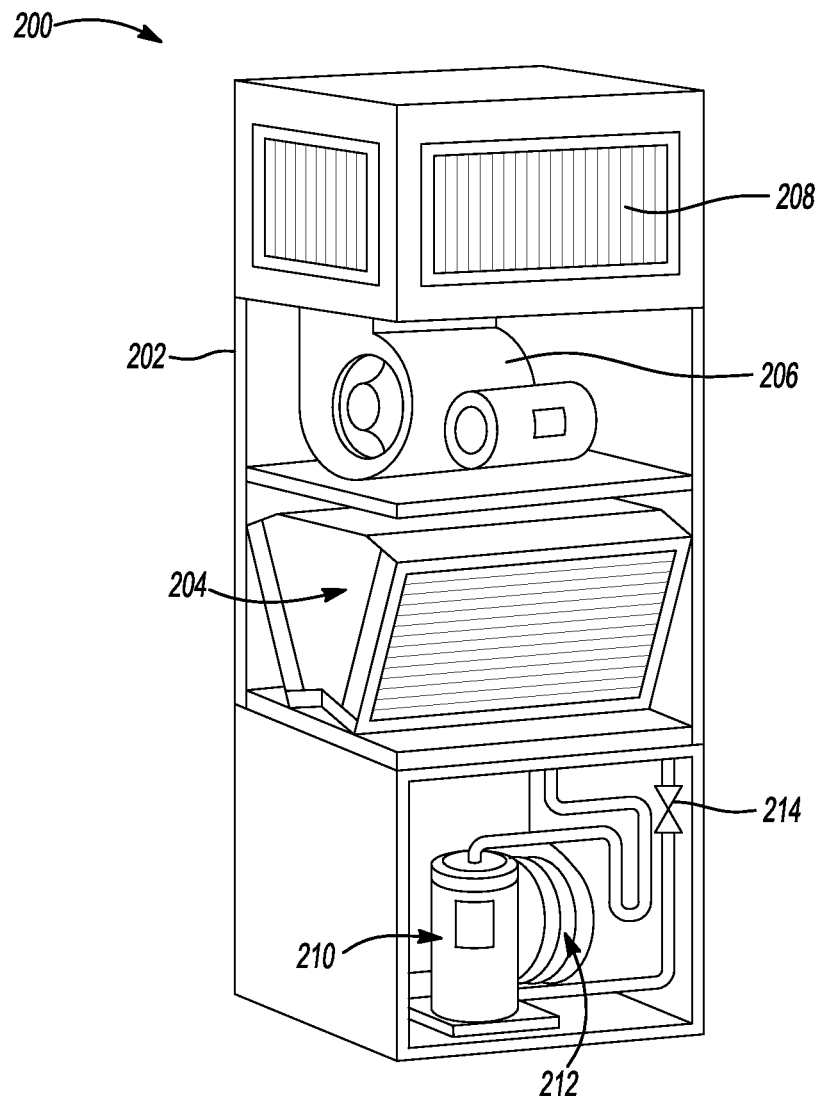
FIG. 2 is a simplified perspective view of a prior art CRAC having a DX cooling circuit.

The temperature at which the controller of the cooling system having a pumped refrigerant economizer mode decides to switch from one mode to the other is based on the difference between the indoor and outdoor temperatures, and the heat load on the cooling system. As stated above, the cooling system described here includes the components listed above, which are the typical components of a DX cooling circuit described with reference to FIG. 2, as well as a pump. When the controller decides to switch from DX (compressor) mode to pumped refrigerant economizer mode, the compressor is turned off and the pump is turned on. In the pumped refrigerant economizer mode, the refrigerant is bypassed around the compressor, while in DX (compressor) mode, the refrigerant is bypassed around the pump.

The following description of embodiments of a cooling system having a DX cooling circuit and a pumped refrigerant economizer will show preferred and alternative system layouts and component functionality. The three main control considerations for this system operating in the pumped refrigerant economizer mode are capacity control, evaporator freeze prevention (outdoor temperature can get very low) and pump protection. Most pumps require a minimum differential to ensure adequate cooling of the motor (if the pump is a canned motor pump) and lubrication of the bearings. Each of these control functions can be accomplished by a few different methods using different components.

Figure 12:
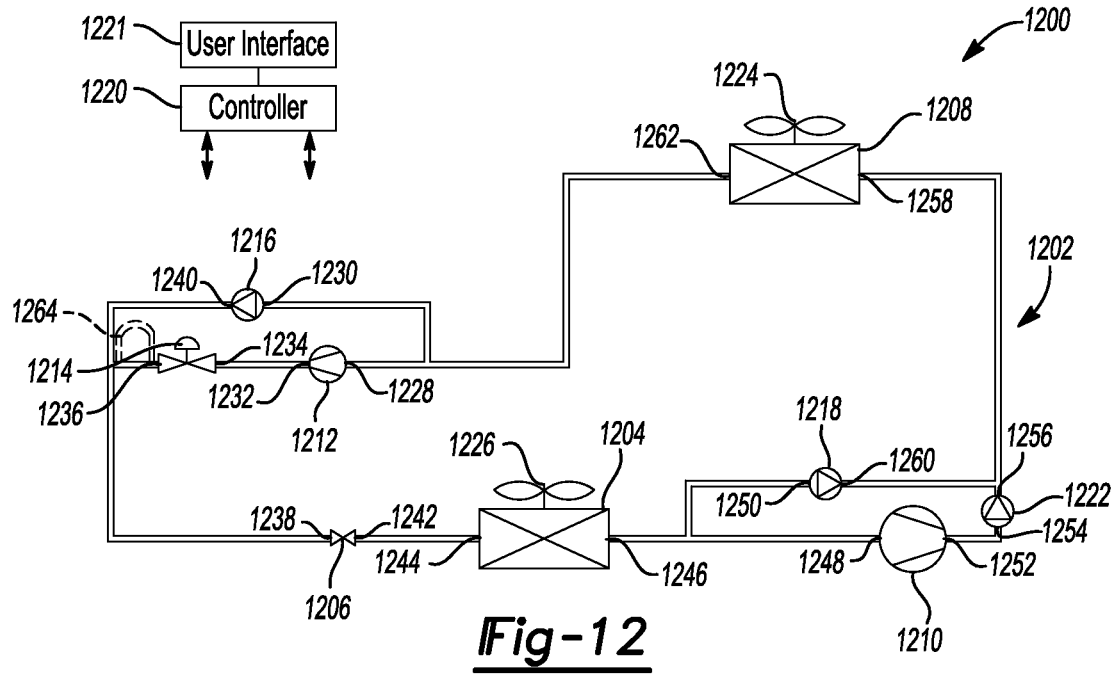
FIG. 12 is a cooling system having a DX cooling circuit with a pumped refrigerant economizer mode in accordance with an aspect of the present disclosure.

With reference to FIG. 12, a preferred embodiment of a cooling system 1200 having a pumped refrigerant economizer mode is shown. Cooling system 1200 includes a DX cooling circuit 1202 having an evaporator 1204, expansion valve 1206 (which may preferably be an electronic expansion valve but may also be a thermostatic expansion valve), condenser 1208 and compressor 1210 arranged in a DX refrigeration circuit. Cooling circuit 1202 also includes a fluid pump 1212, solenoid valve 1214 and check valves 1216, 1218, 1222. An outlet 1262 of condenser 1208 is coupled to an inlet 1228 of pump 1212 and to an inlet 1230 of check valve 1216. An outlet 1232 of pump 1212 is coupled to an inlet 1234 of solenoid valve 1214. An outlet 1236 of solenoid valve 1214 is coupled to an inlet 1238 of electronic expansion valve 1206. An outlet 1240 of check valve 1216 is also coupled to the inlet 1238 of electronic expansion valve 1206. An outlet 1242 of electronic expansion valve 1206 is coupled to a refrigerant inlet 1244 of evaporator 1204. A refrigerant outlet 1246 of evaporator 1204 is coupled to an inlet 1248 of compressor 1210 and to an inlet 1250 of check valve 1218. An outlet 1252 of compressor 1210 is coupled to an inlet 1254 of check valve 1222 and an outlet 1256 of check valve 1222 is coupled to an inlet 1258 of condenser 1208 as is an outlet 1260 of check valve 1218.

Cooling system 1200 also includes a controller 1220 coupled to controlled components of cooling system 1200, such as electronic expansion valve 1206, compressor 1210, pump 1212, solenoid valve 1014, condenser fan 1224, and evaporator air moving unit 1226. Controller 1220 is illustratively programmed with appropriate software that implements the below described control of cooling system 1200. Controller 1220 may include, or be coupled to, a user interface 1221. Controller 1220 may illustratively be an iCOM® control system available from Liebert Corporation of Columbus, Ohio programmed with software implementing the additional functions described below.

Pump 1212 may illustratively be a variable speed pump but alternatively may be a fixed speed pump. Condenser fan 1224 may illustratively be a variable speed fan but alternatively may be a fixed speed fan.

Where pump 1212 is a variable speed pump, cooling capacity of cooling circuit 1202 when in the pumped refrigerant economizer mode is controlled by controller 1220 by modulating the speed of pump 1212. That is, to increase cooling capacity, controller 1220 increases the speed of pump 1212 to increase the rate of flow of refrigerant in cooling circuit 1202 and to decrease cooling capacity, controller 1220 decreases the speed of pump 1212 to decrease the rate of flow or refrigerant in cooling circuit 1202. The refrigerant temperature at the inlet of evaporator 1204 is maintained above freezing by controller 1220 modulating the speed of fan 1224 of condenser 1208 and the minimum pump differential is maintained by controller 1220 modulating the electronic expansion valve 1206. Pump differential means the pressure differential across the pump. In this regard, when pump 1212 is a variable speed pump, it may illustratively be a hermetically sealed pump cooled by the refrigerant that is flowing through it as it is pumping the refrigerant and thus a minimum pump differential is needed so that pump 1212 is adequately cooled.

Where pump 1212 is a fixed speed pump, cooling capacity of cooling circuit 1202 is controlled by controller 1220 modulating electronic expansion valve 1206 to increase or decrease the rate of flow of refrigerant in cooling circuit 1202.

In a preferred embodiment, the pump 1212 is in a box that sits outside by the condenser, but the pump 1212 could also be in the indoor unit in some of the embodiments.

In DX (compressor) mode, controller 1220 controls compressor 1210 to be running, solenoid valve 1214 to be closed and pump 1212 to be off. Since compressor 1210 is running, suction at an inlet 1248 of compressor 1210 inlet draws vaporized refrigerant from an outlet 1246 of evaporator 1204 into compressor 1210 where it is compressed by compressor 1210, raising its pressure. The suction at the inlet 1248 of running compressor 1210 will draw the refrigerant into the inlet 1248 and it doesn't flow through check valve 1218. The refrigerant then flows through check valve 1222 into condenser 1208 where it is cooled and condensed to a liquid state. Since solenoid valve 1214 is closed and pump 1212 is off, after the refrigerant flows out of condenser 1208 it flows through check valve 1216, through expansion valve 1206 where its pressure is reduced and then into evaporator 1204. The refrigerant flows through evaporator 1204, where it is heated to vaporization by air to be cooled flowing through evaporator 1204, and then back to the inlet 1248 of compressor 1210.

When controller 1220 switches cooling circuit 1202 to the pumped refrigerant economizer mode, it opens solenoid valve 1214, turns compressor 1210 off and pump 1212 on. Pump 1212 then pumps the refrigerant to circulate it and it flows through solenoid valve 1214, electronic expansion valve 1206, evaporator 1204, check valve 1218 bypassing compressor 1210, through condenser 1208 and back to an inlet 1228 of pump 1212. Controller 1220 switches cooling circuit 1202 to the pumped refrigerant economizer mode when the temperature of the outside air is cold enough to provide the requisite temperature differential between the inside air to be cooled and the outside air to which heat is rejected.

In an aspect, an inverted trap 1264 may be coupled between outlet 1236 of valve 1214 and inlet 1238 of electronic expansion valve 1206 as shown in phantom in FIG. 12.

In an aspect, a receiver/surge tank, such as receiver surge/tank 1706 described below, may be coupled between outlet 1262 of condenser 1208 an inlet 1228 of pump 1212 so that all refrigerant flow through the receiver/surge tank prior to entering inlet 1228.

Figure 13:
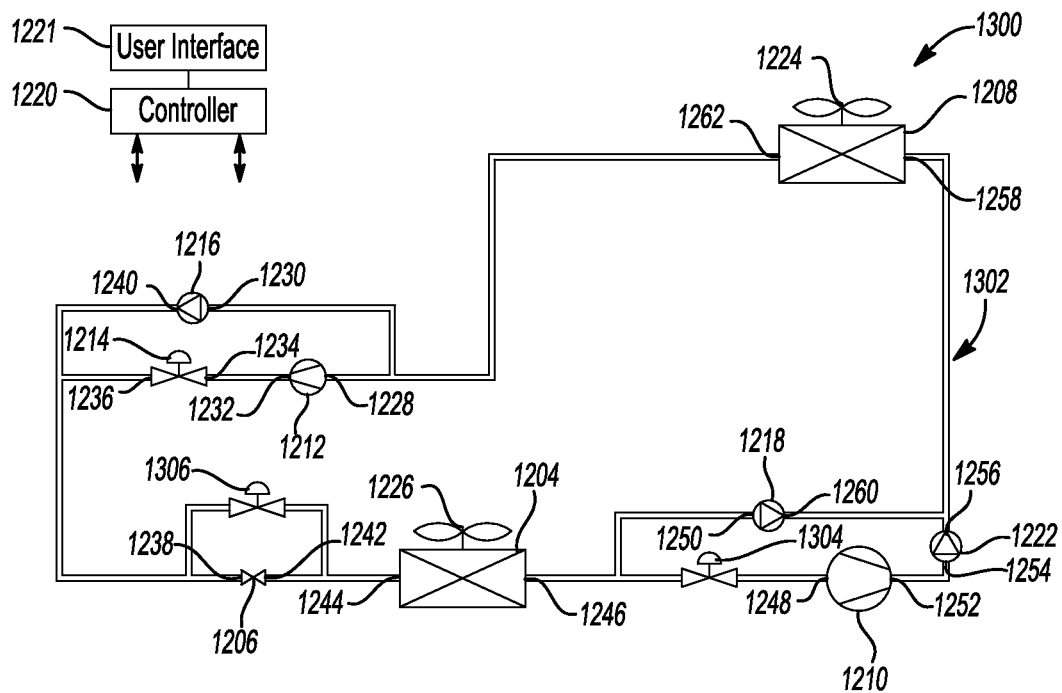
FIGS. 13-24 are variations of the cooling system of FIG. 12.

FIG. 13 shows a cooling system 1300 having a cooling circuit 1302 that is a variation of cooling circuit 1202. With the following differences, cooling system 1300 is otherwise essentially the same as cooling system 1200 and otherwise operates in the same manner as cooling system 1200. In cooling system 1300, a solenoid valve 1304 is added at the inlet 1248 of compressor 1210 that is controlled by controller 1220 to prevent liquid slugging to the compressor. When cooling system 1300 is in the DX (compressor) mode, controller 1220 opens solenoid valve 1304. When cooling system 1300 is in the pump refrigerant economizer mode, controller 1220 closes solenoid valve 1304 thus preventing refrigerant from flowing to inlet 1248 of compressor 1210 and preventing liquid slugging of compressor 1210. A bypass solenoid valve 1306 is also added around electronic expansion valve 1206 and a distributor (not shown) that distributes the refrigerant to the circuits of the evaporator includes an inlet port that bypasses the orifice of the distributor, and the outlet of the bypass solenoid valve 1306 is plumbed to this bypass inlet to reduce system pressure drop.

Figure 14:
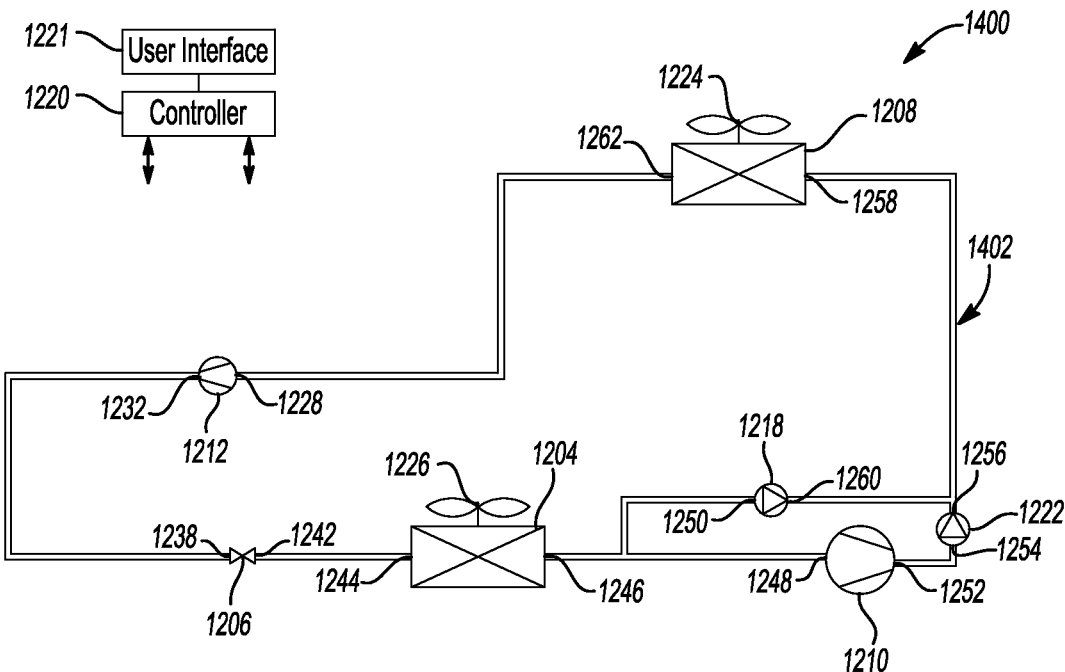

FIG. 14 shows a cooling system 1400 that is a variation of the cooling system 1200 shown in FIG. 12 having a cooling circuit 1402. With the following differences, cooling system 1400 is otherwise essentially the same as cooling system 1200 and otherwise operates in the same manner as cooling system 1200. In cooling system 1400, check valve 1216 bypassing the pump 1212 has been eliminated, also resulting in the elimination of solenoid valve 1214. In this case, the refrigerant would flow through the pump 1212 when the cooling circuit is in DX (or compressor) mode. This assumes that the pump 1212 is not damaged by passive rotation.

Figure 15:
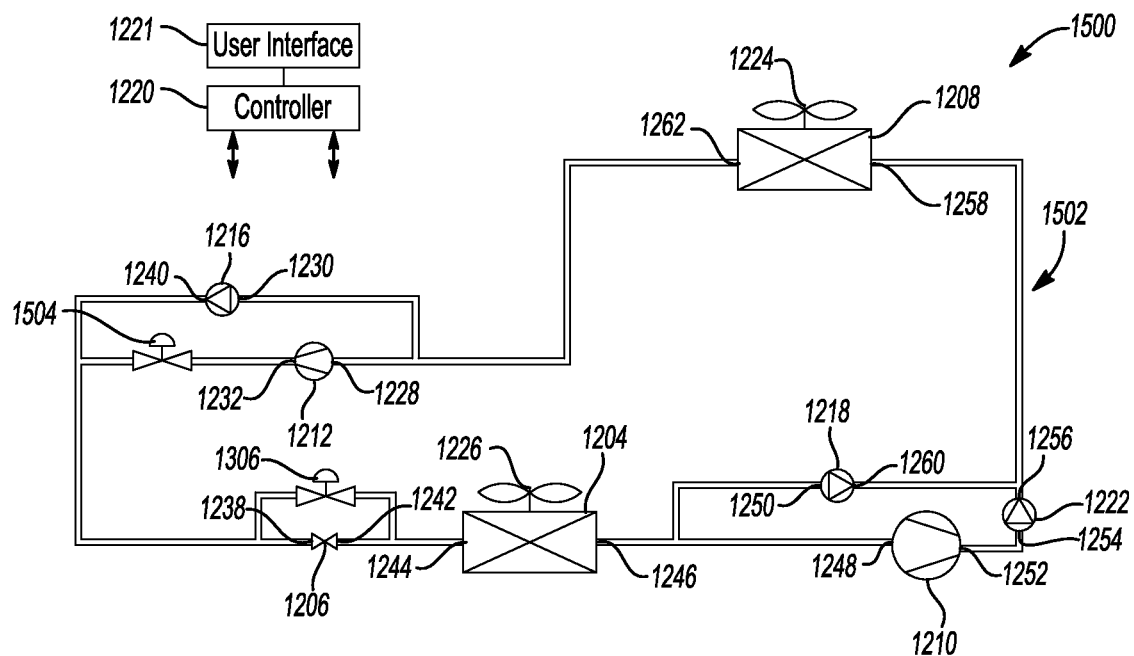

FIG. 15 shows a cooling system 1500 that is a variation of cooling system 1200 having a cooling circuit 1502. With the following differences, cooling system 1500 is otherwise essentially the same as cooling system 1200 and otherwise operates in the same manner as cooling system 1200. In cooling system 1500, the pump differential is maintained by controller 1220 modulating a discharge control valve 1504 at discharge outlet 1506 of pump 1212. It should be understood that while discharge control valve 1504 is shown with the same valve symbol as used for solenoid valves, discharge control valve 1504 is a variable flow valve as opposed to an on-off valve. Cooling system 1500 also includes bypass solenoid valve 1304 (FIG. 13) around expansion valve 1206 (which could be either an electronic or thermostatic expansion valve) and the distributor orifice of the distributor (not shown) that distributes refrigerant to the circuits of the evaporator to reduce system pressure drop. In this embodiment, pump 1212 is variable speed pump and controller 1220 modulates the speed of pump 1212 to control a flow rate of the refrigerant being circulated to control the cooling capacity of cooling system 1500 when cooling system 1500 is in the pumped refrigerant economizer mode.

Figure 16:
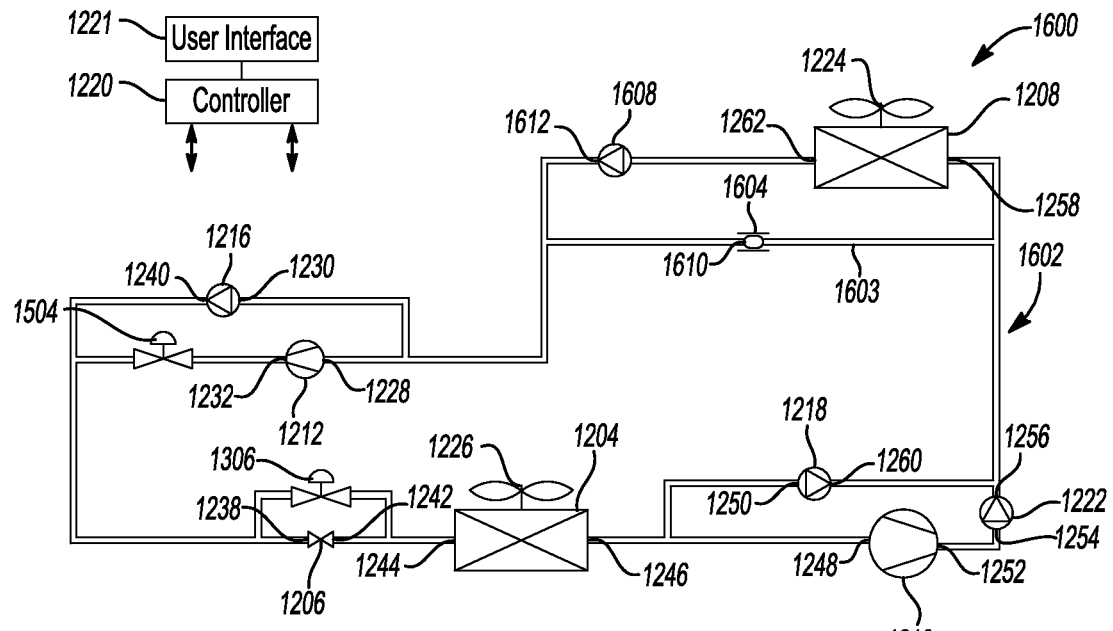

FIG. 16 illustrates a cooling system 1600 that is a variation of cooling system 1500 having a cooling circuit 1602. With the following differences, cooling system 1500 is otherwise essentially the same as cooling system 1500 and otherwise operates in the same manner as cooling system 1500. Cooling system 1600 has an alternative method of maintaining minimum refrigerant temperature. More specifically, cooling system 1600 has a bypass line 1603 around the condenser 1208 with a bypass control valve 1604 in bypass line 1603 to allow flow of the warm refrigerant around the condenser 1208 to mix with cold refrigerant flowing from an outlet 1606 of condenser 1208 to maintain the desired temperature and prevent evaporator freezing. Bypass control valve 1604 is a variable flow valve and is illustratively controlled by controller 1220. A check valve 1608 is coupled between outlet 1262 of condenser 1208 and inlet 1228 of pump 1212, with an outlet 1612 of check valve 1608 being coupled to inlet 1228 of pump 1212. An outlet 1610 of bypass control valve 1604 is also coupled to inlet 1228 of pump 1212, and thus also coupled to an outlet 1612 of check valve 1608.

Figure 17:
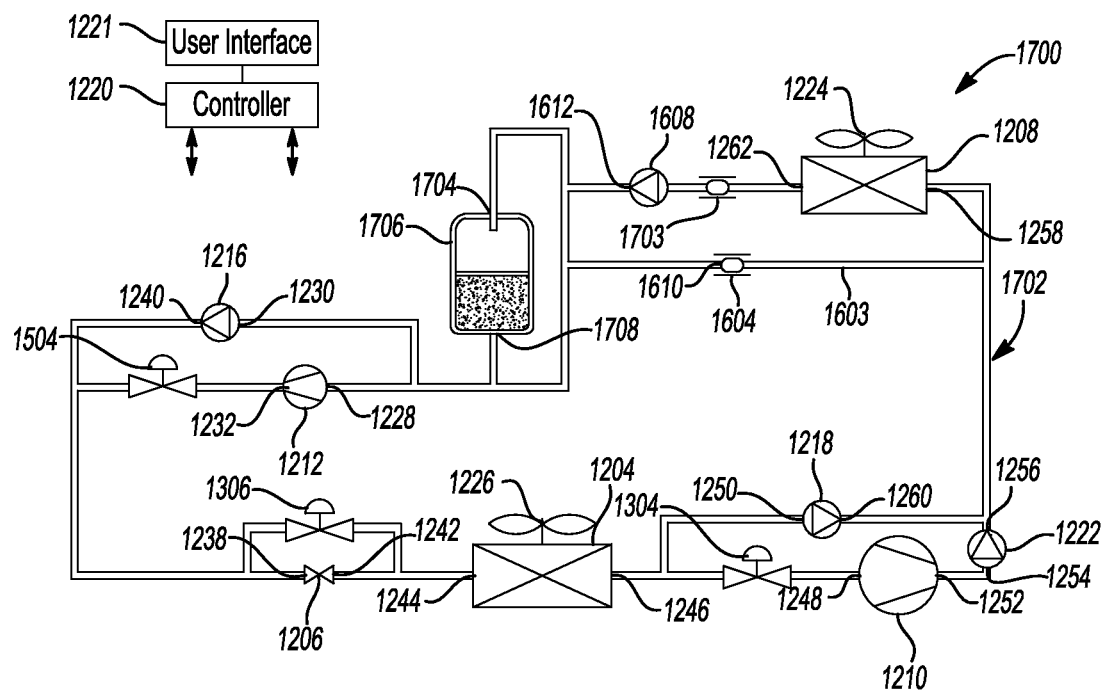

FIG. 17 shows a cooling system 1700 that is a variation of cooling system 1600 having a cooling circuit 1702. With the following differences, cooling system 1700 is otherwise essentially the same as cooling system 1600 and otherwise operates in the same manner as cooling system 1600. Cooling circuit 1702 of cooling system 1700 also includes solenoid valve 1304 (FIG. 13) at the inlet 1248 of compressor 1210 to prevent liquid slugging to compressor 1210. Because evaporator 1204 would be overfed as discussed below, and liquid refrigerant would be leaving the evaporator 1204, solenoid valve 1304 is used to prevent liquid slugging to the compressor 1210. Cooling circuit 1702 of cooling system 1700 also includes bypass line 1603 around the condenser 1208 with bypass control valve 1604 (FIG. 16) and check valve 1608 coupled between a pressure regulating valve 1703 and to an inlet 1704 of receiver/surge tank 1706 and to inlet 1228 of pump 1212. An outlet 1708 of receiver/surge tank 1706 is coupled to inlet 1228 of pump 1212. Outlet 1610 of bypass valve 1604 is also coupled to inlet 1704 of receiver/surge tank 1706 and to inlet 1228 of pump 1212. In the previously discussed embodiments, no receiver/surge tank 1706 tank is required because the cooling system is run in pumped refrigerant economizer mode by controller 1220 with the same distribution of refrigerant as in DX (compressor) mode (liquid between the condenser and the evaporator inlet, liquid-vapor mix in the evaporator, and vapor between the evaporator outlet and the condenser inlet). With receiver/surge tank 1706, controller 1220 can run cooling system 1700 to overfeed evaporator 1204 so that there would be a liquid-vapor mix between evaporator outlet 1246 and condenser 1208. This increases the cooling capacity of cooling system 1700 compared to the previously discussed embodiments, but the addition of receiver/surge tank 1706 adds cost. It should be understood that receiver/surge tank 1706 can be used with the previously discussed embodiments and dong so makes the system less charge sensitive. That is, the system can accommodate wider variations in refrigerant charge levels.

Figure 18:
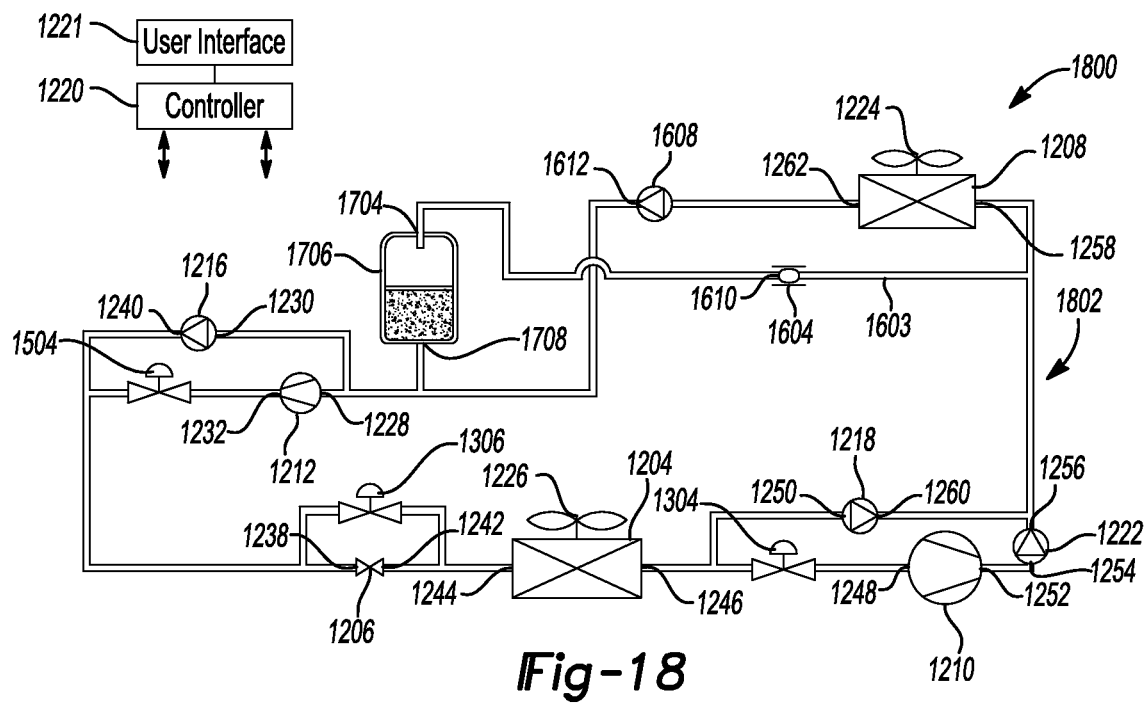

FIG. 18 shows a cooling system 1800 that is a variation of cooling system 1700 having a cooling circuit 1802. With the following differences, cooling system 1800 is otherwise essentially the same as cooling system 1700 and otherwise operates in the same manner as cooling system 1700. Cooling system 1800 has a different function for the bypass control valve 1604 in bypass line 1603. In this case, the condenser bypass line 1603 enters the receiver/surge tank with outlet 1610 of bypass control valve 1604 coupled to inlet 1704 of receiver/surge tank 1706 but not to inlet 1228 of pump 1212. Outlet 1612 of check valve 1608 is also not coupled to inlet 1704 of receiver/surge tank 1706 and pressure regulating valve 1703 is eliminated. Controller 1220 modulates bypass control valve 1604 to modulate the pressure of receiver/surge tank to force liquid from receiver/surge tank 1706 to inlet 1228 of pump 1212. This is similar to the method described in U.S. Pat. No. 7,900,468, the entire disclosure of which is incorporated herein by reference. Controller 1220 may illustratively be programmed to utilize the method descried in U.S. Pat. No. 7,900,460.

Figure 19A:
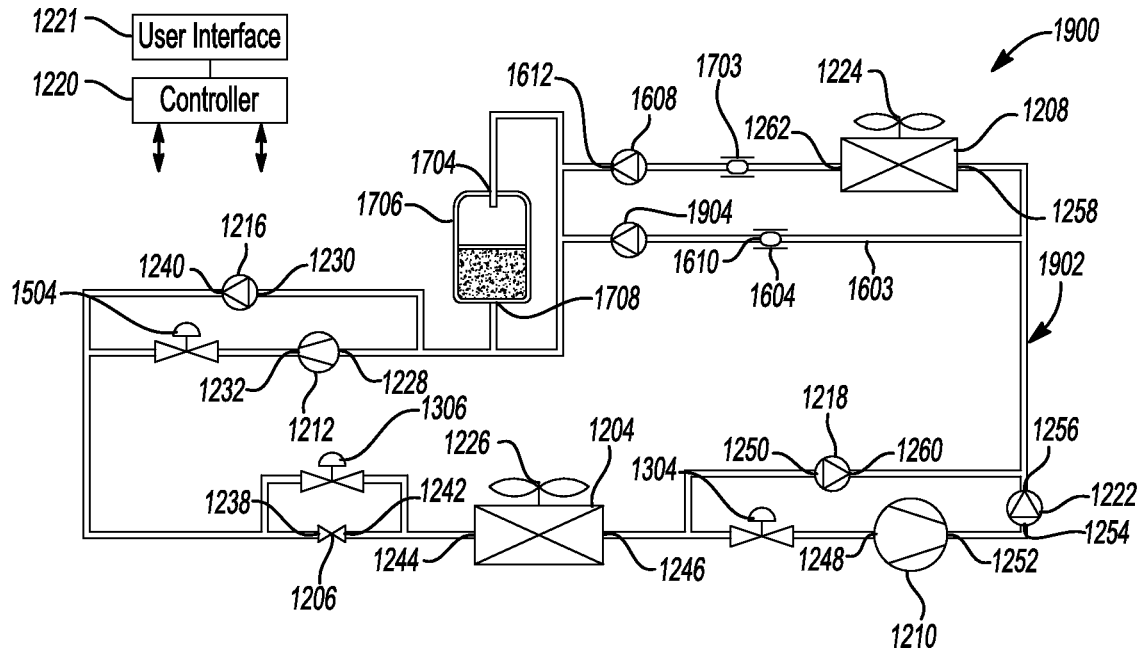

FIG. 19A shows a cooling system 1900 that is a variation of cooling system 1700 having a cooling circuit 1902. With the following differences, cooling system 1900 is otherwise essentially the same as cooling system 1700 and otherwise operates in the same manner as cooling system 1700. Outlet 1610 of bypass control valve 1604 is coupled through check valve 1904 to inlet 1704 of receiver/surge tank 1706 and to inlet 1228 of pump 1212 and outlet 1612 of check valve 1608 is also coupled to inlet 1704 of receiver/surge tank 1706 and to inlet 1228 of pump 1212. The refrigerant preferentially flows through receiver/surge tank 1706 prior to entering inlet 1228 of pump 1212, but may flow around receiver surge tank 1706.

Figure 19B:
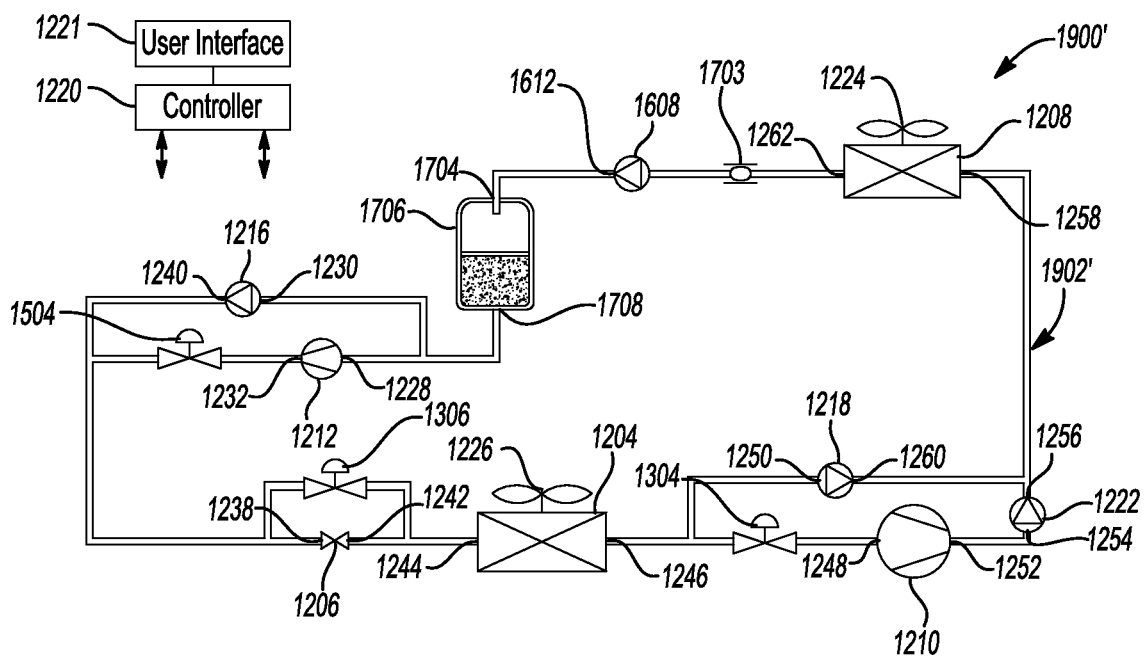

FIG. 19BA shows a cooling system 1900' that is also a variation of cooling system 1700 having cooling circuit 1902'. Bypass control valve 1604 and check valve 1904 are eliminated and the outlet of check valve 1608 is coupled to the inlet 1704 of receiver/surge tank 1706 but not to the inlet 1228 of pump 1212. In cooling system 1900', all the refrigerant flows through receiver/surge tank 1706 prior to entering inlet 1228 of pump 1212.

Figure 20:
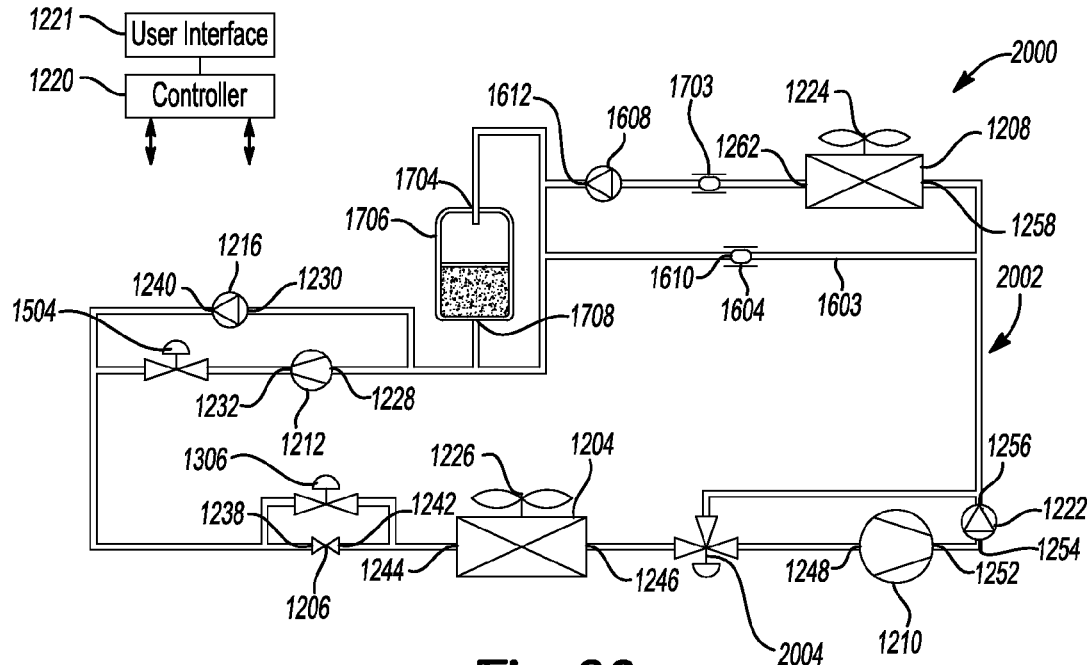

FIG. 20 shows a cooling system 2000 that is a variation of cooling system 1700 having a cooling circuit 2002. With the following differences, cooling system 2000 is otherwise essentially the same as cooling system 1700 and otherwise operates in the same manner as cooling system 1700. In cooling system 2000, a three-way valve 2004 is coupled between outlet 1246 of evaporator 1204, inlet 1248 of compressor 1210 and inlet 1258 of condenser 1208, with solenoid valve 1304 and check valve 1218 being eliminated. Controller 1220 controls three-way valve 2004 to provide refrigerant to compressor 1210 when in the direct expansion mode and to bypass compressor 1210 when in the pumped refrigerant economizer mode.

Figure 21:
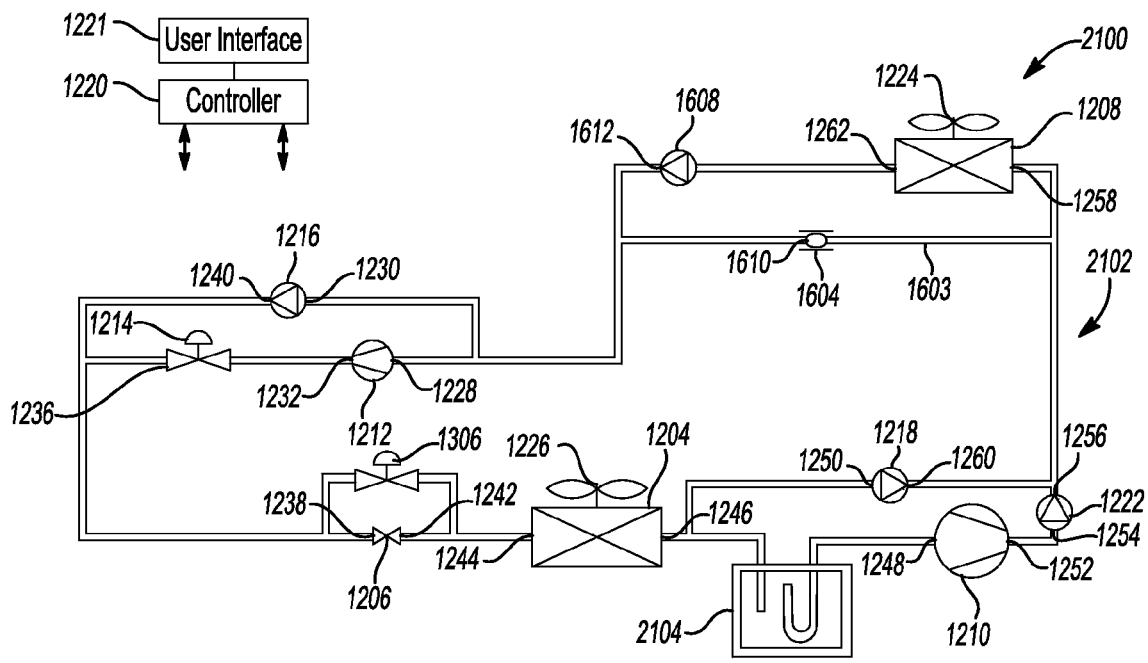

FIG. 21 shows a cooling system 2100 that is a variation of cooling system 1600 having a cooling circuit 2102. With the following differences, cooling system 2100 is otherwise essentially the same as cooling system 1600 and otherwise operates in the same manner as cooling system 1600. In cooling system 2100, a suction line accumulator 2104 is disposed at inlet 1248 of compressor 1210 to prevent liquid slugging to compressor 1210. Also, cooling system 2100 has solenoid valve 1214 instead of discharge control valve 1504, solenoid valve 1214 being operated in the manner described for cooling system 1200.

Figure 22:
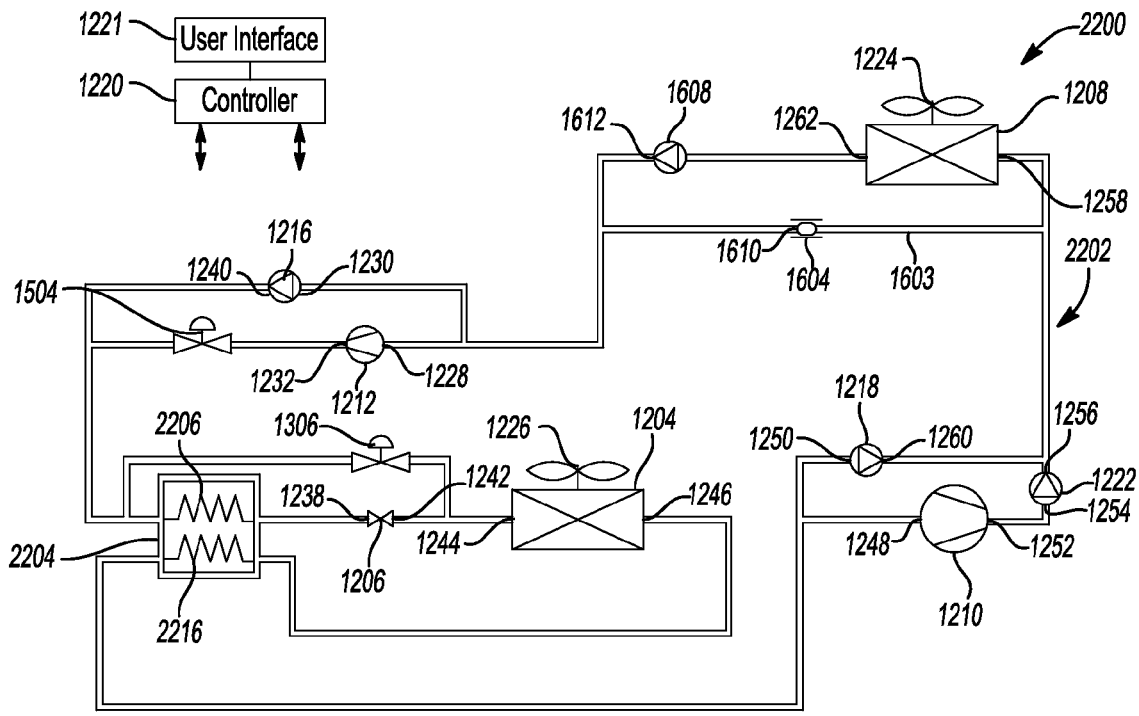

FIG. 22 shows a cooling system 2200 that is a variation of cooling system 1600 having a cooling circuit 2202. With the following differences, cooling system 2200 is otherwise essentially the same as cooling system 1600 and otherwise operates in the same manner as cooling system 1600. Cooling system 2200 includes a suction line exchanger 2204 that increases the evaporator charge when cooling system 2200 is in the direct expansion mode to normalize evaporator charge between the direct expansion mode and the pumped refrigerant economizer node. Suction line heat exchanger 2204 is bypassed when cooling system 2200 is in the pumped refrigerant economizer mode by controller 1220 opening bypass solenoid valve 1306 (which in the embodiment of FIG. 22 is coupled around a first exchange path 2206 of suction line heat exchanger 2204 as well as electronic expansion valve 1206). It should be understood that controller 1220 closes solenoid valve 1306 when cooling system 2200 is in the direct expansion mode. First heat exchange path 2206 of suction line heat exchanger 2204 is coupled between a junction 2208 to which outlet 2210 of check valve 1216 and an outlet 2212 of solenoid valve 1214 are coupled and an inlet 2214 of electronic expansion valve 1206. A second heat exchange path 2216 of suction line heat exchanger 2204 is coupled between outlet of 1246 of evaporator 1204 and a junction 2218 to which inlet 1248 of compressor 1210 and inlet 2220 of check valve 1218 are coupled.

Figure 23:
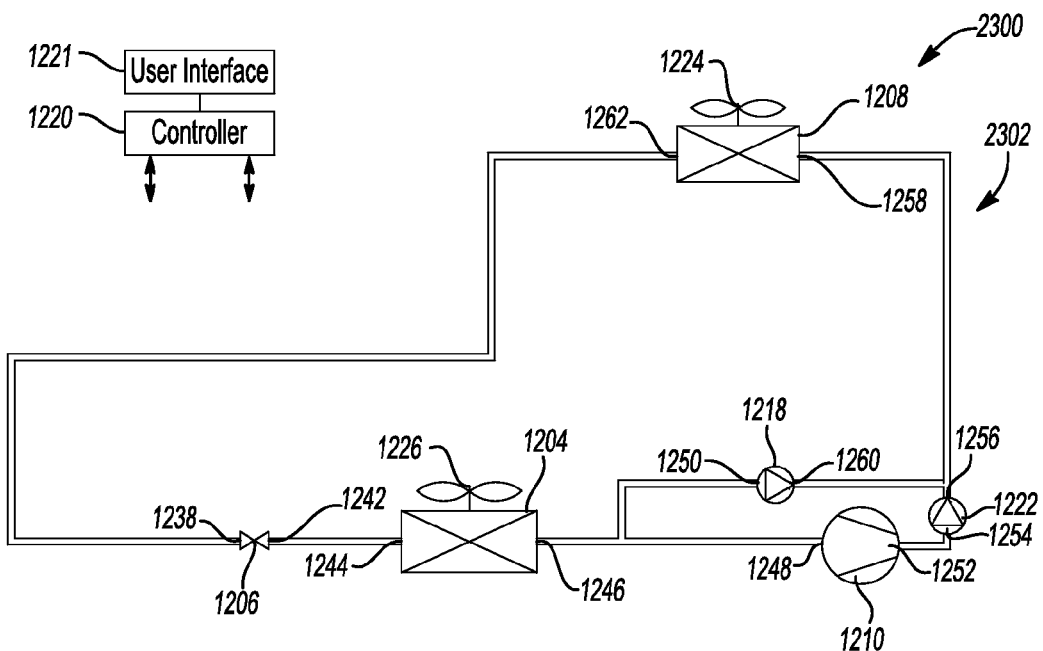

FIG. 23 shows a free-cooling system 2300 that is a variation of cooling system 1200 having a cooling circuit 2302, which would be for applications in which the condenser 1208 is at an elevation significantly higher than the evaporator 1204. In this case, when cooling system 2300 is in the economizer mode, the liquid column of refrigerant at the inlet 1248 of evaporator 1204 induces a thermo-siphon effect causing refrigerant to flow from outlet 1262 of condenser 1208 through electronic expansion valve 1206, through evaporator 1204, through check valve 1218 and back to condenser 1208. Cooling capacity of cooling system 2300 is controlled by controller 1220 modulating the electronic expansion valve 1206. The advantage of this system is that the only additional component required to be added to a conventional DX system is the compressor bypass valve, which in the embodiment shown in FIG. 23, is check valve 1218. While the advantage of cooling system 2300 is that no pump 1212 (and associated solenoid valve 1214 and check valve 1218 is required, the same method of control used for cooling system 2300 can also be used for any of the previously discussed cooling systems 1200-2200 as long as the condenser 1208 is high enough above the evaporator 1204. Since the flow rate of refrigerant induced by the thermo-siphon effect increases with increasing height of the liquid column of refrigerant, the pump 1212 could be turned off when the load requirement is low enough for the given application, and more energy could be saved.

Figure 24:
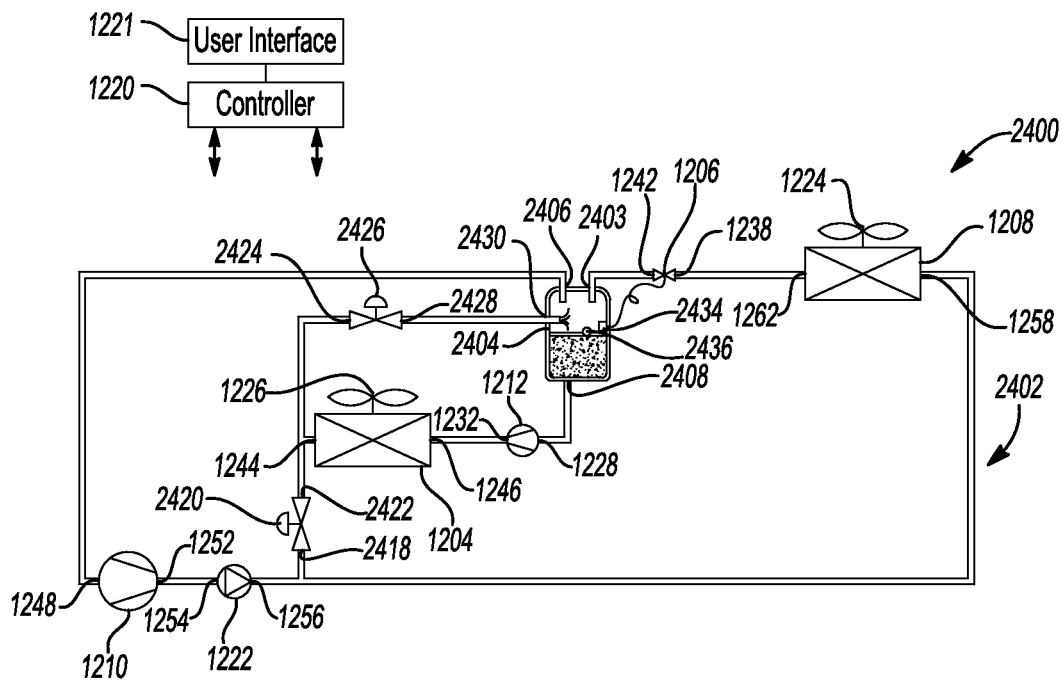

FIG. 24 shows a cooling system 2400 that is another alternative embodiment having a cooling circuit 2402, in which a free-cooling system such as free-cooling system 2300 is combined with a known liquid overfeed system of the type where inlet 1246 of evaporator 1204 is overfed when cooling system 2400 is in the direct expansion mode such that the refrigerant enters evaporator 1204 as a slightly subcooled liquid instead of a two phase mixture, making for more even distribution. In cooling system 2400, outlet 1262 of condenser 1208 is coupled through electronic expansion valve 1206 to an inlet 2403 of liquid/vapor separator tank 2404. A vapor outlet 2406 of liquid/vapor separator tank 2404 is coupled to inlet 1248 of compressor 1210. A liquid outlet 2408 of liquid/vapor separator tank 2404 is coupled to inlet 1228 of pump 1212. An outlet 2410 of compressor 1210 is coupled to inlet 1254 of check valve 1222. Outlet 1256 of check valve 1222 is coupled to an inlet 1258 of condenser 1208. An inlet 2422 of solenoid valve 2420 and an inlet 2424 of solenoid valve 2424 are coupled to outlet 1246 of evaporator 1204. An outlet 2418 of solenoid valve 2420 is coupled to inlet 1258 of condenser 1208. An outlet 2428 of solenoid valve 2426 is coupled to a second inlet 2430 of liquid/vapor separator tank 2404. Controller 1220 controls pump 1212 so that pump 1212 is always on, either pumping (circulating) the refrigerant through evaporator 1204 and back to liquid/vapor separator tank 2404, or pumping the refrigerant through evaporator 1204 with the compressor 1210 bypassed and turned off by controller 1220 to save energy. In this regard, controller 1220 controls solenoid valves 2420 and 2426 as discussed below.

Depending on the type of evaporator used, even distribution of the two-phase refrigerant at the inlet of the evaporator is difficult to maintain in a conventional DX system in which the refrigerant fluid is expanded upstream of the evaporator. This is particularly the case with microchannel heat exchangers. Cooling system 2400 includes a liquid overfeed system having pump 1212 that provides liquid refrigerant to inlet 1244 of evaporator 1204, mitigating the distribution issues. The refrigerant is then evaporated in evaporator 1204 and circulated as a two-phase mixture back to liquid/vapor separator tank 2404. The compressor 1210 pulls vapor from the liquid/vapor separator tank 2404 via vapor outlet 2406 of liquid/vapor separator tank 2404, compresses it to its condensing pressure/temperature, moves it to the condenser 1208 where it is condensed and then returned to the liquid/vapor separator tank 2404 as a liquid. The pump 1212 pulls liquid refrigerant from the liquid/vapor separator tank 2404 via liquid outlet 2408 of liquid/vapor separator tank 2404. The liquid level is maintained in the tank via a float controlled electronic expansion valve 1206. In this regard, float controlled electronic expansion valve 1206 has a control input 2432 coupled to a control output 2434 of a float 2436 in liquid/vapor separator tank 2404. Control output 2434 of float 2436 may illustratively provide a modulated control signal to electronic expansion valve or an on/off control signal to electronic expansion valve 1206. It should be understood that a float controlled mechanical expansion valve could alternatively be used instead of electronic expansion valve 1206.

The path of the refrigerant would be determined by the solenoid valves 2420, 2426. In warm weather, controller 1220 would operate cooling system 2400 as described above, controlling solenoid valve 2426 between outlet 1246 of evaporator 1204 and the liquid/vapor separator tank 2404 to be open and solenoid valve 2420 to be closed. In cold weather, controller 1220 would turn compressor 1210 off, open solenoid valve 2420 and close solenoid valve 2426. Cooling system 2400 would then operate in a pumped refrigerant economizer mode such as described above such as with reference to FIG. 12.

Cooling system 2400 would become advantageous if the price of copper makes an aluminum microchannel heat exchanger more cost-effective than a copper tube and fin heat exchanger. In that case, the ability to feed liquid refrigerant to the evaporator inlet would increase system performance and efficiency. And if a liquid overfeed system is required, it would be fairly straightforward (from a component standpoint) to allow the system to operate in pumped refrigerant economizer mode such as in the winter, since only the addition of the compressor bypass valve would be required.

Figure 25:
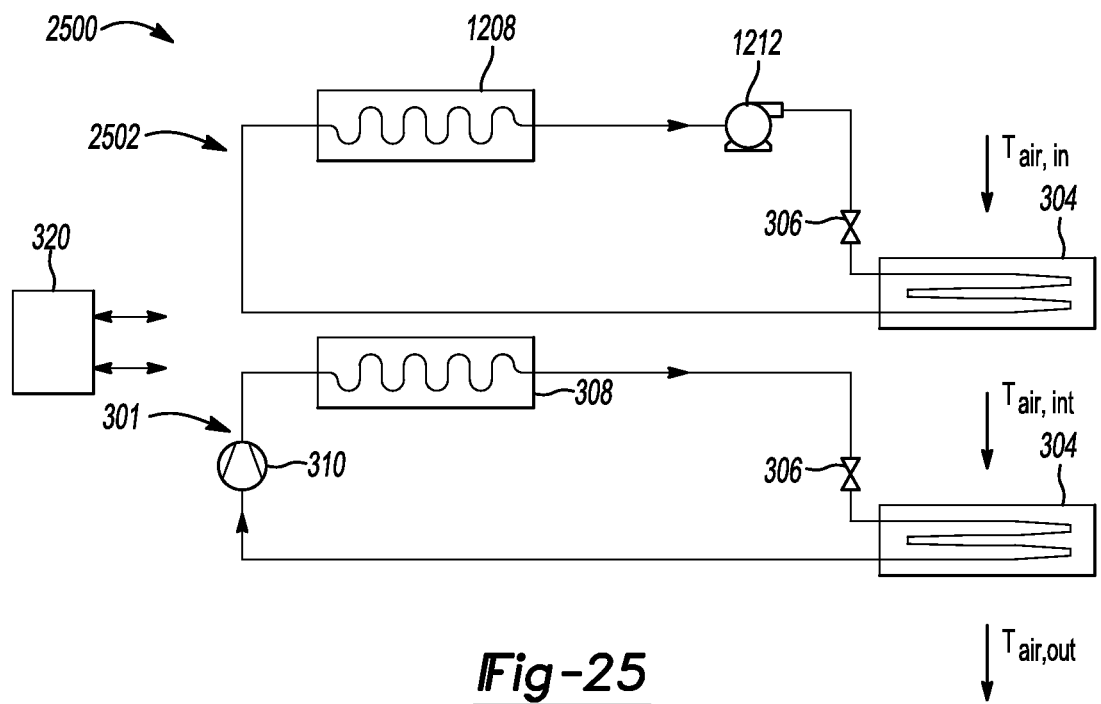
FIG. 25 is a schematic showing a cooling system having a DX cooling circuit and a separate pumped refrigerant economizer circuit in accordance with an aspect of the present disclosure.

FIG. 25 shows a cooling system 2500 having a separate pumped refrigerant economizer cooling circuit 2502 and a conventional DX cooling circuit 301 as described above with reference to FIG. 3. Pumped refrigerant economizer cooling circuit includes an evaporator 304, expansion valve 306 which may illustratively be an electronic expansion valve, fluid pump 1212 (FIG. 12), and condenser 1208 arranged in a pumped refrigerant cooling circuit such as is disclosed in U.S. patent application Ser. No. 10/904,889 the entire disclosure of which is incorporated herein by reference. Controller 320 controls cooling system 2500 so that pumped refrigerant economizer cooling circuit is only run when the outside ambient temperature is sufficiently cold that pumped refrigerant cooling circuit 2502 can provide sufficient cooling to meet the cooling demands, such as of a data center. While evaporator 304 of pumped refrigerant economizer cooling circuit 2502 is shown in FIG. 25 as being upstream of evaporator 304 of DX cooling circuit 301, it should be understood that evaporator 304 of pumped refrigerant economizer cooling circuit 2502 could be downstream of evaporator 304 of DX cooling circuit 301.

Figure 26:
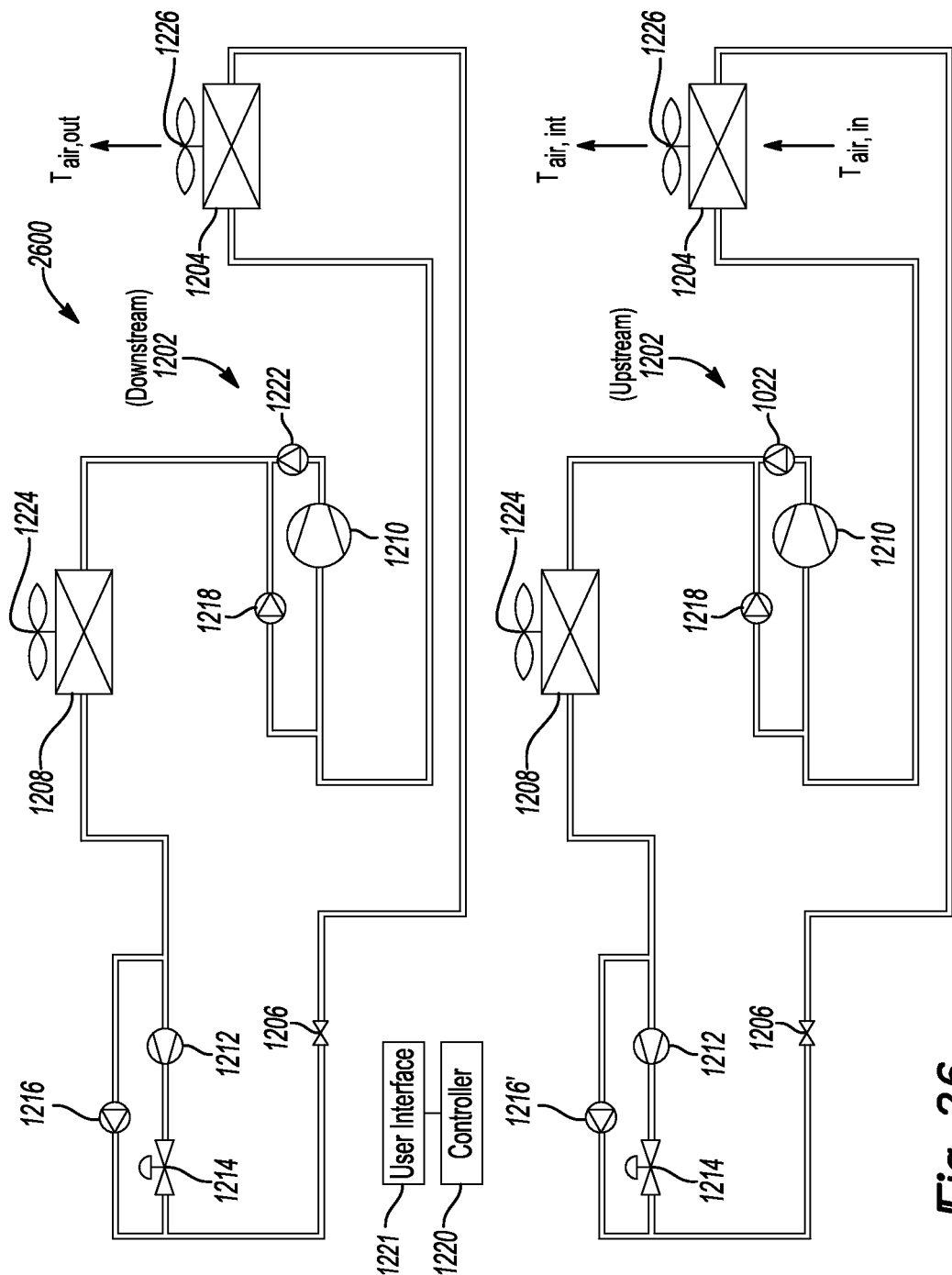
FIG. 26 is a schematic showing a cooling system having staged cooling provided by two cooling circuits of FIG. 12 in accordance with an aspect of the present disclosure.

The discussions of the cooling circuits of FIGS. 12-24 were based on a one circuit cooling system, or on a two circuit system in which the evaporators are parallel in the air-stream. The cooling circuits of FIGS. 12-24 can also be utilized for staged cooling as described above, particularly with reference to FIG. 3, where the evaporators of the two circuits are staged in series in the air stream of air to be cooled. Because of this, the entering air temperature is higher on the upstream circuit than on the downstream circuit. Subsequently, the evaporating temperature is higher on the upstream circuit as well. So with the staged system, the upstream circuit will be able to switch over to pumped refrigerant economizer before the second, which could still be operating in DX (compressor) mode depending on the load. For example, two cooling circuits 1202 could be arranged with their evaporators in series to provide staged cooling. FIG. 26 shows a cooling system 2600 having two cooling circuits 1202 arranged to provide staged cooling along the lines discussed above with regard to FIG. 3. In this embodiment, compressor 1210 in each of the two cooling circuits 1202 may illustratively be a tandem digital scroll compressor and controlled as discussed above with reference to FIGS. 7-11A and 11B.

In a staged cooling system having two or more staged cooling circuits, at least the most upstream cooling circuit is a variable capacity cooling circuit and preferably the downstream cooling circuit (or circuits) is also variable capacity cooling circuits. Such variable capacity may be provided by the use of a tandem digital scroll compressor as discussed above. It can also be provided by the use of a single variable capacity compressor, such as a digital scroll compressor, a plurality of fixed capacity compressors, or other combinations of fixed and variable capacity compressors. Variable capacity is also provided by the liquid pump when the cooling circuit is a pumped refrigerant cooling circuit, or operating in the pumped refrigerant economizer mode such as cooling circuit 1202 operating in the pumped refrigerant economizer mode. The cooling system is controlled based on the Call for Cooling to stage the operation of the upstream and downstream cooling circuits to enhance efficiency, as described below with reference to staged cooling system 2600 as an example staged cooling system and the flow chart of FIG. 30.

Figure 30:
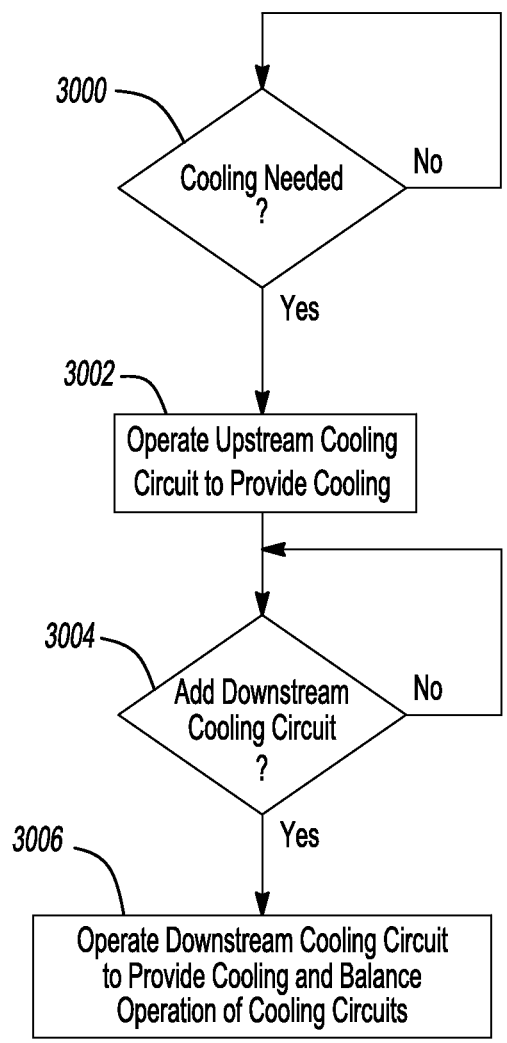
FIG. 30 is a flow chart showing an illustrative control of a cooling system having staged cooling to stage based on a Call for Cooling to stage the operation of cooling circuits of the cooling system.

With reference to FIG. 30, as the Call for Cooling is ramping up it reaches a point at 3000 where cooling is needed. At 3002 controller 1220 operates the cooling circuit 1202 that is the upstream cooling circuit to provide cooling. As the Call for Cooling continues to ramp it, controller 1220 operates the cooling circuit 1202 to provide increased capacity to meet the Call for Cooling. Eventually the Call for Cooling reaches a point at 3004 where it is more efficient to add a cooling circuit 1202 that is a downstream cooling circuit to provide additional cooling capacity rather than only increase the capacity of the cooling circuit 1202 that is the upstream cooling circuit. This point is before the cooling circuit 1202 that is the upstream cooling circuit reaches its maximum capacity. At 3006, controller 1220 operates a cooling circuit 1202 that is a downstream cooling circuit to provide additional cooling and balances the operation of the cooling circuits 1202 that are being operated to provide cooling to optimize efficiency. The prior description of the control of tandem digital scroll compressors 710, 718 is one example of such control.

The advantage to using a cooling system with staged cooling as discussed above with this pumped refrigerant economizer is that hours of operation can be gained in pumped refrigerant economizer mode on the upstream cooling circuit since it is operating at a higher evaporating temperature than either cooling circuit would be in a typical prior art parallel evaporator system. So, energy can be saved for more hours of the year. The colder the climate is, the more annual energy efficiency increase can be realized.

As has been discussed, in a typical vapor compression refrigeration system, a large percentage of system power is used to compress the refrigerant vapor leaving the evaporator, thereby increasing the condensing temperature of the refrigerant to allow for heat rejection in the condenser. As described above, particularly with reference to FIG. 12, in an aspect of the present disclosure in order to save energy in a vapor compression refrigeration system, a pump can be used to move refrigerant from the condenser to the evaporator when outdoor temperatures are low enough to provide "free" cooling without the need to compress the refrigerant vapor. Such a pumped refrigerant (economizer) system is a precision cooling system with aims of energy savings, high efficiency and optimized system performance. System control is important to achieving these objectives. More specifically, the control objectives are divided into three levels with different priorities, namely:

1. Component Safety Level: to guarantee key component safety
   i) Pump cavitation prevention—Subcooling monitoring
   ii) Ensuring pump cooling and lubrication
   iii) Evaporator coil freeze protection
2. Performance Level: to run the system functionally and flawlessly
   i) Maintain controlled air temperature to the setpoint
   ii) Proper and smooth working mode switchover
   iii) Fault detection and alarm handling
3. Optimization Level
   i) Extending economizer running hours
   ii) Advanced fault detection and diagnosis The resources available for the system to achieve the above-listed objectives are the installed actuators, which include a variable-speed pump (e.g., pump 1212 in FIG. 12), a variable-speed condenser fan (e.g., fan 1224 in FIG. 12) and an electronic expansion valve (EEV) (e.g., EEV 1206 in FIG. 12). The first step of the control design is to work out a control strategy to decide how to allocate the resources to different control tasks. In other words, given that the entire economizer system is a multi-input multi-output system (with multiple actuators and multiple variables to be controlled), how to decouple the system and determine the input-output relationship is the solution that the following control strategy implements. This control strategy is summarized on a high level basis as follows:

Manipulate the condenser fan to control the refrigerant temperature leaving the condenser;

Manipulate the pump to control system capacity, and ultimately the air temperature in the controlled space;

Manipulate the EEV to control pressure differential across the pump.

The multi-input and multi-output pumped refrigerant economizer system is controlled in a relatively simple way. The system is decoupled into three feedback control loops which regulate their controlled variables by manipulating their corresponding control inputs as follows:

The aforementioned control strategy benefits the system in several ways:

1. The condenser fan controls the refrigerant temperature to a setpoint such that"
   a. Refrigerant temperature will not be low enough to freeze the evaporator coil;
   b. Subcooling is maximized to prevent pump cavitation;
   c. Condenser fan speed is optimized to save energy in the sense that the fan speed can't be further reduced without compromising subcooling and cooling capacity.
2. The pump speed controls refrigerant flow rate, and the capacity in turn, by controlling the room's air temperature to the user given setpoint.
   a. Pump speed is roughly linear with respect to capacity for a fixed refrigerant temperature, which is maintained by the condenser fan speed control.
   b. Linearity facilitates high control precision of the air temperature in the controlled space.
3. The EEV controls the differential pressure across the pump such that
   a. The pump motor is sufficiently cooled;
   b. The pump bearings are sufficiently lubricated.

The entire system energy consumption is optimized by the foregoing control strategy in the sense that no further energy consumption can be realized without sacrificing cooling performance.

Figure 27:
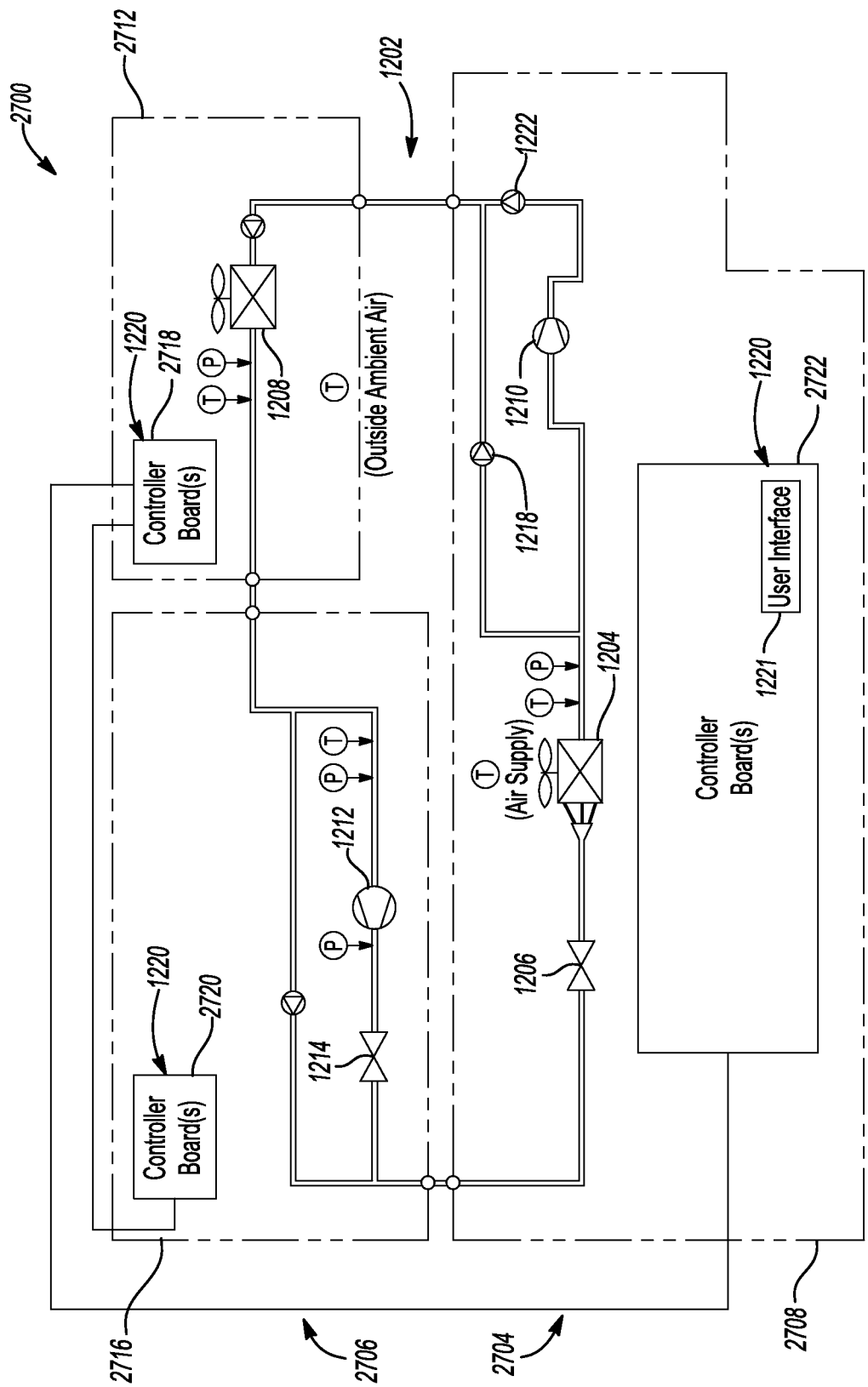
FIG. 27 is a schematic showing the cooling system of FIG. 12 and showing in more detail the control system therewith.

FIG. 27 is a schematic of a cooling system 2700 having one cooling circuit 2702 having a DX cooling circuit 2704 and a pumped refrigerant economizer 2706. Cooling system 2700 may physically consist of three units: an indoor unit 2708 (illustratively a computer room air conditioner), a pumped refrigerant economizer unit 2710, and an air-cooled condenser unit 2712. The indoor unit 2708 is located inside the room to be cooled, such as a data center room, and contains the major components of the DX cooling circuit (other than the condenser 1208), including the evaporator 1204, compressor 1210, and expansion valve 1206, etc. The indoor unit's 2708 functionality is to operate the system in a standard direct expansion mode, and also drive the valves needed to run the system in pumped refrigerant economizer mode. The pumped refrigerant economizer unit 2710 is located outside the room and contains the major components including pump 1212, etc. The pumped refrigerant economizer unit 2710 uses liquid pump 1212 to move refrigerant from the condenser 1208 to the evaporator 1204 when the outdoor temperatures are low enough to provide "free" cooling without running a direct expansion refrigeration system. The condenser unit 2712 is also located outside the room to be cooled but separated from the pumped refrigerant economizer unit 2710. It cooperates with one of the other two units 2708, 2710 according to heat rejection demand. In FIG. 27, "T" in a circle is a temperature sensor and "P" in a circle is a pressure sensor, in each instance that are coupled to controller 1220, such as to a respective one of controller boards 2718, 2720, 2722 (which are discussed below). The temperature sensors include an outside ambient air temperature sensor (shown adjacent condenser 1208) and a supply air (or room return air) temperature sensor (shown adjacent evaporator 1204). The remaining temperature sensors sense temperatures of the refrigerant at the indicated locations of cooling circuit 1202 and the pressure sensors sense the pressures of the refrigerant at the indicated locations of cooling circuit 1202.

Figure 28:
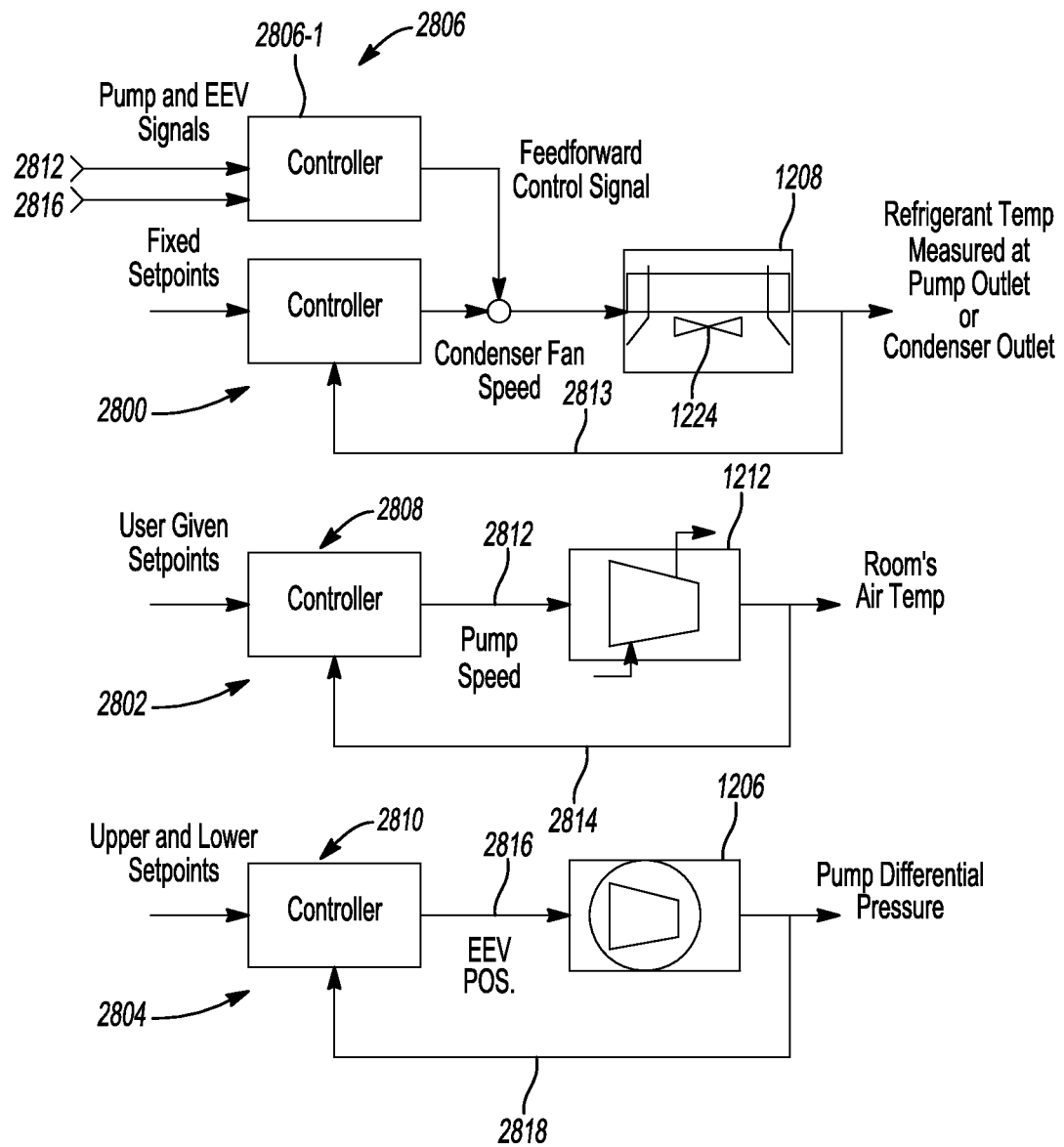
FIG. 28 shows control loops for the control system of FIG. 27.

When the cooling system 2700 operates in pumped refrigerant economizer mode, there are three feedback control loops for the basic control of the pumped refrigerant economizer mode, as shown in FIG. 28.

A refrigerant temperature feedback control loop 2800 controls the refrigerant temperature to a setpoint by regulating the condenser fan speed. The refrigerant temperature is measured at the pump outlet or at the condenser outlet. In an aspect, the setpoint is set in the range of 37° F. to 42° F. It should be understood that these values are exemplar and the fixed setpoint can be other than 37° F. to 42° F. It should also be understood that the setpoint can be inputted manually, such as by a user, or determined by a controller such as controller 1220.

A room air temperature feedback control loop 2802 controls the room's air temperature to the setpoint entered by a user, such as into controller 1220, by regulating the pump speed.

An liquid pump differential pressure feedback control loop 2804 maintains the liquid pump differential pressure (PSID) within a given range by regulating the EEV 1206 opening. In an aspect, the given range is set to be 20 PSID to 25 PSID. The given range is determined by its upper and lower setpoints. It should be understood that these values are exemplar and the given range can be other than 20PSID to 25 PSID. It should also be understood that that the given range could be input by a user.

Each control loop 2800, 2802, 2804 may illustratively be a process control type of control loop, and may preferably be a PID loop. In the embodiment shown in FIG. 28, each control loop 2800, 2802, 2804 is shown implemented with a separate controller 2806, 2808, 2810, respectively, such as to co-locate a respective controller board(s) 2718, 2720, 2722 (FIG. 27) having each controller 2806, 2808, 2810 in proximity to the device it is controlling, and controllers 2806, 2808, 2810 communicate with each other, such as via a controller area network (CAN) bus. For example, the controller board(s) 2718 having controller 2806 is located in proximity to condenser 1208 in that controller 2806 controls the speed of condenser fan 1224. The controller board 2720 having controller 2808 is located in proximity to pump 1212 in that controller 2808 controls the speed of pump 1212. The controller board(s) 2722 having controller 2810 is collocated in proximity to EEV 1206 in that controller 2810 controls the position of EEV 1206. While controllers 2806, 2808, 2810 are implemented on separately located controller boards in this embodiment, controllers 2806, 2808 and 2810 are collectively considered part of controller 1220. It should be understood that control loops 2800, 2802 and 2804 could be implemented on a controller board(s) at a single location along with the remainder of the control functions of controller 1220.

Refrigerant temperature feedback control loop 2800 has an output at which a condenser fan speed control signal is output and has as inputs the refrigerant temperature setpoint and a feedback signal 2813 which is the actual refrigerant temperature, such as by way of example and not of limitation, at the outlet of the condenser. The room air temperature feedback control loop 2802 has an output at which a liquid pump speed control signal 2812 is output and has as inputs the room air temperature setpoint and a feedback signal 2814 which is the actual room air temperature, such as by way of example and not of limitation, at the return air inlet of the cooling system. The liquid pump pressure differential control feedback loop 2804 has an output at which an electronic expansion valve position signal 2816 is output and having as inputs the given range and a feedback signal 2818 which is a pressure differential across the liquid pump.

In order to further improve the transient performance of the refrigerant temperature control (which is controlled by controlling the speed of condenser fan 1224 by control loop 2800), a feedforward controller (controller 2806-1 FIG. 28) is applied to stabilize refrigerant temperature by using the pump speed control signal 2812 from controller 2808 and the EEV control signal 2816 from controller 2810 as its inputs. The rationale is that refrigerant temperature is related to the flow rate that can be estimated by the pump speed and EEV opening. The outputs of controllers 2808 and 2810 of FIG. 28 are fed forward to the condenser fan speed control loop 2800. The condenser fan speed signal consists of two parts: feedback signal and feedforward signal. Thus, the condenser fan can respond by being driven by the feedforward signal in advance of the feedback signal coming back.

The three control loops have different magnitudes of response time, which prevents the situation in which multiple control elements can interact to create instability in the control.

This control strategy applies to the pumped refrigerant economizer system particularly and can also be applied to the class of cooling or air conditioning systems with pumped refrigerant circulation.

The foregoing description of cooling system 2700 is based on a cooling system having one cooling circuit. A similar control strategy can be applied to cooling systems having two cooling circuits, such as those arranged to provide staged cooling as discussed above. For a cooling system having two cooling circuits, such as having staged cooling with two cooling circuits, the condenser fan and EEV in the second circuit perform the same respective control tasks as in the first circuit. The cooling capacity is controlled by the aggregate pump speeds. A control algorithm, an example of which is discussed below, determines the capacity contributed by each pump, and hence decides each pump's speed, as As discussed, when the cooling system is in the pumped refrigerant economizer mode, there are three main controlled parameters: room temperature, refrigerant temperature and pump pressure differential (outlet pressure minus inlet pressure). The room temperature is controlled by modulating the pump speed via a variable frequency drive. In a cooling system having staged cooling with two or more cooling circuits, when the cooling system is in the pumped refrigerant economizer mode, the cooling load requirement will determine if the pump in one or more than one of the cooling circuits needs to be operated.

In an illustrative embodiment, a pump startup routine calls for operating the pump at successively higher speeds until refrigerant flow is established. At each speed, controller 1220 checks to see whether refrigerant flow has been established, determined by pump differential pressure being at least a minimum. If so, the speed of the pump is changed from the startup speed to the control speed, as described above. If not, controller 1220 turns the pump off for a period of time and then operates the pump at the next higher speed.

In an aspect, in the case of a switchover of a cooling circuit from direct expansion mode to pumped refrigerant economizer mode, the pump of that cooing circuit will be given an initial speed based on the call for cooling at the time of switchover and will go to its initial speed after the startup routine is completed. In cooling systems having staged cooling with a plurality of cooling circuits, this will mean that depending on the load, the pumps of more than one cooling circuit may start immediately at switchover.

The pump pressure differential needs to be maintained above a minimum in order for cooling and lubricating flow to be provided to the pump motor and bearings. The pump pressure differential for each of pump 1212 (upstream) and pump 1212 (downstream) is controlled by position of EEV 1206 of the respective cooling circuit 1202 (upstream) and cooling circuit 1202 (downstream). When controller 1220 switches any of the cooling circuits to pumped refrigerant economizer mode operation, it changes its control of EEV 1206 of that cooling circuit 1202 from superheat control to manual control, at which time controller 1220 provides a signal to that EEV 1206 to control its position based on pump pressure differential.

In an illustrative embodiment, controller 1220 switches the cooling system, such as cooling system 2600, to the pumped refrigerant economizer mode when there is either a minimum difference between the room return air temperature entering the cooling system and the outdoor air temperature or the outdoor air temperature is below a minimum. In an aspect, the lower of the actual room return air temperature and the setpoint is used for the comparison. In an aspect, the minimum temperature difference between the room return air is 45° F. and the minimum outside air temperature is 35° F. It should be understood that these temperatures are examples and minimum temperature difference other than 45° F. and a minimum outside air temperature other than 35° F. can be used. As discussed above, in an aspect, the cooling circuits in a system having staged cooling may be controlled separately in which case the room air temperature used for the comparison for each cooling circuit may be the actual room return air temperature (or its setpoint if lower) entering the evaporator 1204 of that cooling circuit 1202.

In an aspect, controller 1220 will switch the cooling system from pumped refrigerant economizer mode to direct expansion mode when the pumped refrigerant economizer mode is not keeping up with the cooling demand. In the event that the cooling system has staged cooling, in an aspect controller 1220 will first switch the most downstream cooling circuit from the pumped refrigerant economizer mode to direct expansion mode and if this fails to provide sufficient cooling, then successively switches each next upstream cooling circuit in turn to the direct expansion mode.

In an aspect, controller 1220 also switches each cooling circuit from the pumped refrigerant economizer mode to the direct expansion mode should the pump differential pressure of the pump 1212 of that cooling circuit fall below a predetermined minimum for a predetermined period of time. This prevents pump failure due to insufficient pump differential pressure.

In an aspect, controller 1220 also switches each cooling circuit from the pumped refrigerant economizer rode to the direct expansion mode if the temperature of the refrigerant leaving the pump of that cooling circuit falls below a predetermined temperature for a predetermined period of time.

In an aspect, controller 1220 may also switch each cooling circuit from the pumped refrigerant economizer mode to the direct expansion mode in the event of a condition indicating a failure of the pumped refrigerant economizer mode, such as loss of power to the pump.

Traditional thermostatic expansion valves (TXVs) are used to regulate refrigerant flow to control evaporator superheat for direct-expansion refrigeration and air conditioning units that may experience varying loads. TXVs are mechanically actuated purely by pressure differences within the apparatus. Therefore, a TXV does not directly interact with the control scheme being used to regulate compressor capacity, which means that the TXV can only behave reactively to adjustments in compressor capacity. In a system which uses pulse width modulation (PWM) to control compressor capacity by unloading, the persistent interruptions of the compressor mass flow can vary the suction pressure, which introduces the potential for unstable TXV behavior, and poor superheat control.

As discussed above, in various aspects of the present disclosures, the expansion devices used in the cooling circuits are expansion valves and preferably electronic expansion valves ("EEV"). It should be understood, however, that expansions devices other than expansion valves can be used, such as capillary tubes.

An EEV offers two primary advantages over a TXV: it allows operation at reduced condensing pressure, which contributes to higher system energy efficiency, and it uses programmed logic to move the valve to control superheat. Further, while a tandem digital scroll compressor offers a wide range of capacities, it also makes for difficult control of superheat. Because of this, a control strategy for the EEV(s) that directly interacts with the compressor control strategy to provide more proper and predictable movement of the valve of the EEV, and also allow valve position monitoring and adjustment by end users.

An illustrative control strategy for the EEV 1206 of each cooling circuit chooses the most appropriate EEV superheat control mode by comparing the current operating status of both of the compressors (fixed capacity compressor and variable capacity digital scroll compressor) in the tandem digital compressor to a group of related parameters which are located in controller 1220 and illustratively set by a user. This contributes to increased predictability, flexibility, and to an increased level of specialization specific to digital (PWM) scroll compressor capacity control which cannot be attained with traditional applications of TXVs or with EEVs which employ standard control logic.

The illustrative EEV control strategy, illustratively implemented in controller 1220 such as in software, uses three types of superheat control: Gated, System Mapping, and Constant. A summary of each of these modes is provided below.

1. Gated Mode: Each time the variable capacity digital scroll compressor unloads, controller 1220 drives the EEV 1206 from its current position down to minimum open position. Once the variable capacity digital scroll compressor stops unloading, controller 1220 opens the EEV is allowed to open to the position(s) needed to control superheat until the variable capacity digital scroll compressor unloads again. The minimum open position may be ten percent open, but it should be understood that it can be other than ten percent.

2. System Mapping Mode: Each time the variable capacity digital scroll compressor unloads, controller 1220 maintains the EEV 1206 in its current position until the digital scroll compressor stops unloading. Once unloading has stopped, the EEV is then free to change its position to achieve control of the superheat until the variable capacity digital scroll compressor unloads again.

3. Constant Mode: Controller 1220 constantly determines the superheat and changes the position of EEV 1206 to achieve superheat control, regardless of the activity of the variable capacity digital scroll compressor. Constant mode is the default mode.

The following parameters added to a typical user interface dictate which of the three superheat control modes are used for different compressor operation conditions. It should be understood that the values for the parameters discussed below are exemplar and that the parameters can have other values.

Parameter A) "Superheat Mode Threshold" [Min: 19%, Def: 80%, Max: 80%]: Represents the variable capacity digital scroll compressor PWM loading % at which the superheat control mode may transition when only the variable capacity digital scroll compressor in the tandem digital scroll compressor is on.

Parameter B) "Digital+Fixed Superheat Threshold" [Min: 19%, Def: 19% Max: 100%]: Represents the variable capacity digital scroll compressor PWM loading percentage at which the superheat control mode may transition when both the variable capacity digital scroll compressor and fixed capacity compressor of the tandem digital compressor are on.

Parameter C) "Digital+Fixed Superheat Control" [System Mapping OR Constant]: This parameter is used to choose an overall superheat control mode when both the variable capacity digital scroll compressor and fixed capacity compressor of the tandem digital compressor are on.

Figure 29:
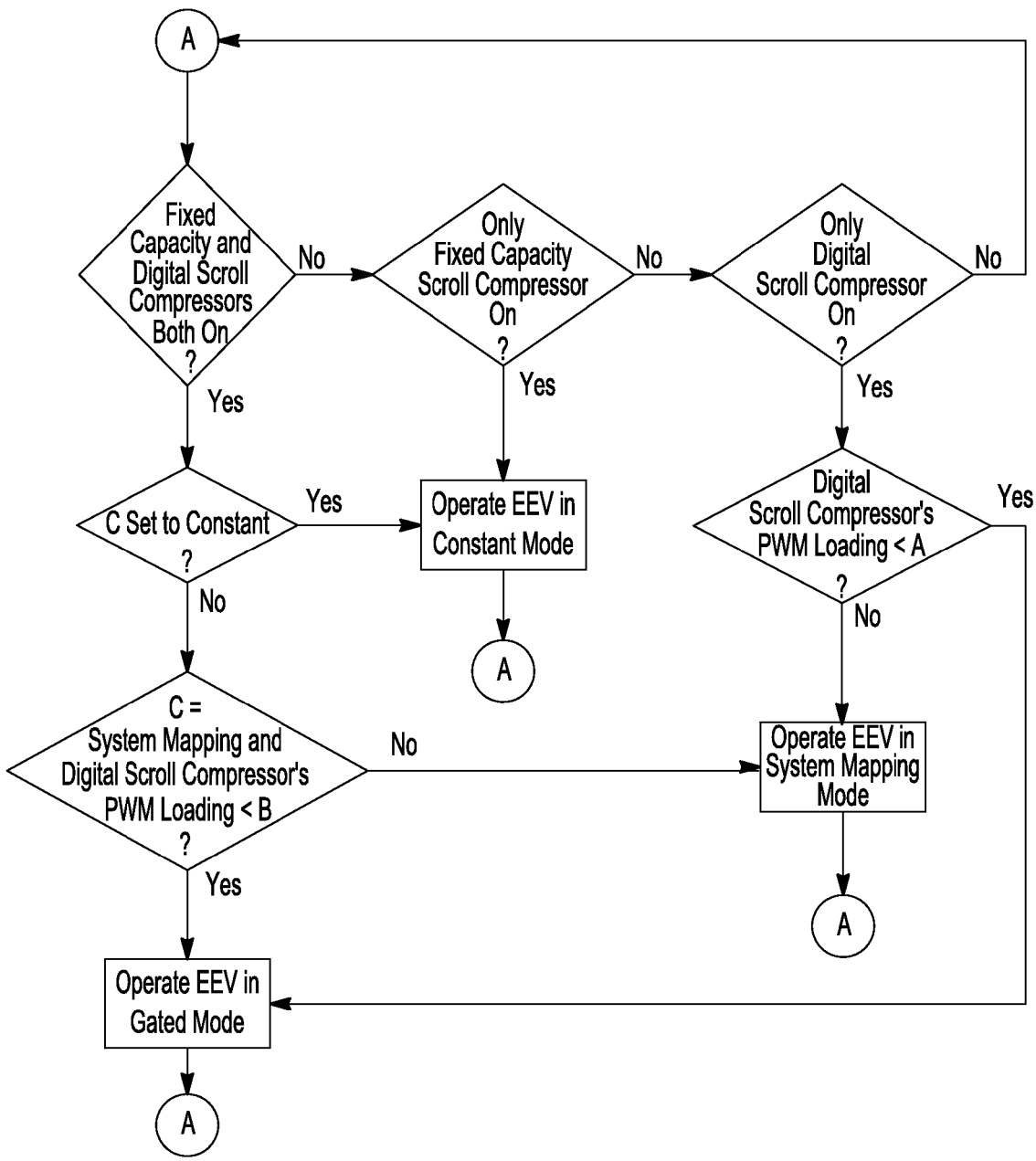
FIG. 29 is a flow chart showing an illustrative control of an electronic expansion valve in accordance with an aspect of the present disclosure.

The following instances of logic are then applied in a software program of a controller, such as controller 1220, to compare the values of Parameters A, B, and C with the current operating status of the tandem digital scroll compressor to determine which superheat control mode should be used, also as shown in the flow chart of FIG. 29 showing the logic for the software program implemented in the controller such as controller 1220.

When Only the Fixed Capacity Compressor of the Tandem Digital Compressor is on:

The EEV will operate in Constant Mode for superheat control.

When Only the Variable Capacity Digital Scroll Compressor of the Tandem Digital Compressor is on:

If the variable capacity digital scroll compressor's PWM loading percentage is less than what is set for the "Superheat Mode Threshold" Parameter "A," the EEV will operate in Gated Mode for superheat control.

If the variable capacity digital scroll compressor's PWM loading percentage is greater than or equal to what is set for the "Superheat Mode Threshold" Parameter "A," the EEV will operate in System Mapping Mode for superheat control.

When Both the Variable Capacity Digital Scroll Compressor and Fixed Capacity Compressors of the Tandem Digital Compressor is on:

If the "Digital+Fixed Superheat Control" Parameter "C" is set to "Constant", the EEV will operate in Constant Mode for superheat control.

If the "Digital+Fixed Superheat Control" Parameter "C" is set to "System Mapping", AND the variable capacity digital scroll compressor's PWM loading percentage is less than what is set for the "Digital+Fixed Superheat Threshold" parameter "B," the EEV will operate in Gated Mode for superheat control.

If the "Digital+Fixed Superheat Control" Parameter "C" is set to "System Mapping", AND the variable capacity digital scroll compressor's PWM loading percentage is greater than or equal to what is set for the "Digital+Fixed Superheat Threshold" Parameter "B," the EEV will operate in System Mapping mode for superheat control.

The foregoing EEV control strategy provides the following advantages: more stable control of evaporator superheat while the variable capacity digital scroll compressor loads and unloads; proper control of superheat maintains compressor energy efficiency, and reduction of the chance of damage to the compressor(s) from liquid refrigerant flood-back. Further, the physical mechanism of the EEV itself allows for reductions in the condensing pressure of the refrigerant, which increases the tandem digital compressor's energy efficiency. Also, a user can adjust the EEV superheat mode selection and transition points by via a user interface (not shown) to controller 1220.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As used herein, the term controller, control module, control system, or the like may refer to, be part of, or include an Application Specific Integrated Circuit (ASIC); an electronic circuit; a combinational logic circuit; a field programmable gate array (FPGA); a processor (shared, dedicated, or group) that executes code; a programmable logic controller, programmable control system such as a processor based control system including a computer based control system, a process controller such as a PID controller, or other suitable hardware components that provide the described functionality or provide the above functionality when programmed with software as described herein; or a combination of some or all of the above, such as in a system-on-chip. The term module may include memory (shared, dedicated, or group) that stores code executed by the processor.

The term software, as used above, may refer to computer programs, routines, functions, classes, and/or objects and may include firmware, and/or microcode.

The apparatuses and methods described herein may be implemented by software in one or more computer programs executed by one or more processors of one or more controllers. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A cooling system, comprising:
a cabinet having an air inlet and an air outlet;
an air moving unit disposed in the cabinet;
a plurality of separate cooling stages including an upstream cooling stage and a downstream cooling stage, at least the upstream cooling stage having a variable capacity cooling circuit;
each cooling stage including a cooling circuit having an evaporator, a condenser, a compressor and an expansion device;
at least the cooling circuit of the upstream cooling stage having a pumped refrigerant economizer mode and a direct expansion mode wherein each cooling circuit that has both the pumped refrigerant economizer mode and the direct expansion mode also has a liquid pump wherein when that cooling circuit is operated in the direct expansion mode a compressor of that cooling circuit is on and compresses a refrigerant in a vapor phase to raise the refrigerant pressure and thus the refrigerant condensing temperature and the refrigerant is circulated around the cooling circuit by the compressor of that cooling circuit and wherein when that cooling circuit is operated in the pumped refrigerant economizer mode the compressor of that cooling circuit is off and the liquid pump of that cooling circuit is on and pumps the refrigerant in a liquid phase and refrigerant is circulated around that cooling circuit by the liquid pump of that cooling circuit and without compressing the refrigerant in its vapor phase;

the evaporator of the cooling circuit of the upstream cooling stage and the evaporator of the cooling circuit of the downstream cooling stage arranged in the cabinet so that air to be cooled passes over the evaporator of the cooling circuit of the upstream cooling stage and the evaporator of the cooling circuit of the downstream cooling stage in serial fashion, first over the evaporator of the cooling circuit of the upstream cooling stage and then over the evaporator of the cooling circuit of the downstream cooling stage;

a controller that determines which of the cooling circuits to operate to provide cooling and for each of the cooling circuits to be operated to provide cooling that has both the pumped refrigerant economizer mode and direct expansion mode, determining whether to operate each such cooling circuit in the pumped refrigerant economizer mode or the direct expansion mode;

the controller operating each cooling circuit having both the pumped refrigerant economizer mode and the direct expansion mode in the pumped refrigerant economizer mode when an outside air temperature is low enough to provide sufficient heat rejection from the refrigerant flowing through the condenser to the outside air without compressing the refrigerant and when the outside air temperature is not low enough to provide such sufficient heat rejection operating that cooling circuit in the direct expansion mode;

the controller when a Call for Cooling first reaches a point where cooling is needed, operating the upstream cooling circuit to provide cooling and not operating the downstream cooling circuit to provide cooling and when the Call for Cooling has increased to a second point, additionally operating the downstream cooling circuit to provide cooling, wherein the cooling capacity at which the upstream cooling circuit is being operated to provide is less than the full cooling capacity of the upstream cooling circuit when the Call for Cooling reaches the second point;

wherein the compressor of each cooling circuit is a tandem compressor including a fixed capacity compressor and variable capacity digital scroll compressor, the controller controlling the fixed capacity compressor and variable capacity digital scroll compressor of each of the tandem compressors based on the Call for Cooling, which of a plurality of ranges that the Call for Cooling falls within and whether the Call for Cooling is ramping up or ramping down; and wherein when there is an unmet Call for Dehumidification, the controller controls the tandem compressors based on the Call for Cooling and which of a plurality of dehumidification ranges that the Call for Cooling falls within including determining which of the variable capacity digital scroll compressors to ramp and controls the ramping of each variable capacity digital scroll compressor being ramped based on a the Call for Dehumidification and wherein control based on which of the plurality of dehumidification control ranges the Call for Cooling falls within and on the Call for Dehumidification takes precedence when there is an unmet Call for Dehumidification.

2. The cooling system of claim 1 wherein each expansion device is an electronic expansion valve, the controller when any of the cooling circuits are being operated in the direct expansion mode controlling the electronic expansion valve of that cooling circuit to control a suction superheat of the evaporator of that cooling circuit and the controller when any of the cooling circuits having both the pumped refrigerant economizer mode and the direct expansion mode is being operated in the pumped refrigerant economizer mode controlling the electronic expansion valve of that cooling circuit to maintain a minimum differential pressure across the liquid pump of that cooling circuit.

3. The cooling system of claim 1 wherein each of the condensers includes an electronically commutated fan, the controller varying the speed of the electronically commutated fan to maintain a temperature of the refrigerant leaving the condenser at a setpoint.

4. The cooling system of claim 1 wherein the condensers are air cooled condensers.

5. The cooling system of claim 1 wherein the condensers are water cooled condensers.

6. The cooling system of claim 1 wherein the air moving unit includes at least one electronically commutated fan, the controller increasing the speed of the electronically commutated fan as a cooling load on the cooling system increases and decreasing the speed of the electronically commutated fan as the cooling load decreases.

7. The cooling system of claim 1 wherein the controller first begins ramping the variable capacity digital scroll compressor of the upstream cooling circuit to provide cooling and when the Call for Cooling increases above a threshold, the controller also begins ramping the variable capacity digital scroll compressor of the cooling circuit of the downstream cooling stage in parallel with ramping the variable capacity digital scroll compressor of the upstream cooling circuit.

8. The cooling system of claim 1 wherein each cooling circuit has both the pumped refrigerant economizer mode and the direct expansion mode.

9. A cooling system, comprising:
a cabinet having an air inlet and an air outlet;
an air moving unit disposed in the cabinet;
a plurality of separate cooling stages including an upstream cooling stage and a downstream cooling stage, at least the upstream cooling stage having a variable capacity cooling circuit;
each cooling stage including a cooling circuit having an evaporator, a condenser, a compressor and an expansion device;
at least the cooling circuit of the upstream cooling stage having a pumped refrigerant economizer mode and a direct expansion mode wherein each cooling circuit that has both the pumped refrigerant economizer mode and the direct expansion mode also has a liquid pump wherein when that cooling circuit is operated in the direct expansion mode a compressor of that cooling circuit is on and compresses a refrigerant in a vapor phase to raise the refrigerant pressure and thus the refrigerant condensing temperature and the refrigerant is circulated around the cooling circuit by the compressor of that cooling circuit and wherein when that cooling circuit is operated in the pumped refrigerant economizer mode the compressor of that cooling circuit is off and the liquid pump of that cooling circuit is on and pumps the refrigerant in a liquid phase and refrigerant is circulated around that cooling circuit by the liquid pump of that cooling circuit and without compressing the refrigerant in its vapor phase;

the evaporator of the cooling circuit of the upstream cooling stage and the evaporator of the cooling circuit of the downstream cooling stage arranged in the cabinet so that air to be cooled passes over the evaporator of the cooling circuit of the upstream cooling stage and the evaporator of the cooling circuit of the downstream cooling stage in serial fashion, first over the evaporator of the cooling circuit of the upstream cooling stage and then over the evaporator of the cooling circuit of the downstream cooling stage;

a controller that determines which of the cooling circuits to operate to provide cooling and for each of the cooling circuits to be operated to provide cooling that has both the pumped refrigerant economizer mode and direct expansion mode, determining whether to operate each such cooling circuit in the pumped refrigerant economizer mode or the direct expansion mode;

the controller operating each cooling circuit having both the pumped refrigerant economizer mode and the direct expansion mode in the pumped refrigerant economizer mode when an outside air temperature is low enough to provide sufficient heat rejection from the refrigerant flowing through the condenser to the outside air without compressing the refrigerant and when the outside air temperature is not low enough to provide such sufficient heat rejection operating that cooling circuit in the direct expansion mode;

the controller when a Call for Cooling first reaches a point where cooling is needed, operating the upstream cooling circuit to provide cooling and not operating the downstream cooling circuit to provide cooling and when the Call for Cooling has increased to a second point, additionally operating the downstream cooling circuit to provide cooling, wherein the cooling capacity at which the upstream cooling circuit is being operated to provide is less than the full cooling capacity of the upstream cooling circuit when the Call for Cooling reaches the second point;

wherein the compressor of each cooling circuit is a tandem compressor including a fixed capacity compressor and variable capacity digital scroll compressor, the controller controlling the fixed capacity compressor and variable capacity digital scroll compressor of each of the tandem compressors based on the Call for Cooling, which of a plurality of ranges that the Call for Cooling falls within and whether the Call for Cooling is ramping up or ramping down;

wherein the controller selects which of a plurality of superheat control modes to use in operating the electronic expansion valve of each cooling circuit based on control parameters and a current operating status of each of the variable capacity digital scroll compressor and fixed capacity compressor of the tandem compressor of that cooling circuit; and wherein the superheat control modes include a gated mode, a system mapping mode and a constant mode, wherein in the gated mode, each time the variable capacity digital scroll compressor of the tandem compressor of one of the cooling circuits unloads, the controller drives the electronic expansion valve of that cooling circuit from its current position down to a minimum open position until the that variable capacity digital compressor stops unloading and once that variable capacity digital scroll compressor stops unloading, the controller adjusts the position of that electronic expansion valve to achieve a desired superheat;

in the system mapping mode, each time that variable capacity digital scroll compressor unloads, the controller retaining that electronic expansion valve in its current position until that variable digital scroll compressor stops unloading and once that variable capacity digital compressor stops unloading, the controller adjusts the position of that electronic expansion valve to achieve a desired superheat; and in the constant mode, the controller adjusts the position of that electronic expansion valve to achieve a desired superheat regardless of whether that variable capacity digital scroll compressor is unloading or loading.

10. A cooling system, comprising:

a cabinet having an air inlet and an air outlet;

an air moving unit disposed in the cabinet;

a plurality of separate cooling stages including an upstream cooling stage and a downstream cooling stage;

each of the plurality of separate cooling stage including a cooling circuit having an evaporator, a condenser, a tandem digital scroll compressor and an electronic expansion valve;

each tandem digital scroll compressor including a fixed capacity compressor and variable capacity digital scroll compressor;

at least the cooling circuit of the upstream cooling stage having a pumped refrigerant economizer mode and a direct expansion mode wherein each cooling circuit that has both the pumped refrigerant economizer mode and the direct expansion mode also has a liquid pump wherein when that cooling circuit is operated in the direct expansion mode the compressor is on and compresses a refrigerant in a vapor phase to raise the refrigerant pressure and thus the refrigerant condensing temperature and the refrigerant is circulated around the cooling circuit by the compressor and wherein when that cooling circuit is operated in the pumped refrigerant economizer mode the compressor of that cooling circuit is off and the liquid pump of that cooling circuit is on and pumps the refrigerant in a liquid phase and refrigerant is circulated around that cooling circuit by the liquid pump and without compressing the refrigerant in its vapor phase;

the evaporator of the cooling circuit of the upstream cooling stage and the evaporator of the cooling circuit of the downstream cooling stage arranged in the cabinet so that air to be cooled passes over the evaporator of the cooling circuit of the upstream cooling stage and the evaporator of the cooling circuit of the downstream cooling stage in serial fashion, first over the evaporator of the cooling circuit of the upstream cooling stage and then over the evaporator of the cooling circuit of the downstream cooling stage;

a controller that controls the operation of the cooling circuits and determining which of the cooling circuits to operate in a direct expansion mode to provide cooling based on a Call for Cooling and for each cooling circuit being operated in the direct expansion mode, the controller controlling the fixed compressor and variable capacity digital scroll compressor of the tandem digital scroll compressor of that cooling circuit based on the Call for Cooling, which of a plurality of ranges that the Call for Cooling falls within and whether the Call for Cooling is ramping up or ramping down;

the controller when any of the cooling circuits are being operated in the direct expansion mode controlling the electronic expansion valve of that cooling circuit to control a suction superheat of the evaporator of that cooling circuit and the controller when any of the cooling circuits having both the pumped refrigerant economizer mode and the direct expansion mode is being operated in the pumped refrigerant economizer mode controlling the expansion valve of that cooling circuit to maintain a minimum differential pressure across the liquid pump of that cooling circuit; and wherein when there is an unmet Call for Dehumidification, the controller controls the tandem compressors based on the Call for Cooling and which of a plurality of dehumidification control ranges that the Call for Cooling falls including determining which of the variable capacity digital scroll compressors to ramp and controls the ramping of each variable capacity digital scroll compressor being ramped based on a the Call for Dehumidification and wherein control based on which of the plurality of dehumidification control ranges the Call for Cooling falls within and on the Call for Dehumidification takes precedence when there is an unmet Call for Dehumidification.

11. The cooling system of claim 10 wherein each of the condensers includes an electronically commutated fan, the controller varying the speed of the electronically commutated fan to maintain a temperature of the refrigerant leaving the condenser at a setpoint.

12. The cooling system of claim 10 wherein the condensers are air cooled condensers.

13. The cooling system of claim 10 wherein the condensers are water cooled condensers.

14. The cooling system of claim 13 wherein the air moving unit includes at least one electronically commutated fan, the controller increasing the speed of the electronically commutated fan as the Call for Cooling increases and decreasing the speed of the electronically commutated fan as the Call for Cooling decreases.

* * * * *